US012805078B2

(12) United States Patent
Ichihara et al.

(10) Patent No.: US 12,805,078 B2
(45) Date of Patent: Nov. 17, 2026

(54) LIGHT-EMITTING DEVICE AND METHOD OF MANUFACTURING THE SAME

(71) Applicant: NICHIA CORPORATION, Anan (JP)

(72) Inventors: Yoshio Ichihara, Anan (JP); Kenta Mitsuyama, Anan (JP); Daizo Kiba, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 907 days.

(21) Appl. No.: 17/937,326

(22) Filed: Sep. 30, 2022

(65) Prior Publication Data

US 2023/0095815 A1 Mar. 30, 2023

(30) Foreign Application Priority Data

Sep. 30, 2021 (JP) ................................ 2021-162285
Feb. 18, 2022 (JP) ................................ 2022-024239
May 23, 2022 (JP) ................................ 2022-083491

(51) Int. Cl.
*H10H 20/00* (2025.01)
*H10H 20/01* (2025.01)
(Continued)

(52) U.S. Cl.
CPC .......... *H10H 20/854* (2025.01); *H10H 20/01* (2025.01); *H10H 20/856* (2025.01);
(Continued)

(58) Field of Classification Search
None
See application file for complete search history.

(56) References Cited

U.S. PATENT DOCUMENTS 6,274,890 B1 8/2001 Oshio et al.
7,821,023 B2 10/2010 Yuan et al.
(Continued)

FOREIGN PATENT DOCUMENTS

CN 102130114 A 7/2011
CN 113875026 A 12/2021
(Continued)

OTHER PUBLICATIONS

L. Boogh, R. Mezzenga, Processing_Principles_for_Thermoset_Composites, ScienceDirect, (Year: 2000), pp. 671-699.*

*Primary Examiner* — Kretelia Graham
*Assistant Examiner* — Nkechinyere Esiaba
(74) *Attorney, Agent, or Firm* — Hunton Andrews Kurth LLP

(57) ABSTRACT

Provided is a light-emitting device that can reduce deterioration of characteristics of the light-emitting device by using a waterproof resin.
Solution
A light-emitting device includes a resin package including a lead, a resin member a light-emitting element, and a mold resin portion. The lead includes an exposed region exposed at the primary surface from the resin member. The light-emitting element is disposed in the exposed region of the lead. The mold resin portion includes a base portion having an upper surface positioned above a primary surface of the resin package and a lateral surface portion of the base portion covering a part of the lateral surface portion of the resin package and a lens portion that seal the light-emitting element. In a cross-sectional view, a first point is an outermost point of the upper surface of the base portion, the second point is an outermost point of the lateral surface portion of the base portion, and the light-emitting element is
(Continued)

positioned closer to a back surface of the resin package than the first point and is positioned above the second point.

24 Claims, 55 Drawing Sheets

(51) Int. Cl.

| | |
|---|---|
| ***H10H 20/854*** | (2025.01) |
| ***H10H 20/856*** | (2025.01) |
| ***H10H 20/857*** | (2025.01) |
| ***H10W 90/00*** | (2026.01) |

(52) U.S. Cl.
CPC .......... *H10H 20/857* (2025.01); *H10W 90/00* (2026.01); *H10H 20/0362* (2025.01); *H10H 20/0364* (2025.01)

(56) References Cited

U.S. PATENT DOCUMENTS

| | | | |
|---|---|---|---|
| 7,956,378 | B2 | 6/2011 | Son |
| 8,207,546 | B2 | 6/2012 | Harada et al. |
| 8,614,451 | B2 | 12/2013 | Hanya |
| 8,937,324 | B2 | 1/2015 | Helbing et al. |
| 2006/0065957 | A1 | 3/2006 | Hanya |
| 2008/0298063 | A1 | 12/2008 | Hayashi |
| 2014/0091340 | A1 | 4/2014 | Yong et al. |
| 2015/0092414 | A1 | 4/2015 | Okura |
| 2017/0092690 | A1 | 3/2017 | Mizuta |
| 2018/0096861 | A1 | 4/2018 | Richter et al. |
| 2020/0098957 | A1 | 3/2020 | Pang et al. |
| 2020/0176643 | A1 * | 6/2020 | Pang .................. H10H 20/8506 |

FOREIGN PATENT DOCUMENTS

| | | | |
|---|---|---|---|
| JP | H10261821 | A | 9/1998 |
| JP | 2004343059 | A * | 12/2004 |
| JP | 2005026503 | A | 1/2005 |
| JP | 2006093435 | A | 4/2006 |
| JP | 2006093738 | A | 4/2006 |
| JP | 2006245231 | A | 9/2006 |
| JP | 2007142474 | A | 6/2007 |
| JP | 2011138849 | A | 7/2011 |
| JP | 5233170 | B2 | 4/2013 |
| JP | 2015070134 | A | 4/2015 |
| JP | 2017069394 | A | 4/2017 |
| JP | 2018520500 | A | 7/2018 |
| WO | 2020232668 | A1 | 11/2020 |

* cited by examiner

Fid.14A
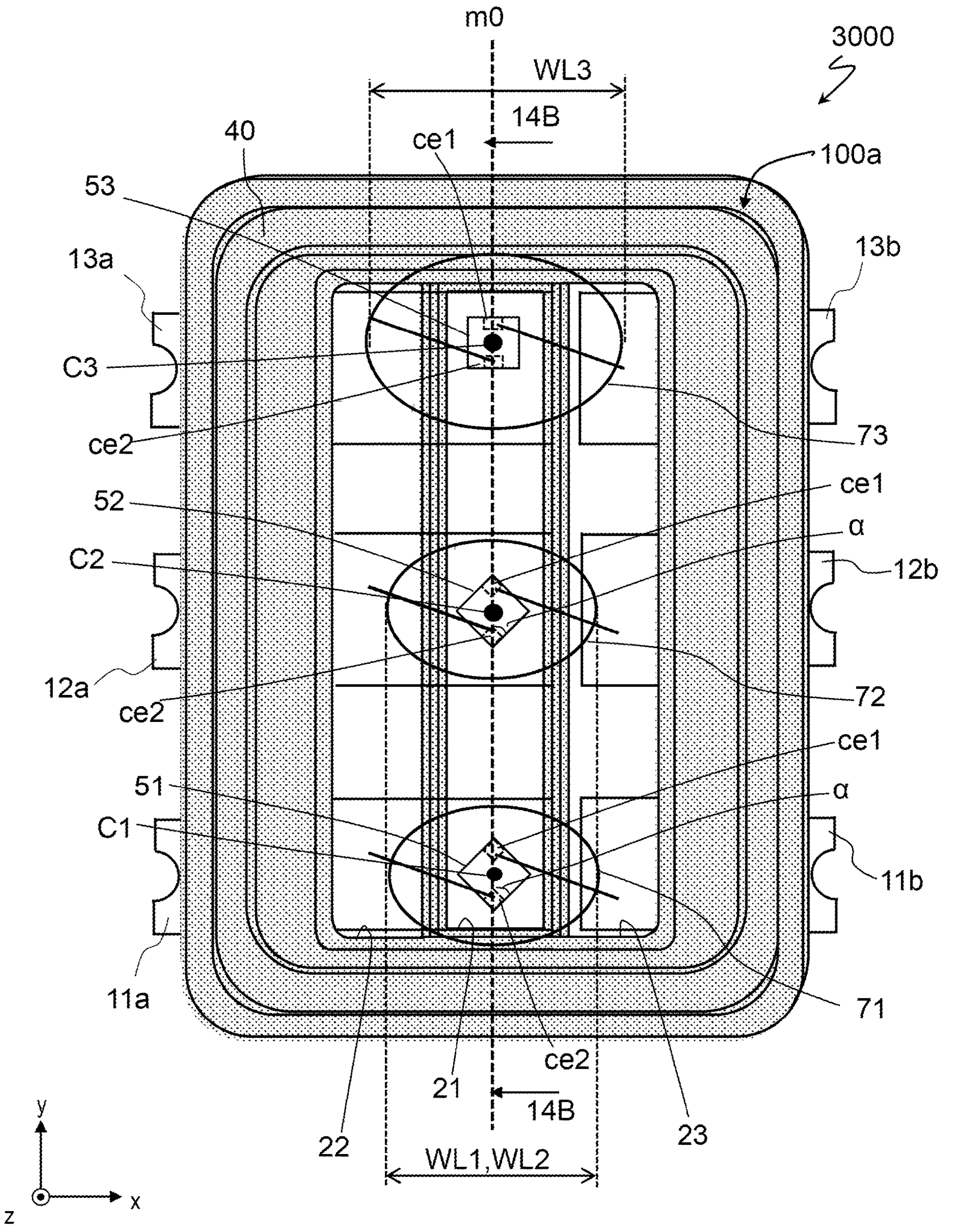

LIGHT-EMITTING DEVICE AND METHOD OF MANUFACTURING THE SAME

CROSS-REFERENCE TO RELATED APPLICATION

This application claims priority to Japanese Patent Application No. 2021-162285, filed on Sep. 30, 2021, Japanese Patent Application No. 2022-024239 filed on Feb. 18, 2022 and Japanese Patent Application No. 2022-083491 filed on May 23, 2022, the disclosures of which are hereby incorporated by reference in their entirety.

BACKGROUND

The present disclosure relates to a light-emitting device and a manufacturing method of the light-emitting device.

As alight-emitting device including alight-emitting diode (LED), a shell-shaped (lamp-type) light-emitting device including leads, a surface mount light-emitting device, and the like are known. Because lamp-type light-emitting devices have high light distribution in a frontward direction, such light-emitting devices are preferably used for large display devices, such as an LED display device, in which light-emitting devices are arranged in a matrix pattern as pixels.

Further, Japanese Patent Publication No. H10-261821 describes a surface-mountable light-emitting device including a lens on a light-emitting surface of the light-emitting device.

SUMMARY

One non-limiting exemplary embodiment of the present disclosure provides a light-emitting device that can reduce deterioration of characteristics of the light-emitting device by using a waterproof resin.

A light-emitting device according to one embodiment of the present disclosure includes a resin package including a plurality of leads and a resin member fixing at least a part of the plurality of leads, a plurality of light-emitting elements, and a mold resin portion. The resin package is provided with a primary surface, a back surface positioned opposite to the primary surface, and a lateral surface portion positioned between the primary surface and the back surface. Each of the plurality of leads includes an exposed region exposed at the primary surface from the resin member. The plurality of light-emitting elements include a first light-emitting element, a second light-emitting element, and a third light-emitting element. Each of the plurality of light-emitting elements is disposed in the exposed region of one of the plurality of leads. The mold resin portion includes a base portion sealing the plurality of light-emitting elements and a plurality of lens portions positioned above the base portion and integrally formed with the base portion. The plurality of lens portions include a first lens portion overlapping, in a plan view, the first light-emitting element, a second lens portion overlapping, in a plan view, the second light-emitting element, and a third lens portion overlapping, in a plan view, the third light-emitting element. The base portion includes an upper surface positioned above the primary surface of the resin package, and a lateral surface portion of the base portion covering a part of the lateral surface portion of the resin package in a direction from the upper surface of the base portion toward the back surface of the resin package. In a cross-sectional view, a first point is positioned closer to the plurality of lens portions than a second point, and the second point is positioned outward of a third point. The first point is an outermost point of the upper surface of the base portion, the second point is an outermost point of the lateral surface portion of the base portion, and the third point is an outermost point where the lateral surface portion of the resin package and the lateral surface portion of the base portion come into contact. In a cross-sectional view, the first light-emitting element is positioned closer to the back surface of the resin package than the first point and is positioned above the second point.

A light-emitting device according to one embodiment of the present disclosure includes a resin package including a plurality of leads and a resin member fixing at least a part of the plurality of leads, a plurality of light-emitting elements, and a mold resin portion. The resin package is provided with one recessed portion defined by the resin member and the plurality of leads in a primary surface. Each of the plurality of leads includes an exposed region exposed at an inner upper surface of the one recessed portion. The plurality of light-emitting elements includes a first light-emitting element, a second light-emitting element, and a third light-emitting element that are disposed in the one recessed portion of the resin package. Each of the plurality of light-emitting elements is disposed in the exposed region of one of the plurality of leads. The mold resin portion includes a base portion sealing the plurality of light-emitting elements and a plurality of lens portions positioned above the base portion and integrally formed with the base portion. The plurality of lens portions include a first lens portion overlapping, in a plan view, the first light-emitting element, a second lens portion overlapping, in a plan view, the second light-emitting element, and a third lens portion overlapping, in a plan view, the third light-emitting element.

A method of manufacturing a light-emitting device according to one embodiment of the present disclosure includes preparing a first structure and forming a mold resin portion. The first structure includes a resin package including a plurality of leads and a resin, and a plurality of light-emitting elements mounted on a primary surface of the resin package. The resin member includes a first step surface oriented in a direction identical to the primary surface in a lateral surface portion of the resin package. The mold resin portion seals the plurality of light-emitting elements of the first structure. The forming includes injecting a resin material into a casting case, immersing the plurality of light-emitting elements of the first structure and a part of the resin package including the primary surface in the resin material to cause a part of the resin material to rise between the lateral surface portion of the resin package and an inner wall of the casting case toward the first step surface along the lateral surface portion of the resin package, and curing the resin material.

According to an embodiment of the present disclosure, a light-emitting device that can reduce deterioration of characteristics of the light-emitting device by using a waterproof resin can be provided.

BRIEF DESCRIPTION OF DRAWINGS

FIG. 14A is a schematic top transparent view of a light-emitting device according to a sixth modified example.

DESCRIPTION OF EMBODIMENTS

Figure 1:
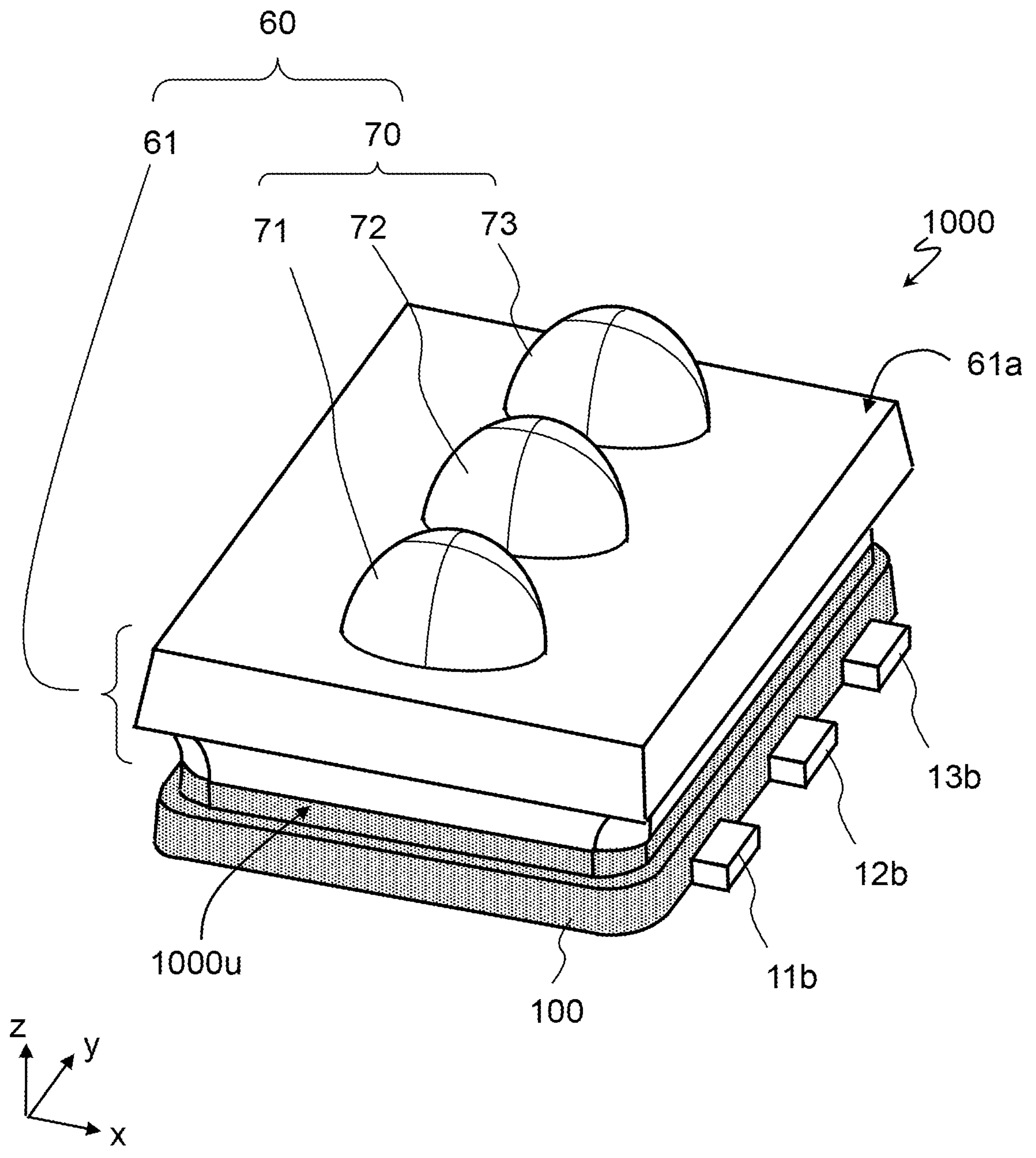
FIG. 1 is a schematic perspective view of a light-emitting device according to one embodiment of the present disclosure.

Embodiments of the present disclosure will be described below with reference to the drawings as appropriate. Light-emitting devices to be described below are intended to embody technical idea of the present disclosure, and the present disclosure is not limited to the description below unless otherwise specified. Further, the content described in one embodiment can also be applied to another embodiment or modified example. Furthermore, sizes, positional relationships, or the like of members illustrated in each of the drawings may be exaggerated for clarity of description.

In the description below, components having substantially the same function may be denoted by the same reference numerals and repetitive description thereof may be omitted. Also, components that are not referenced in the description may not be designated with reference numerals. In the following description, terms indicating a specific direction or position ("upper", "lower", "right", "left", and other terms including those terms) may be used. These terms are used merely facilitate understanding relative directions or positions in the referenced drawing. As long as the relative direction or position is the same as that described in the referenced drawing using the term such as "upper" or "lower", in drawings other than the drawings of the present disclosure, actual products, manufacturing devices, and the like, components is not necessarily arranged in the same manner as in the referenced drawing. In the present disclosure "parallel" includes, unless otherwise stated, in a case in which two straight lines, sides, faces, or the like are in a range from 0° to about 5°. Further, in the present disclosure, "perpendicular" or "orthogonal" includes, unless otherwise stated, in a case in which two straight lines, sides, faces, or the like are in a range of about ±5° from 90°.

When describing a direction with reference to an axis and a positive (+) direction or a negative (−) direction of the axis relative to a reference is important, description will be made by distinguishing + and − of the axis. Accordingly, a direction toward the + side of the x-axis will be referred to as a "+x direction" and a direction toward the − side of the x-axis will be referred to as a "−x direction". Similarly, directions toward the + sides of the y-axis and the z-axis will be referred to as a "+y direction" and a "+z direction" and directions toward the − sides of the y-axis and the z-axis will be referred to as a "−y direction" and a "−z direction". On the other hand, in a case in which the direction along a certain axis is important and whether the direction is the + direction or the − direction of the axis is inconsequential, the direction will simply be described as the "axis direction". Further, a plane including the x-axis and the y-axis will be referred to as an "xy plane", a plane including the x-axis and the z-axis will be referred to as an "xz plane", and a plane including the y-axis and the z-axis will be referred to as a "yz plane".

Embodiment

FIG. 1 is a schematic perspective view of a light-emitting device 1000 of one embodiment according to the present disclosure. In FIG. 1, arrows indicating an x-axis, a y-axis, and a z-axis that are mutually orthogonal are illustrated together. Such arrows indicating these directions may also be illustrated in other drawings of the present disclosure. In a configuration exemplified in FIG. 1, an outer shape of the light-emitting device 1000 is a basically rectangular shape in a top view. Each side of the rectangular outer shape is parallel to the x-axis or the y-axis illustrated in the drawing. The z-axis is perpendicular to the x-axis and the y-axis. Note that the outer shape of the light-emitting device 1000 may not be the rectangular shape in a top view.

Figure 2A:
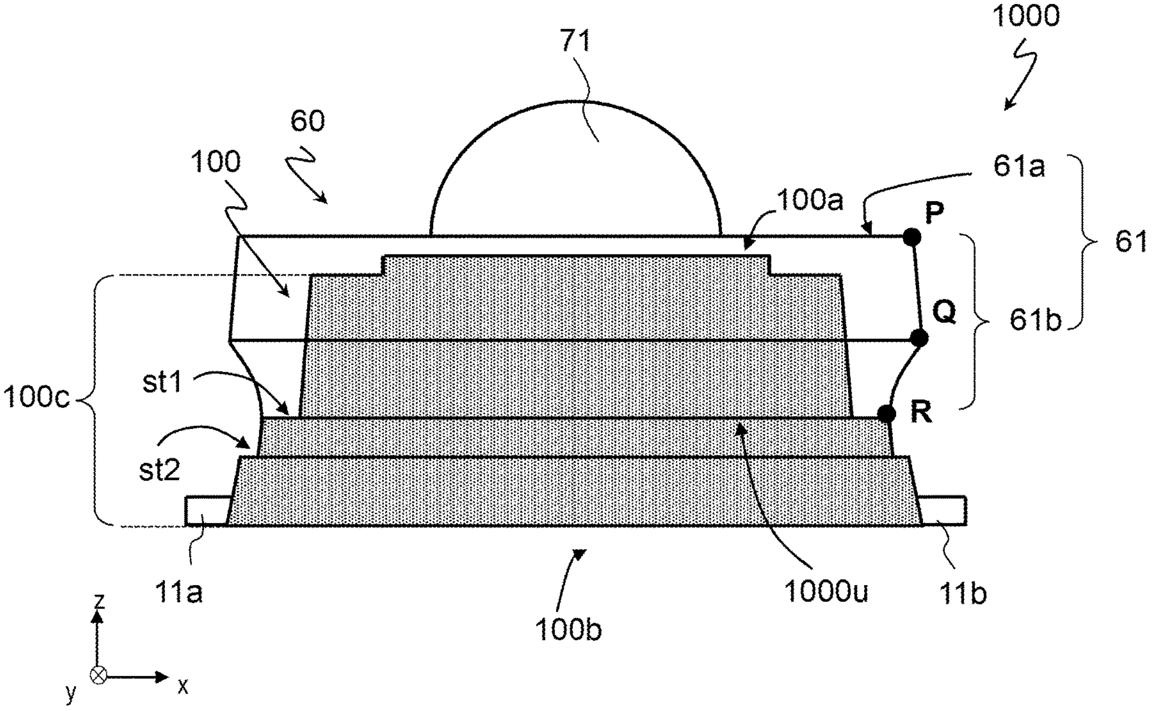
FIG. 2A is a schematic lateral side view of the light-emitting device illustrated in FIG. 1 when viewed in a y-axis direction.
Figure 2B:
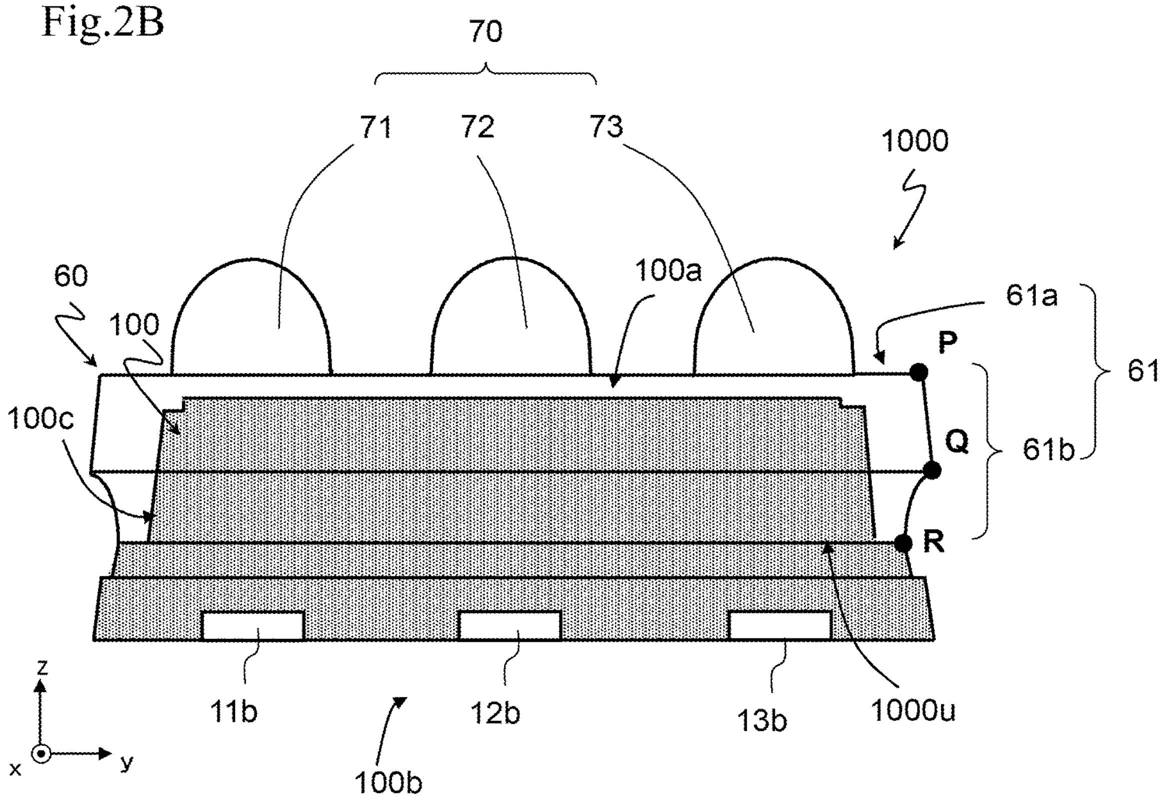
FIG. 2B is a schematic lateral side view of the light-emitting device illustrated in FIG. 1 when viewed in an x-axis direction.
Figure 2C:
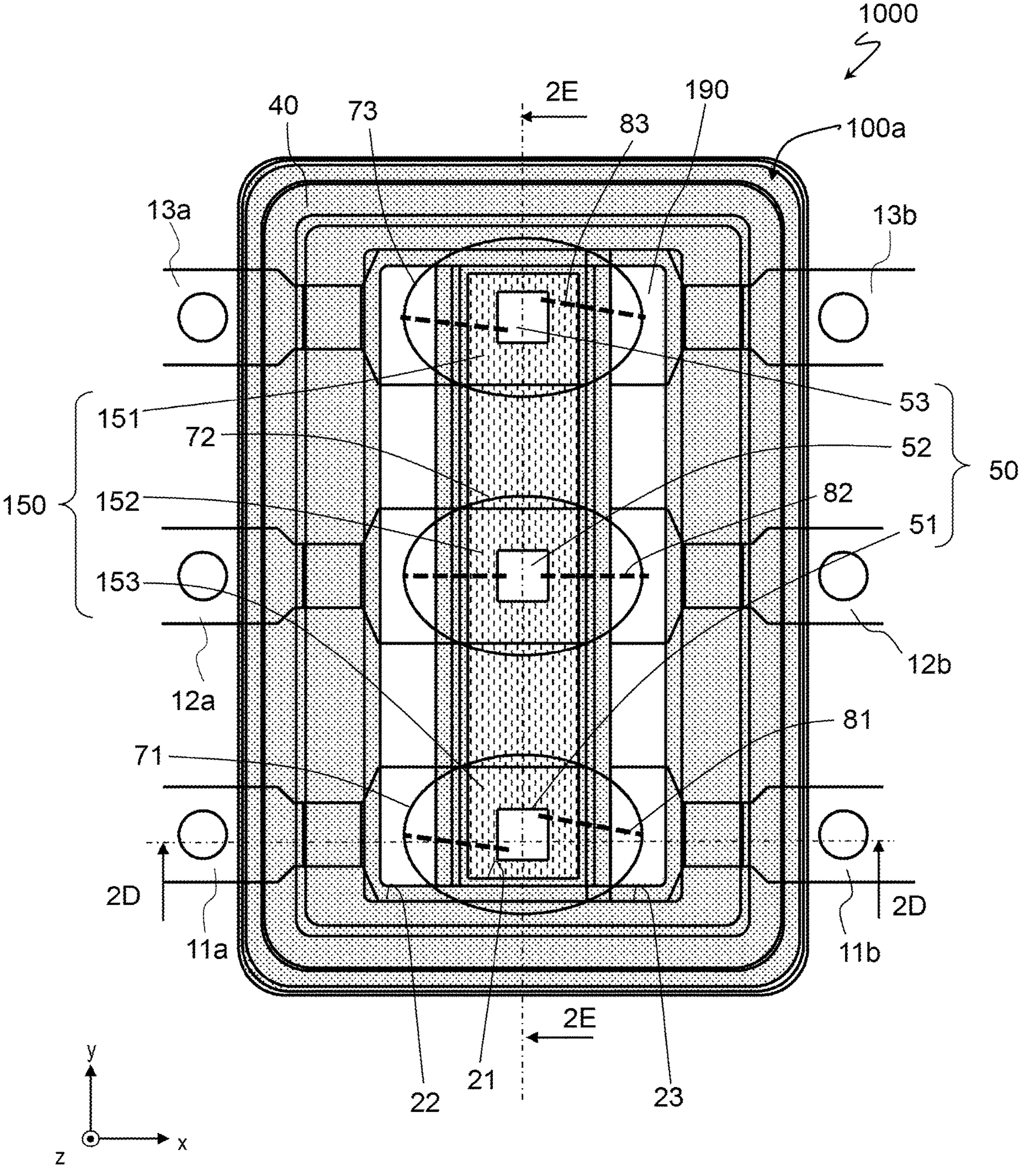
FIG. 2C is a schematic top transparent view of the light-emitting device illustrated in FIG. 1 when viewed in a z-axis direction.
Figure 2D:
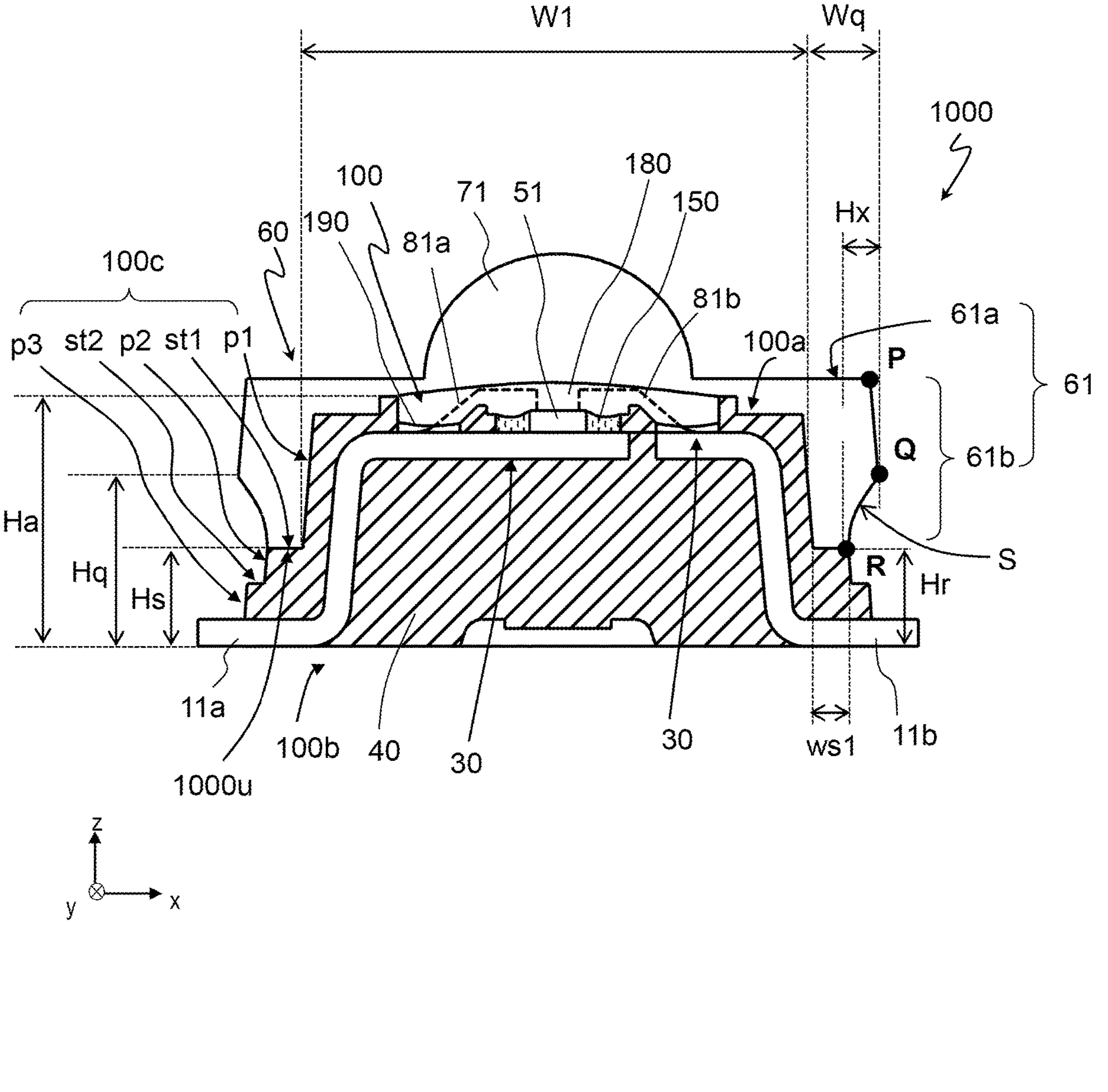
FIG. 2D is a schematic cross-sectional view taken along line 2D-2D illustrated in FIG. 2C.
Figure 2E:
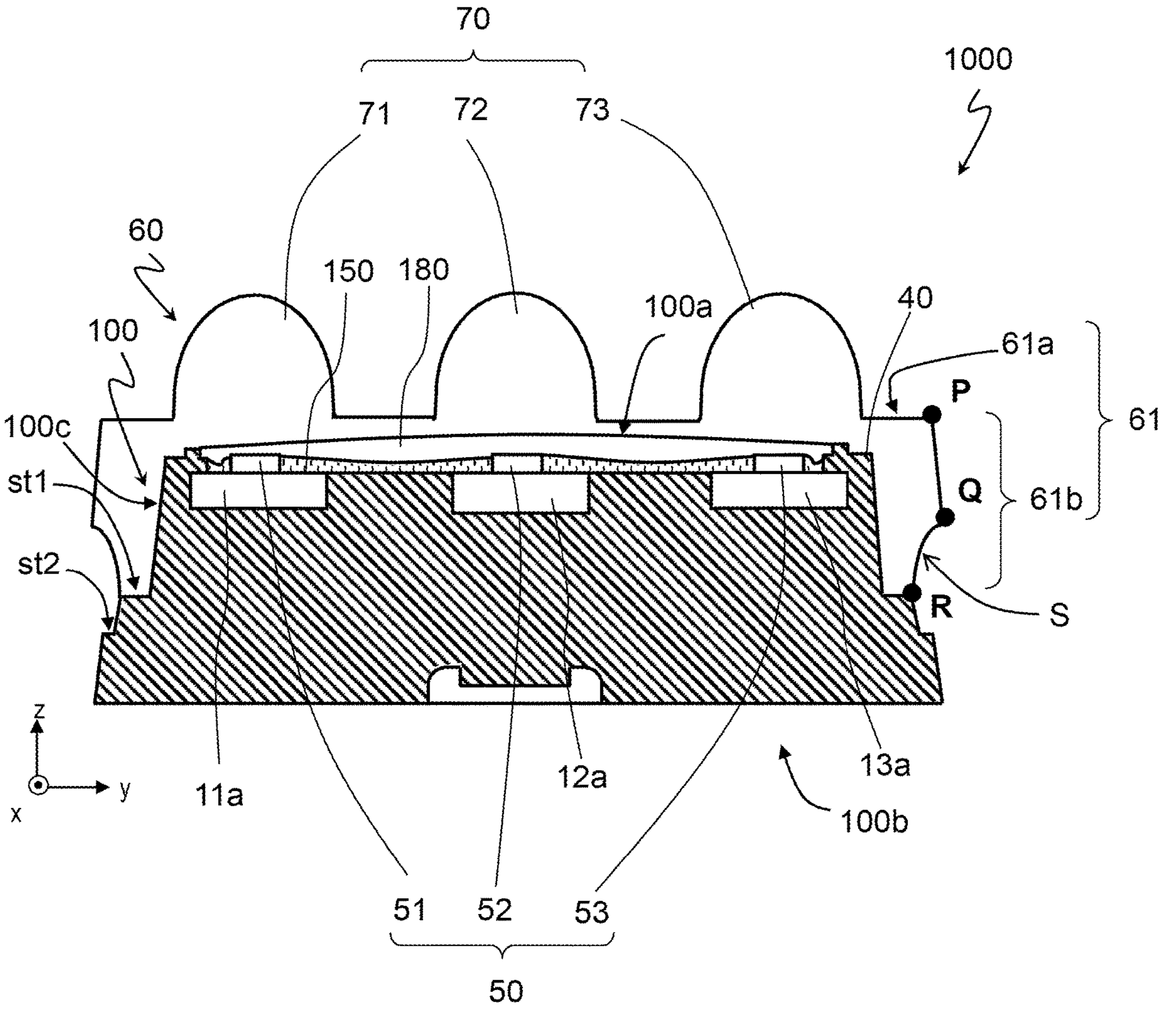
FIG. 2E is a schematic cross-sectional view taken along line 2E-2E illustrated in FIG. 2C.

FIG. 2A is a schematic lateral side view of the light-emitting device 1000 when viewed in the y-axis direction, and FIG. 2B is a schematic lateral side view of the light-emitting device 1000 when viewed in the x-axis direction. FIG. 2C is a schematic top transparent view of the light-emitting device 1000 when viewed in the z-axis direction. FIGS. 2D and 2E are schematic cross-sectional views taken along line 2D-2D illustrated in FIG. 2C and line 2E-2E illustrated in FIG. 2C, respectively.

As illustrated in FIGS. 2C to 2E, the light-emitting device 1000 includes a resin package 100, a plurality of light-emitting elements 50 including a first light-emitting element 51, a second light-emitting element 52, and a third light-emitting element 53, and a mold resin portion 60.

The resin package 100 includes a plurality of leads 11*a* to 13*b* and a resin member. In the present embodiment, the resin member is, for example, a first dark-colored resin member 40 formed of a dark-colored resin. Here, "dark-colored resin" is a resin in which, in a plan view, at least a portion exposed at a primary surface 100*a* of the resin package 100 has a dark color. The resin package 100 includes the primary surface 100*a*, a back surface 100*b* positioned opposite to the primary surface 100*a*, and a lateral surface portion (hereinafter referred to as an "outer side portion") 100*c* of the resin package 100 positioned between the primary surface 100*a* and the back surface 100*b*. Each of the plurality of leads 11*a* to 13*b* includes an exposed region 30 exposed from the first dark-colored resin member 40 at the primary surface 100*a*. The outer side portion may be covered by a mold resin portion or may be exposed to the outside without being covered.

Each of the first light-emitting element 51 to the third light-emitting element 53 is disposed in the exposed region 30 of one of the plurality of leads 11*a* to 13*b*.

The mold resin portion 60 includes a base portion 61 sealing the plurality of light-emitting elements 50 and a plurality of lens portions 70 positioned above the base portion 61.

The plurality of lens portions 70 are integrally formed with the base portion 61. In a plan view, the plurality of lens portions 70 include a first lens portion 71 overlapping the first light-emitting element 51, a second lens portion 72 overlapping the second light-emitting element 52, and a third lens portion 73 overlapping the third light-emitting element 53.

As illustrated in FIGS. 2A and 2B, the base portion 61 includes an upper surface 61*a* and a lateral surface portion 61*b* of the base portion 61. The upper surface 61*a* is positioned above the primary surface 100*a* of the resin package 100. In this example, the upper surface 61*a* is a surface including starting points where the lens portions 70 are formed. The lateral surface portion 61*b* covers a part of the outer side portion 100*c* of the resin package 100 in a direction from the upper surface 61*a* of the base portion 61 toward the back surface 100*b* of the resin package 100. The lateral surface portion 61*b* provides continuous coverage from the upper surface portion 61*a* of the base portion 61 to the part of the outer side portion 100*c* of the resin package 100.

As illustrated in FIGS. 2D and 2E, in this description, in a cross-sectional view when viewed in a direction orthogonal to a normal line direction of the primary surface 100*a*, an outermost point P of the upper surface 61*a* of the base portion 61 is referred to as a "first point", an outermost point Q of the lateral surface portion 61*b* of the base portion 61 is referred to as a "second point", and an outermost point R where the outer side portion 100*c* of the resin package 100 and the lateral surface portion 61*b* of the base portion 61 come into contact is referred to as a "third point". In the present embodiment, in a cross-sectional view, the first point P is positioned closer to the lens portions 70 than the second point Q, and the second point Q is positioned outward of the third point R.

In the present embodiment, the lens portions 70 are provided on the emission side of the corresponding light-emitting elements 50. With this structure, the light-emitting device 1000 can extract light in a frontward direction (+z direction) with high efficiency, making it possible to obtain the light-emitting device 1000 having high brightness.

Further, in a cross-sectional view, the base portion 61 and the resin package 100 are disposed so that the first point P is positioned closer to the lens portions 70 than the second point Q, and thus, when the mold resin portion 60 is formed by a casting method, for example, the mold resin portion 60 is easily removed from a casting case. The second point Q is preferably positioned below (−z direction) the primary surface 100*a* of the resin package 100.

Furthermore, the base portion 61 and the resin package 100 are disposed so that the second point Q is positioned outward of the third point R in a cross-sectional view. Thus, in a display device such as an outdoor display that uses the light-emitting device 1000, when a waterproof resin is formed on a lateral surface of the light-emitting device 1000, it is possible to reduce a continuous rise of the waterproof resin in the +z direction along the lateral surface of the light-emitting device 1000 and subsequent adherence of the waterproof resin from the upper surface 61*a* to the lens portions 70. Accordingly, a decrease in brightness and a decrease in light distributivity due to a part of the waterproof resin being disposed on the lens portions 70 can be reduced.

As illustrated in FIGS. 1, 2A, and 2B, in the present embodiment, the mold resin portion 60 is exposed at an upper portion of the lateral surface of the light-emitting device 1000, and the resin package 100 is exposed at a lower portion of the lateral surface of the light-emitting device 1000. In a lateral side view of the light-emitting device 1000, the mold resin portion 60 and the resin package 100 include a boundary 1000*u*. In this description, the boundary 1000*u* between the mold resin portion 60 and the resin package 100 on the lateral surface of the light-emitting device 1000 is referred to as an "interface portion". The interface portion 1000*u* can be a moisture penetration area where moisture readily penetrates the light-emitting device 1000 from the outside. Accordingly, the waterproof resin described above is preferably disposed so as to protect at least the interface portion 1000*u* and yet not cover the lens portions 70. Note that a configuration of the display device and the waterproof resin will be described below with reference to FIG. 3B.

Note that "plan view" refers to a plan view as viewed in the +z-axis direction. "Top view" refers to a top view as viewed in the +z-axis direction. "Lateral side view" refers to a lateral side view as viewed in a direction orthogonal to any lateral surface of the external shape of the light-emitting device in a plan view.

Each of the components will be described in detail below.

Resin Package 100

In the present embodiment, the resin package 100 is a surface-mounted package.

Figure 2F:
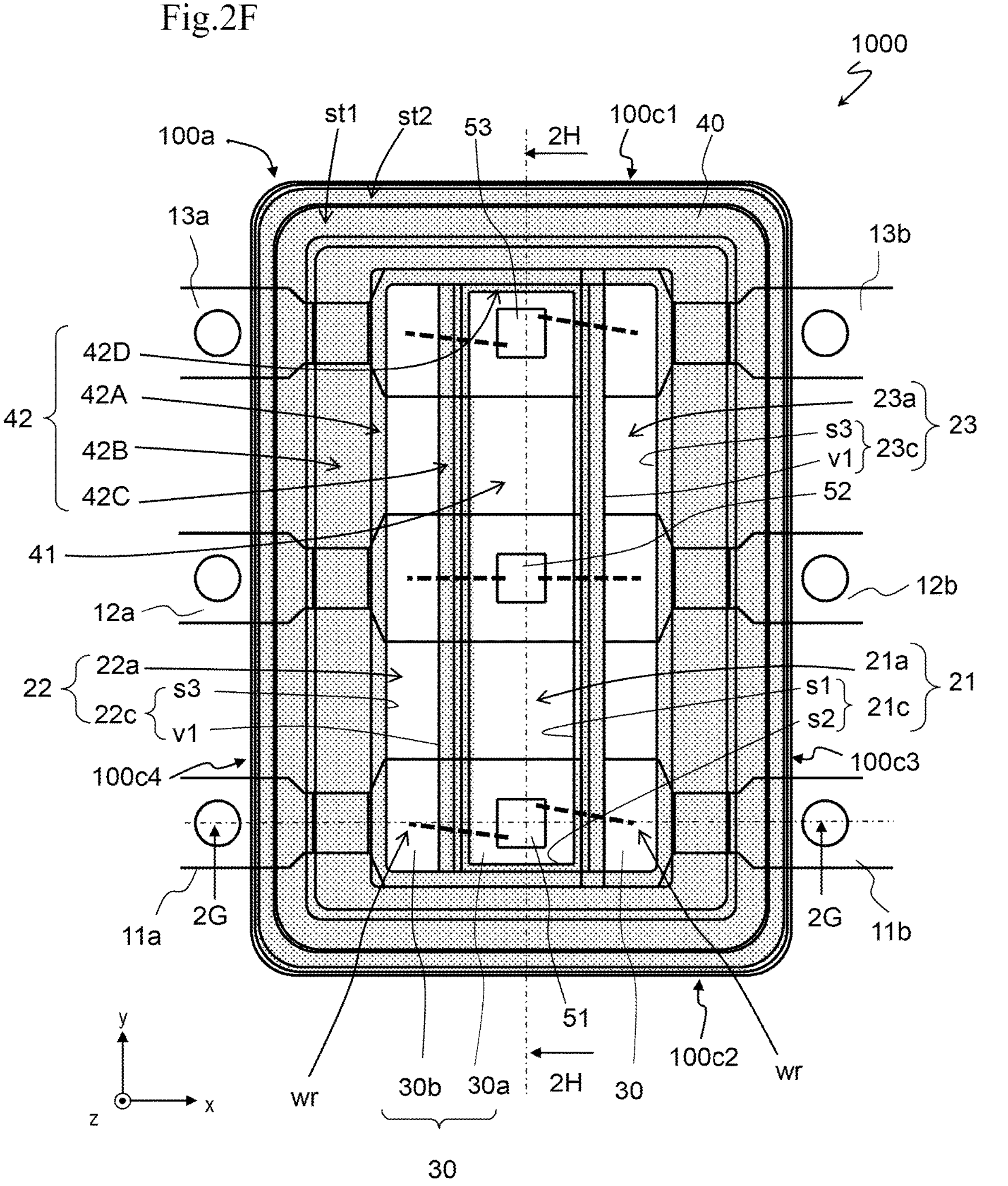
FIG. 2F is a schematic top transparent view illustrating a resin package on which light-emitting elements are formed.
Figure 2G:
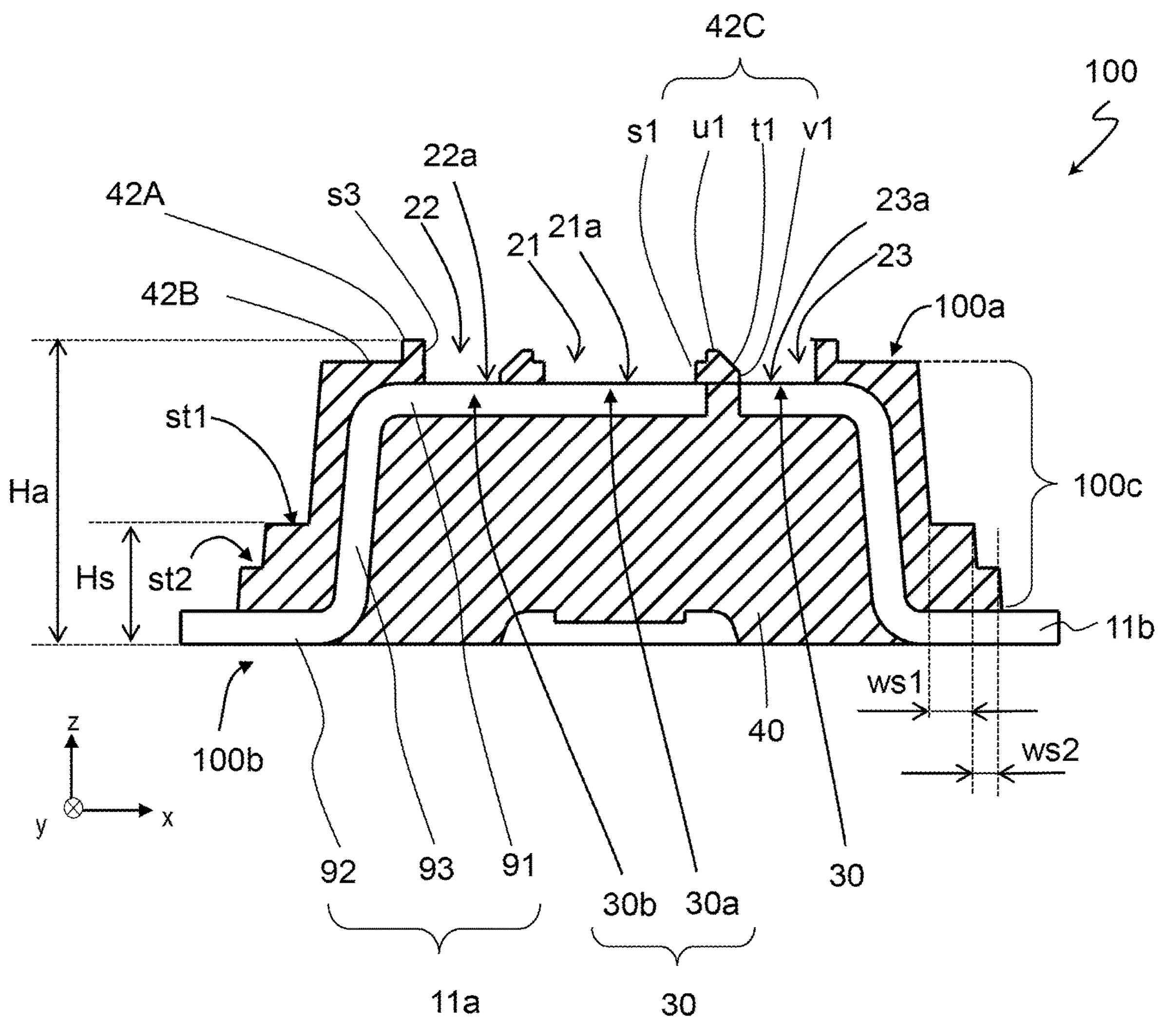
FIG. 2G is a schematic cross-sectional view illustrating the resin package, taken along line 2G-2G illustrated in FIG. 2F.
Figure 2H:
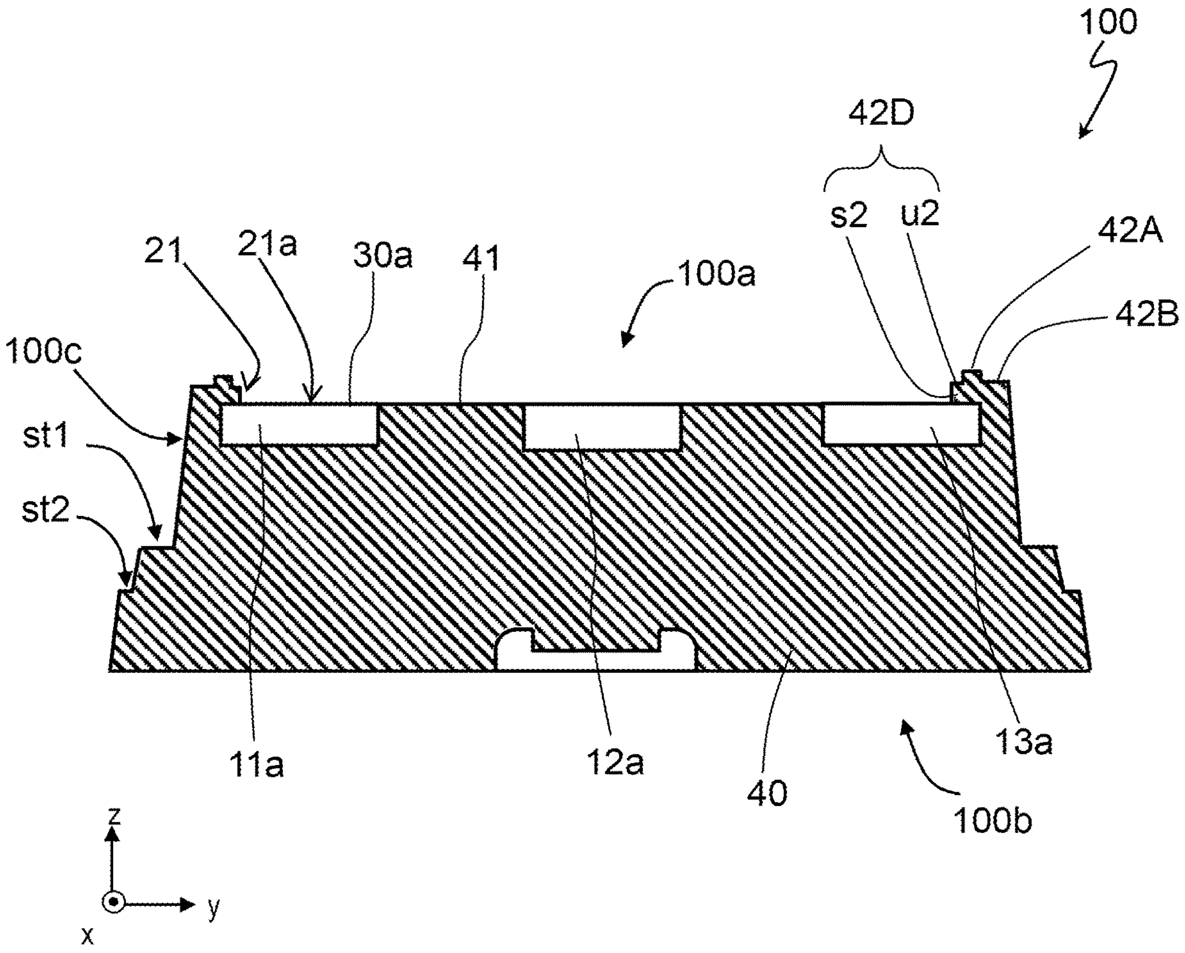
FIG. 2H is a schematic cross-sectional view illustrating the resin package, taken along line 2H-2H illustrated in FIG. 2F.

FIG. 2F is a schematic top transparent view illustrating the resin package 100 on which the light-emitting elements 50 are formed. FIG. 2G is a schematic cross-sectional view, taken along line 2G-2G illustrated in FIG. 2F, of the resin package 100. FIG. 2H is a schematic cross-sectional view illustrating the resin package 100, taken along line 2H-2H illustrated in FIG. 2F.

As illustrated in FIGS. 2F and 2H, the resin package 100 includes the primary surface 100*a*, the back surface 100*b* opposite to the primary surface 100*a*, and the outer side portion 100*c* positioned between the primary surface 100*a* and the back surface 100*b*. In the illustrated configuration, a shape of the primary surface 100*a* of the resin package 100 is quadrangular in a top view. Each side of a quadrangular shape of the primary surface 100*a* is parallel to the x-axis or the y-axis. The outer side portion 100*c* of the resin package 100 includes four side portions 100*c*1 to 100*c*4 each illustrated in FIG. 2F. The back surface 100*b* of the resin package 100 includes a mounting surface of each lead. The mounting surface is used when fixing the light-emitting device 1000 to a mounting substrate. Here, the back surface 100*b* (or the mounting surface of each lead) is parallel to the xy plane.

Note that the shape of the primary surface 100*a* in a top view may be a shape other than the quadrangular shape, and may be, for example, a substantially triangular shape, a substantially quadrangular shape, a substantially pentagonal shape, a substantially hexagonal shape, another polygonal shape, or a shape including a curved line such as a circular shape or an elliptical shape.

The resin package 100 includes the plurality of leads 11*a* to 13*b* and the first dark-colored resin member 40 that fixes at least a part of the plurality of leads 11*a* to 13*b*.

Step Surface of Resin Package 100

As illustrated in FIG. 2D, the first dark-colored resin member 40 includes a first step surface st1 on the outer side portion 100*c* of the resin package 100. The first step surface st1 is oriented in the same direction as the primary surface 100*a*. That is, the first step surface st1 is a surface facing upward (facing the +z direction). The first step surface st1 is positioned closer to the back surface 100*b* than the second point Q of the base portion 61. In this description, "step surface" refers to a surface that, when a section has a stepped shape in a cross-sectional view, corresponds to a tread of a step, regardless of the configuration in which the step surface is added.

In the example illustrated in FIG. 2D, in a cross-sectional view, the outer side portion 100*c* of the resin package 100 includes a first surface p1 from the primary surface 100*a* toward the back surface 100*b*, a second surface p2 positioned closer to the back surface 100*b* than the first surface p1 and outward of the first surface p1, and the first step surface st1 facing upward (facing the +z direction) and positioned between the first surface p1 and the second surface p2. As illustrated, the outer side portion 100*c* may further include a third surface p3 positioned proximate to the back surface 100*b* relative to the second surface p2, and a second step surface st2 facing upward (facing the +z direction) and positioned between the second surface p2 and the third surface p3. Preferably, the third surface p3 is positioned further outward of the light-emitting device 1000 than the second surface p2. More preferably, the first surface p1, second surface p2, and the third surface p3 are positioned progressively outward of the light-emitting device 1000 in this order.

As illustrated in FIG. 2F, the first step surface st1 may be formed around an outer periphery of the resin package 100. Note that the first step surface st1 may be disposed only on a part of the outer periphery of the resin package 100.

By providing the first step surface st1, it is possible to control a shape of the mold resin portion 60. Accordingly, the light-emitting device 1000 can expose the back surface 100*b* of the resin package 100 from the mold resin portion 60. Thus, it is possible to reduce mounting defects of the light-emitting device 1000 at the time of mounting (when the back surface 100*b* of the resin package 100 is covered by the mold resin portion 60, the back surface 100*b* may not be wet by solder during mounting, for example) and enhance the reliability of the light-emitting device 1000.

A distance Hs from the back surface 100*b* of resin package 100 to the first step surface st1 of resin package 100 (hereinafter referred to as "height of the first step surface st1") may be, for example, 0.2 mm or greater. Alternatively, a ratio Hs/Hq of the height Hs of the first step surface st1 to a height Hq of the second point Q may be, for example, 0.2 or greater. By setting the height Hs or the ratio Hs/Hq to within the range described above, it is possible to reduce the rise of the resin material that is to become the mold resin portion 60 to the leads in an immersion step described below when forming the mold resin portion 60 using a casting method. The height Hs of the first step surface st1 is more preferably 0.3 mm or greater, and even more preferably 0.35 mm. The ratio Hs/Hq is more preferably 0.4 or greater. The height Hs of the first step surface st1 is the shortest distance between the back surface 100*b* of the resin package 100 and the first step surface st1 along the z-axis direction. The height Hq of the second point Q is the shortest distance from the back surface 100*b* of the resin package 100 to the second point Q along the z-axis direction, in a cross-sectional view.

On the other hand, the height Hs of the first step surface st1 may be, for example, 1.5 mm or less. Alternatively, the ratio Hs/Hq of the height Hs of the first step surface st1 to the height Hq of the second point Q may be, for example, 0.8 or less. By setting the height Hs or the ratio Hs/Hq to within the range described above, it is possible to ensure a distance between a point where the resin material, which becomes the mold resin portion 60, begins to rise in the −z direction and the first step surface st1 in the immersion step described below when forming the mold resin portion 60. Therefore, a maximum amount of the resin material that can be disposed on the outer side portion 100*c* of the resin package 100 due to the rise in the immersion step (maximum volume of the resin material that can be caused to rise in the −z direction) can be increased, making it possible to fix the resin package 100 more stably. The height Hs of the first step surface st1 is more preferably 1.0 mm or less, and even more preferably 0.7 mm or less. The ratio Hs/Hq described above is more preferably 0.7 or less.

A width ws1 may be, for example, 0.1 mm or greater. More preferably, the width ws1 is in a range from 0.15 mm to 0.4 mm. With the width ws1 being 0.1 mm or greater, it is possible to reduce the rise of the resin material, which becomes the mold resin portion 60, when forming the mold resin portion 60. As illustrated in FIG. 2D, the width ws1 of the first step surface st1 may be smaller than a width Wq that is a distance in a plane (xy plane) parallel to the primary surface 100*a* of the resin package 100 from the second point Q of the base portion 61 to the outer side portion 100*c* of the resin package 100, for example.

In a cross-sectional view, a point positioned on an outermost of the first step surface st1 of the resin package 100 may be positioned inward of the second point Q of the mold resin portion 60. Thus, the lateral surface portion 61*b* of the mold resin portion 60 protrudes outward of the first step surface st1, making it possible to reduce a further upward rise (+z direction) by the waterproof resin (FIG. 3A, FIG. 3B) beyond the second point Q of the lateral surface portion 61*b*. In FIG. 2A, a point positioned outermost of the first step surface st1 matches the third point R where the mold resin portion 60 and the resin package 100 come into contact on the lateral surface of the light-emitting device 1000. In this case, when the mold resin portion 60 is formed by a casting method, a lowermost portion of the mold resin portion 60 can be controlled to a lower position. With this structure, the interface portion 1000*u* (FIG. 2A and the like) that is the moisture penetration area between the mold resin portion 60 and the resin package 100 can be covered with the waterproof resin while suppressing the amount of the waterproof resin. Note that the point positioned outermost of the first step surface st1 may not match the third point R.

As illustrated in FIG. 2G, a height Ha of the primary surface 100*a* is a distance from the back surface 100*b* of the resin package 100 to a portion of the primary surface 100*a* positioned furthest upward, in the z-axis direction. The ratio Hs/Ha of the height Hs of the first step surface st1 to the height Ha of the primary surface 100*a* may be, for example, 0.5 or less. With this structure, in the immersion step when forming the mold resin portion 60, the maximum resin amount (volume of the resin material rising in the −z direction) that can be disposed on the outer side portion 100*c* of the resin package 100 can be increased, making it possible to fix the resin package 100 more firmly. On the other hand, the ratio Hs/Ha may be, for example, 0.15 or greater. This makes it easy to control the position of a lowermost end of the mold resin portion 60 so that the mold resin portion 60 and the leads 11*a* to 13*b* do not come into contact with each other.

In the example illustrated in FIG. 2G, the first dark-colored resin member 40 further includes the second step surface st2 positioned below the first step surface st1 in the outer side portion 100*c* of the resin package 100. A width ws2 of the second step surface st2 may be narrower than the width ws1 of the first step surface. The width ws2 is, for example, 0.2 mm or less. The second step surface st2 may be positioned outward of the first step surface st1.

By providing the second step surface st2, in a case in which a part of the resin material rising in the −z direction from the casting case does not stop at the first step surface st1, it is possible to stem the resin material that does not stop at the first step surface st1 by the second step surface st2. Accordingly, contact between the mold resin portion 60 and the plurality of leads 11*a* to 13*b* can be reduced. At least a portion of the outer side portion 100*c* of the resin package 100 positioned proximate to the back surface 100*b* relative to the second step surface st2 may be exposed from the mold resin portion 60. The lowermost end of the mold resin portion 60 may come into contact with the second step surface st2.

As illustrated in FIG. 2F, in a top view, the first step surface st1 may surround the primary surface 100*a* of the resin package 100, and the second step surface st2 may be positioned outward of the first step surface st1 and surround the primary surface 100*a* and the first step surface st1.

First Recessed Portion 21

As illustrated in FIGS. 2F and 2G, the primary surface 100*a* of the resin package 100 may include one first recessed portion 21 defined by the first dark-colored resin member 40 and the plurality of leads 11*a* to 13*b*. An inner upper surface of the first recessed portion 21 includes the exposed region 30 of at least one lead. The first light-emitting element 51 to the third light-emitting element 53 are disposed in the one first recessed portion 21. Note that, although the first light-emitting element 51 to the third light-emitting element 53 are disposed in the one first recessed portion 21 here, one or two light-emitting elements may be disposed in one recessed portion.

As illustrated in FIGS. 2F and 2G, the first recessed portion 21 is defined by a bottom surface (inner upper surface) 21*a* and an inner lateral surface 21*c* surrounding the inner upper surface 21*a*. The inner upper surface 21*a* of the first recessed portion 21 is an upward facing surface (surface facing the +z side). The inner upper surface 21*a* of the first recessed portion 21 is surrounded by a surface or a ridge line positioned above the inner upper surface 21*a* in a plan view and formed from the first dark-colored resin member 40. The inner lateral surface 21*c* of the first recessed portion 21 is composed of the first dark-colored resin member 40. The inner lateral surface 21*c* (here, lateral surfaces s1 and s2) of the first recessed portion 21 may be perpendicular to the inner upper surface 21*a* of the first recessed portion 21 or may be inclined relative to a vertical plane of the inner upper surface 21*a*.

As illustrated in FIG. 2F, in the present embodiment, the inner upper surface 21*a* of the first recessed portion 21 is composed of a part of the leads 11*a* to 13*a* and a first resin portion 41 of the first dark-colored resin member 40. The inner upper surface 21*a* is surrounded by a second resin portion 42 including an upper surface positioned above (proximate to the lens portion 70) the first resin portion 41.

The inner lateral surface 21*c* of the first recessed portion 21 is composed of a lateral surface of the second resin portion 42.

In the example illustrated in FIG. 2F, the inner upper surface 21*a* of the first recessed portion 21 has a planar shape long in one direction (here, y-axis direction). The inner upper surface 21*a* of the first recessed portion 21 includes the first resin portion 41 and an exposed region 30*a* of each of the leads 11*a* to 13*a* arrayed in the y-axis direction. The first resin portion 41 is positioned between the exposed regions 30*a* of two adjacent leads. The first light-emitting element 51 to the third light-emitting element 53 are respectively disposed on the exposed regions 30*a* of the leads 11*a* to 13*a*.

The primary surface 100*a* of the resin package 100 may further include at least one second recessed portion defined by the first dark-colored resin member 40 and the plurality of leads 11*a* to 13*b*. In this example, the primary surface 100*a* includes a plurality of (here, two) second recessed portions 22, 23.

Similar to the first recessed portion 21, the second recessed portions 22 and 23 also include inner upper surfaces 22*a* and 23*a*, and inner lateral surfaces 22*c* and 23*c*, respectively. In a plan view, the inner upper surface 22*a* of the second recessed portion 22 is surrounded by the upper surface of the second resin portion 42. Further, in a plan view, the inner upper surface 23*a* of the second recessed portion 23 is surrounded by the upper surface of the second resin portion 42. In the present embodiment, the first recessed portion 21, the second recessed portion 22, and the second recessed portion 23 are spaced apart from each other with the second resin portion 42 interposed therebetween, in a top view.

Each of the inner upper surfaces 22*a*, 23*a* of the second recessed portions 22, 23 includes, respectively, the exposed region of at least one lead. The exposed region of the lead includes a connection region wr to which a wire for electrically connecting the lead and the light-emitting element 50 is bonded.

In the example illustrated in FIG. 2F, in atop view, the second recessed portions 22 and 23 are respectively disposed on the −x side and the +x side of the first recessed portion 21. That is, the first recessed portion 21 is positioned between the second recessed portions 22 and 23. Each of the second recessed portions 22 and 23 has a planar shape long in the y-axis direction. The inner upper surface 22*a* of the second recessed portion 22 includes the first resin portion 41 and exposed regions 30*b* of the leads 11*a* to 13*a* arrayed in the y-axis direction. The first resin portion 41 is positioned between the exposed regions 30*b* of two adjacent leads. The exposed regions 30*b* of the leads 11*a* to 13*a* are respectively electrically connected to one of the positive and negative electrodes of the first light-emitting element 51 to the third light-emitting element 53 by wires. Similarly, the inner upper surface 23*a* of the second recessed portion 23 includes the first resin portion 41 and the exposed regions 30*b* of the leads 11*b* to 13*b* arrayed in the y-axis direction. The first resin portion 41 is positioned between the exposed regions 30*b* of two adjacent leads. The exposed regions 30*b* of the leads 11*b* to 13*b* are respectively electrically connected to the other of the positive and negative electrodes of the first light-emitting element 51 to the third light-emitting element 53 by wires.

As illustrated in FIGS. 2C to 2E, a reflective member 150 may be disposed in the first recessed portion 21. The reflective member 150 may come into contact with the lateral surfaces of each light-emitting element 50, for example. A position of the reflective member 150 may be controlled by utilizing an inner wall of the first recessed portion 21. For example, the reflective member 150 may be in direct contact with at least a part of the inner wall of the first recessed portion 21.

As illustrated in FIG. 2D, a second dark-colored resin member 190 may be disposed in the second recessed portions 22 and 23, for example. This makes it possible to reduce a reduction in display contrast caused by reflection of external light or the like incident on the light-emitting device 1000 by the exposed regions 30*b* of the leads. The second dark-colored resin member 190 may be formed by using a resin material and a colorant similar to those of the first dark-colored resin member 40. As the second dark-colored resin member 190, a resin material obtained by adding carbon black to a silicone resin material, an epoxy resin material, or an epoxy-modified silicone resin material, for example, can be used.

Note that an arrangement, a quantity, a planar shape, and the like of the recessed portions 21 to 23 are not limited to those in the example illustrated.

First Dark-Colored Resin Member 40

The first dark-colored resin member 40 has insulating properties for electrically isolating the light-emitting elements from the outside. Preferably, at least a portion of the first dark-colored resin member 40 positioned proximate to the primary surface 100*a* of the resin package 100, that is, proximate to a light emission observation surface, is a dark color such as black or gray. The first dark-colored resin member 40 may be colored to the dark color, for example. Alternatively, the first dark-colored resin member 40 may be obtained by printing dark-colored ink on a white-colored resin. Alternatively, the first dark-colored resin member 40 may be formed in two colors of a dark-colored resin and a white-colored resin. With this structure, in the primary surface 100*a* of the resin package 100, deterioration in contrast caused by reflection of external light and the like can be reduced. Note that, in this description, “dark color” refers to a color having a color value of 4.0 or less in the Munsell color system (20 hues). The hue is not particularly limited, and the chroma may be freely determined as necessary. Preferably, the color value is 4.0 or less and the chroma is 4.0 or less.

As described above, in the example illustrated in FIGS. 2F and 2G, in the primary surface 100*a*, the first dark-colored resin member 40 includes the first resin portion 41 exposed at the inner upper surfaces 21*a* to 23*a* of the first recessed portion 21 and the second recessed portions 22 and 23, respectively, and the second resin portion 42 including an upper surface positioned above (+z direction) the first resin portion 41.

In this example, the second resin portion 42 includes a resin portion 42A (also referred to as “surrounding resin portion”) that surrounds the inner upper surfaces 21*a* to 23*a* of the first recessed portion 21 and the second recessed portions 22 and 23, respectively, a resin portion 42B (also referred to as “outer resin portion”) positioned outward of the resin portion 42A, and a pair of resin portions 42C (also referred to as “dividing resin portions”) positioned between the first recessed portion 21 and second recessed portion 22, and the first recessed portion 21 and second recessed portion 23, respectively, in a top view. Note that the resin portion 42C may be singular, or there may be one or more pairs.

An upper surface of the resin portion 42A is positioned above (+z side) upper surfaces of the corresponding resin portions 42B and 42C. By making the upper surface of the resin portion 42A higher than the upper surfaces of the corresponding resin portions 42B and 42C, a light-transmissive resin member 180 is easily disposed in the region defined by the resin portion 42A, for example. Further, the upper surfaces of the corresponding resin portions 42C may be positioned above the upper surface of the resin portion 42B, for example. With this structure, a thickness of the light-transmissive resin member 180 can be ensured above the light-emitting elements 50 by utilizing the upper surfaces of the corresponding resin portions 42C. Further, by making the upper surface of the resin portion 42B lower than the resin portion 42A, a thickness of a portion of the base portion 61 positioned on the resin portion 42B can be increased. Note that, in this description, the “upper surface” of each resin portion is the surface positioned on the +z-most side. A portion of each resin portion positioned on the +z-most side may be a ridge line. In this case, a portion of each resin portion (ridge line or surface) positioned on the +z-most side has the positional relationship described above.

Each of the resin portions 42C is, for example, a wall-shaped portion having a rectangular planar shape extending in the y-axis direction. In a plan view, the resin portions 42C divide the first recessed portion 21 and the second recessed portion 22, and the first recessed portion 21 and the second recessed portion 23, respectively. In a plan view, each end portion of the resin portions 42C in the longitudinal direction may come into contact with the resin portion 42A. Further, here, the light-emitting elements 50 are disposed between the pair of resin portions 42C arrayed in the x-axis direction, facing each other.

In a plan view, a pair of resin portions 42D may be further disposed between the pair of resin portions 42C. Each resin portion 42D is positioned between the first resin portion 41 and the resin portion 42A on the inner upper surface 21*a* of the first recessed portion 21. Each of the resin portions 42D has a rectangular planar shape extending in the x-axis direction, for example. In the present embodiment, the resin portions 42C, 42D are connected and thus surround the inner upper surface 21*a* of the first recessed portion 21.

According to the configuration described above, as illustrated in FIG. 2F, the first recessed portion 21 includes the inner upper surface 21*a* surrounded by the pair of resin portions 42C and the pair of resin portions 42D, and the inner lateral surfaces 21*c*. The inner lateral surfaces 21*c* are composed of the first lateral surfaces s1 of the corresponding resin portions 42C and the first lateral surfaces s2 of the corresponding resin portions 42D. The second recessed portion 22 includes the inner upper surface 22*a* surrounded by one of the pair of resin portions 42C and the resin portion 42A, and the inner lateral surface 22*c*. The second recessed portion 23 includes the inner upper surface 23*a* surrounded by the other of the pair of resin portions 42C and the resin portion 42A, and the inner lateral surface 23*c*. The inner lateral surface 22*c* of the second recessed portion 22 is composed of a second lateral surface v1 of one of the resin portions 42C and a lateral surface s3 of the resin portion 42A. The inner lateral surface 23*c* of the second recessed portion 23 is composed of a second lateral surface v1 of the other of the resin portions 42C and a lateral surface s3 of the resin portion 42A. The lateral surface s3 of the resin portion 42A is positioned on a side opposite to the resin portion 42B in a plan view.

As illustrated in FIG. 2G, each of the resin portions 42C includes the first lateral surface s1 that comes into contact with the inner upper surface 21*a* of the first recessed portion 21, the second lateral surface v1 positioned proximate to the second recessed portion 22 or 23, an upper surface u1, and a tapered surface ti positioned between the upper surface u1 and the second lateral surface v1. As illustrated, the first lateral surface s1 of the first recessed portion 21 may further include a step surface facing upward (facing the lens portion 70) between the first lateral surface s1 and the upper surface u1. With this structure, a thickness (thickness in the z-axis direction) of the reflective member 150 (FIG. 2D) can be controlled by a height of the step surface of the first lateral surface s1. A height of an upper end of the second lateral surface v1 may be lower than those of the upper surface u1 and the step surface of the first lateral surface s1. A thickness of the second dark-colored resin member 190 (FIG. 2D) can be controlled by the height of the upper end of the second lateral surface v1. The tapered surface ti is inclined from the upper surface u1 to the upper end of the second lateral surface v1. By providing the tapered surface ti, it is possible to reduce, when forming a loop of a wire, contact of the loop of the wire with the resin portion 42C.

As illustrated in FIG. 2H, each of the resin portions 42D includes the first lateral surface s2 of the first recessed portion 21 and an upper surface u2. The upper surface u2 of each resin portion 42D is connected to a step surface positioned between the first lateral surface s1 and the upper surface u1 of each resin portion 42C and provides the same effect as the step surface of each resin portion 42C. Each resin portion 42D may be connected to the resin portion 42A. For example, each resin portion 42D may be a stepped portion protruding inward from a part of the lateral surface of the resin portion 42A.

The first dark-colored resin member 40 has a shape with which the first dark-colored resin member 40 can hold at least a part of the plurality of leads 11*a* to 13*b*, and the shape is not limited to that illustrated in the drawings. Preferably, the first dark-colored resin member 40 integrally fixes a plurality of leads (here, three pairs of leads). With each lead firmly fixed by the first dark-colored resin member 40, vibration of the leads can be reduced when the mold resin portion 60 is formed by a transfer molding method.

As a material of the first dark-colored resin member 40, a material having a small coefficient of thermal expansion and an excellent adhesion performance with the mold resin portion 60 may be selected. The coefficient of thermal expansion of the first dark-colored resin member 40 may be substantially equal to the coefficient of thermal expansion of the mold resin portion 60 or, taking into account an influence of heat from the light-emitting elements 50, may be smaller than the coefficient of thermal expansion of the mold resin portion 60.

The first dark-colored resin member 40 can be formed by using a thermoplastic resin, for example. As the thermoplastic resin, a thermoplastic resin, such as an aromatic polyamide resin, a polyphthalamide resin (PPA), a sulfone resin, a polyamide-imide resin (PAI), a polyketone resin (PK), a polycarbonate resin, polyphenylene sulfide (PPS), a liquid crystal polymer (LCP), an ABS resin, and a PBT resin, can be used. Note that a thermoplastic resin containing glass fibers may also be used as a thermoplastic material. In this manner, by adding the glass fibers to the thermoplastic resin, it is possible to form a resin package having a high rigidity and a high strength. Note that, in this description, the "thermoplastic resin" refers to a material having a linear polymer structure that softens and then becomes liquid when heated and that solidifies when cooled. Examples of such a thermoplastic resin include styrene-based, acrylic-based, cellulose-based, polyethylene-based, vinyl-based, polyamide-based, and fluorocarbon-based resins.

Alternatively, the first dark-colored resin member 40 may be formed by using a thermosetting resin such as a silicone resin or an epoxy resin, for example.

A colorant that colors the first dark-colored resin member 40 to a dark color may be added to the resin material of the first dark-colored resin member 40. Various dyes and pigments are suitably used as the colorant. Specific examples include $Cr_2O_3$, $MnO_2$, $Fe_2O_3$, and carbon black. An amount of the colorant to be added may be, for example, in a range from 0.3% to 3.0%, and preferably in a range from 1.0% to 2.0% with respect to the resin material that forms the base material. As an example, as the thermoplastic resin material, a thermoplastic resin material in which a small amount of dark-colored particles such as carbon particles is added to the polyphthalamide (PPA) may be used.

Leads

Each of the leads is conductive and functions as an electrode for supplying power to the corresponding light-emitting element 50.

As illustrated in FIG. 2F, the present embodiment includes six leads 11*a* to 13*b*. The lead 11*a* and the lead 11*b* constitute a first lead pair, the lead 12*a* and the lead 12*b* constitute a second lead pair, and the lead 13*a* and the lead 13*b* constitute a third lead pair.

In a configuration exemplified in FIG. 2G, each of the leads 11*a* and 11*b* constituting the first lead pair is bent so as to include a portion 91 positioned proximate to the primary surface 100*a* of the resin package 100, a portion 92 positioned proximate to the back surface 100*b* of the resin package 100, and a portion 93 positioned between these portions 91 and 92 and extending along the outer side portion 100*c* of the resin package 100. At least a part of the portion 92 of each of the leads 11*a* and 11*b* is exposed at the back surface 100*b* of the resin package 100 and forms the mounting surface used when fixing the light-emitting device 1000 to the mounting substrate. The mounting surfaces of the leads 11*a* and 11*b* may be flush with a lowermost surface of the first dark-colored resin member 40. The second lead pair and the third lead pair also have structures similar to that of the first lead pair.

In the example illustrated in FIG. 2F, in the primary surface 100*a* of the resin package 100, the first lead pair, the second lead pair, and the third lead pair are arrayed in the y-axis direction, for example. In the primary surface 100*a*, end portions of the two leads constituting each of the lead pairs are spaced apart from each other and disposed facing each other.

Each of the one leads 11*a*, 12*a*, and 13*a* of the first lead pair, the second lead pair, and the third lead pair, respectively, includes the exposed region 30*a* at the inner upper surface 21*a* of the first recessed portion 21. Each exposed region 30*a* includes an element placement region in which the corresponding light-emitting element 50 is disposed. Further, each of the leads 11*a*, 12*a*, and 13*a* includes the exposed region 30*b*, which is to become the connection region wr, at the inner upper surface 22*a* of the second recessed portion 22. The connection region wr is a region in which the corresponding light-emitting element is electrically connected to positive and negative electrodes by the wire. Each of the other leads 11*b*, 12*b*, and 13*b* of the first lead pair, the second lead pair, and the third lead pair, respectively, includes the exposed region 30, which is to become the connection region wr, at the inner upper surface 23*a* of the second recessed portion 23.

The leads 11*a* to 13*b* may be composed of a base material and a metal layer covering a surface of the base material. Examples of the base material include metals such as copper, aluminum, gold, silver, iron, nickel, alloys thereof, phosphor bronze, or ferrous copper. These base materials may have a single-layer structure or a layered structure (a clad material, for example). Copper may be used for the base material. The metal layer is, for example, the plating layer. Examples of the metal layer include silver, aluminum, nickel, palladium, rhodium, gold, copper, or alloys thereof. With the leads 11*a* to 13*b* including such a metal layer, light reflectivity and/or bonding properties with metal wires (described below) and the like of the leads 11*a* to 13*b* can be improved. For example, a lead including a silver-plated layer on a surface of a copper alloy that serves as the base material may be used.

An arrangement, a shape, a quantity, and the like of the leads used in the light-emitting device 1000 are not limited to the illustrated example. Although six leads are used in the illustrated example, in a case in which two or more light-emitting elements 50 among the first light-emitting element 51 to the third light-emitting element 53 are connected to a common lead, the number of leads may be less than six. For example, one common lead may be provided in place of the leads 11*b* to 13*b* described above.

Light-Emitting Element 50

The light-emitting element 50 is a semiconductor light-emitting element such as a semiconductor laser or a light-emitting diode. An emission wavelength of each of the light-emitting elements 50 can be selected as desired.

A shape of each light-emitting element 50 in a plan view is, for example, rectangular. A size of each light-emitting element 50 is not particularly limited. Vertical and horizontal lengths of each light-emitting element 50 are, for example, in a range from 100 μm to 1000 μm. For example, each light-emitting element 50 has a square shape with one side being 320 m in a plan view.

In the present embodiment, the plurality of light-emitting elements 50 include the first light-emitting element 51 that emits first light, the second light-emitting element 52 that emits second light having a wavelength shorter than that of the first light, and the third light-emitting element 53 that emits third light having a wavelength shorter than that of the second light. The emission wavelength of each of the light-emitting elements 50 may be selected so as to obtain white light or mixed-color light of a light bulb color when the plurality of light-emitting elements 50 are illuminated. For example, the first light-emitting element 51 may be a red light-emitting element that emits red light, the second light-emitting element 52 may be a green light-emitting element that emits green light, and the third light-emitting element 53 may be a blue light-emitting element that emits blue light. The combination of the number of light-emitting elements and the emitted light colors is merely an example and is not limited to this example. The three light-emitting elements 50 may emit light having the same wavelength.

As the blue and green light-emitting elements, light-emitting elements using ZnSe or a nitride-based semiconductor ($In_XAl_YGa_{1-X-Y}N$, 0≤X, 0≤Y, X+Y≤1) can be used. For example, a light-emitting element in which a semiconductor layer including GaN is formed on a support substrate such as sapphire may be used. As the red light-emitting element, a GaAs-based, AlInGaP-based, or AlGaAs-based semiconductor or the like can be used. For example, a light-emitting element in which a semiconductor layer including AlInGaP is formed on a support substrate such as silicon, aluminum nitride, or sapphire may be used. Furthermore, a semiconductor light-emitting element made from materials other than above can be used. The composition, emitted light color, size, number, and the like of the light-emitting element can be selected as appropriate in accordance with an intended purpose.

Further, by disposing phosphor, which performs wavelength conversion of light emitted from a semiconductor chip, around the semiconductor chip composed of a nitride-based semiconductor or the like, any desired light emission can be obtained. In this description, the "light-emitting element 50" includes not only the semiconductor chip composed of the nitride-based semiconductor or the like, but also an element composed of the semiconductor chip and the phosphor. Specific examples of the phosphor include yttrium-aluminum-garnet activated by cerium, lutetium-aluminum-garnet activated by cerium, nitrogen containing calcium aluminosilicate activated by europium and/or chromium (part of the calcium can be substituted with strontium), sialon activated by europium, silicate activated by europium, strontium aluminate activated by europium, and potassium fluorosilicate activated by manganese. As an example, the first light-emitting element 51, the second light-emitting element 52, and the third light-emitting element 53 may each include a semiconductor chip that emits blue light. In this case, by disposing the phosphor around the semiconductor chip in each of at least two of those light-emitting elements, the emitted light colors of the first light-emitting element 51, the second light-emitting element 52, and the third light-emitting element 53 can be caused to be different from each other.

Each of the first light-emitting element 51, the second light-emitting element 52, and the third light-emitting element 53 can be bonded, using a bonding member such as a resin, solder, or a conductive paste, to the exposed region 30 of any of the plurality of leads 11*a* to 13*b*.

The first light-emitting element 51 to the third light-emitting element 53 may be disposed in the exposed regions 30*a* of three different leads (here, leads 11*a*, 12*a*, and 13*a*). With this structure, heat dissipation paths of the first light-emitting element 51, the second light-emitting element 52, and the third light-emitting element 53 can be separated from each other, and thus heat generated by each of the light-emitting elements 50 can be efficiently dissipated.

As illustrated in FIG. 2D, positive and negative electrodes of the first light-emitting element 51 are respectively electrically connected to the lead 11*a* and the lead 11*b* of the first lead pair by a pair of wires 81 composed of wires 81*a* and 81*b*. Further, one end of the wire 81*a* is connected to a part (connection region wr) of the exposed region 30*a* of the lead 11*a*, and the other end of the wire 81*a* is connected to one of the positive and negative electrodes of the first light-emitting element 51. Further, one end of the wire 81*b* is connected to a part (connection region wr) of the exposed region 30*b* of the lead 11*b*, and the other end of the wire 81*b* is connected to the other of the positive and negative electrodes of the first light-emitting element 51. Similarly, as illustrated in FIG. 2C, positive and negative electrodes of the second light-emitting element 52 and the third light-emitting element 53 are respectively electrically connected to the leads of the second lead pair and the third lead pair by a pair of wires 82, 83.

As the wires 81 to 83, metal wires made of gold, silver, copper, platinum, aluminum, or alloys thereof can be used. Among these, it is preferable to use a gold wire having excellent ductility, or a gold-silver alloy wire having a higher reflectivity than that of the gold wire.

In the configuration illustrated in FIG. 2C, in a lateral side view from the y-axis direction, the first light-emitting element 51 to the third light-emitting element 53 overlap each other. Note that the arrangement of the first light-emitting element 51 to the third light-emitting element 53 is not limited to the illustrated example. For example, in a plan view, one light-emitting element positioned at a center in the y-axis direction may be disposed shifted from a line connecting centers of the other two light-emitting elements. In such a configuration, in a lateral side view from the y-axis direction, only two light-emitting elements of the three light-emitting elements may overlap each other.

Reflective Member 150

In the present embodiment, the reflective member 150 may surround each of the light-emitting elements 50 in a plan view. The reflective member 150 reflects light emitted from a lateral surface of each of the light-emitting elements 50 and guides the light to above the light-emitting elements 50. With this structure, the use efficiency of the light emitted from the light-emitting elements 50 can be improved.

In this description, "the reflective member 150 surrounding the light-emitting element 50" includes a case in which the reflective member 150 is positioned close to the lateral surface of the light-emitting element 50 in a plan view. The reflective member 150 may be in direct contact or may not be in contact with the lateral surface of the light-emitting element 50. Preferably, the reflective member 150 is in contact with the lateral surface of the light-emitting element 50. More preferably, the reflective member 150 surrounds the lateral surface of the light-emitting element 50 in a plan view. The reflective member 150 is preferably provided in contact with all lateral surfaces of the light-emitting element 50. This makes it possible to more effectively reduce leakage, in the x directions and the ±y directions, of the light emitted from the light-emitting element 50.

Note that the reflective member 150 is disposed in close proximity to the lateral surface of the light-emitting element 50 and may not be disposed over the entire inner upper surface 21*a* of the first recessed portion 21. For example, each of the light-emitting elements 50 whose lateral surface covered with the reflective member 150 may be prepared, and the light-emitting elements 50 may then be disposed on the inner upper surface 21*a* (refer to FIG. 10C). With this structure, an area of a region of the inner upper surface 21*a* of the first recessed portion 21 in which the reflective member 150 is disposed can be made smaller. By making the area of the region in which the reflective member 150 is disposed smaller, it is possible to reduce the stress on the light-emitting elements 50 that occurs during the manufacturing step, and thus reduce lifting of the light-emitting elements 50 from the leads 11.

As illustrated in FIGS. 2C to 2E, the light-emitting device 1000 according to the present embodiment includes, on the primary surface 100*a* of the resin package 100, a first reflective member 151 surrounding the first light-emitting element 51, a second reflective member 152 surrounding the second light-emitting element 52, and a third reflective member 153 surrounding the third light-emitting element 53, in a plan view.

With the first reflective member 151 to the third reflective member 153 disposed, it is possible to reflect light from the lateral surface of each of the light-emitting elements 50 toward the light-emitting element 50 and emit the light beams from upper surfaces of the light-emitting elements 50 in the frontward direction (+z direction) of the light-emitting device 1000. Accordingly, it is possible to reduce the size of light source surface (creating a point light source) from which light from each of the first light-emitting element 51 to the third light-emitting element 53 is emitted, in a top view. Creating the point light source refers to light being emitted from the lateral surface of the light-emitting element 50 at 10% or less. Thus, by making the light-emitting elements 50 into point light sources, it is possible to reduce sizes of the planar shapes of the corresponding lens portions 70. Accordingly, by reducing the size of the lens portion 70, it is possible to reduce a size of the light-emitting device 1000. With an emission direction of the light from each of the light-emitting elements 50 being controlled within a desired range, it is possible to reduce light loss caused by total reflection on inner surfaces of the corresponding lens portions 70. The inner surface of the lens portion 70 is a surface on which the light emitted from the light-emitting element 50 hits from an inner side. The inner surface of the lens portion 70 may be referred to as an outer surface of the light-emitting device 1000. Accordingly, light extraction of the light-emitting device 1000 can be maintained, and light can be extracted with high efficiency in the frontward direction. The mold resin portion 60 includes an inner surface and an outer surface. The outer surface of the mold resin portion 60 is a surface of an exposed side (outer side) of the light-emitting device 1000. The inner surface of the mold resin portion 60 is a surface facing the light-emitting elements 50 (inner side). The inner surface of the lens portion 70 is the surface of an inner side of the lens portion 70.

In the present embodiment, the first reflective member 151 to the third reflective member 153 are positioned in the one first recessed portion 21 of the resin package 100. With this structure, the inner lateral surface 21*c* of the first recessed portion 21 can be utilized to control the positions of the first reflective member 151 to the third reflective member 153, and thus the reflective member 150 can surround the first light-emitting element 51 to the third light-emitting element 53. The reflective member 150 is preferably not formed in a region other than the first recessed portion 21 of the primary surface 100*a*.

As illustrated in FIG. 2C, in the first recessed portion 21, the first reflective member 151, the second reflective member 152, and the third reflective member 153 may be connected to each other. Note that these reflective members 151 to 153 may be disposed separated from each other.

The first reflective member 151 to the third reflective member 153 can also be respectively disposed between the exposed regions 30*a* of the leads and lower surfaces of the first light-emitting element 51 to the third light-emitting element 53. For example, a reflective member (a resin including a light reflective material, for example) may be applied in advance in the first recessed portion 21, and the first light-emitting element 51 to the third light-emitting element 53 may then be disposed thereon. This makes it possible to more effectively reduce leakage, in the −z direction, of the light emitted from each of the first light-emitting element 51 to the third light-emitting element 53. Further, a die bond resin is not required to bond the first light-emitting element 51 to the third light-emitting element 53 to the primary surface 100*a*.

For example, the reflective member 150 is a reflective resin. The reflective resin includes a resin serving as a base material and a light reflective material dispersed in the resin. As the base material, a light-transmissive material such as an epoxy resin, a silicone resin, an epoxy-modified silicone resin, a resin obtained by mixing them, glass, or the like can be used. From the perspective of light resistance and ease of formation, a silicone resin is preferably selected as the base material.

As the light reflective material, titanium oxide, silicon oxide, zirconium oxide, yttrium oxide, yttria-stabilized zirconia, potassium titanate, aluminum oxide, aluminum nitride, boron nitride, mullite, and the like can be used. In the present embodiment, for example, titanium oxide is used. A concentration of the light reflective material in the reflective member 150 is preferably in a range from 10 wt. % to 80 wt. %. The reflective member 150 preferably includes titanium oxide as the light reflective material. Further, the reflective member 150 may include a glass filler or the like in order to reduce expansion and contraction caused by heat of the resin of the base material. A concentration of the glass filler is preferably greater than 0 wt. % and less than 40 wt. %. Note that the concentrations of the light reflective material, the glass filler, and the like are not limited thereto.

The reflective member 150 is a member that reflects the light emitted from the light-emitting element 50. The reflective member 150 is preferably formed of a material having a reflectance of 80% or greater with respect to the light emitted from the light-emitting element 50. Note that the reflective member 150 may be a member that blocks the light emitted from the light-emitting element 50. For example, as the reflective member 150, a single layer film or multilayer film made of a metal, or a multilayer film (dielectric multilayer film) formed by layering a plurality of dielectrics of two or more types can be used. As the dielectric multilayer film, a distributed Bragg reflector (DBR) film, for example, may be used.

Light-Transmissive Resin Member 180

As illustrated in FIGS. 2D and 2E, the light-emitting device 1000 may further include the light-transmissive resin member 180 having light transmissivity, between the reflective member 150 as well as the light-emitting elements 50 and the mold resin portion 60. As the material of the light-transmissive resin member 180, a material similar to that of the mold resin portion 60, such as an epoxy resin, a urea resin, or a silicone resin, can be used. In particular, preferably an epoxy resin is used for the mold resin portion 60, and a silicone resin is used for the light-transmissive resin member 180. This makes it possible to improve heat resistance, light resistance, strength, and the like. Further, a phenyl silicone resin can be used for the mold resin portion 60, and a dimethyl silicone resin can be used for the light-transmissive resin member 180. This makes it possible to further improve heat resistance, light resistance, and the like.

In the illustrated example, the light-transmissive resin member 180 is disposed in a region surrounded by the resin portion 42A, which has the highest height within the second resin portion 42 in the +z direction. With this structure, the upper surface of the resin portion 42A can be utilized to form the light-transmissive resin member 180 having a constant thickness in the entire region surrounded by the resin portion 42A. The light-transmissive resin member 180 may cover the light-emitting elements 50, the reflective member 150, and the resin portions 42C. The light-transmissive resin member 180 preferably has a thickness in a range from 40 μm to 180 μm from the upper surfaces of the light-emitting elements 50. More preferably, the thickness is in a range from 50 μm to 140 μm. Even more preferably, the thickness is in a range from 60 μm to 100 μm.

The light-transmissive resin member 180 can cover the reflective member 150 and the light-emitting elements 50, for example. For example, the light-transmissive resin member 180 may be disposed in a region surrounded by the resin portions 42C and the resin portions 42D. In this case, the light-transmissive resin member 180 may be disposed by utilizing the stepped portions positioned between the first lateral surfaces s1 and the upper surfaces u1 of the pair of resin portions 42C in a cross-sectional view. For example, the light-transmissive resin member 180 may cover the above stepped portions and not cover the upper surfaces u1. An interface between the light-transmissive resin member 180 and the mold resin portion 60 can be a surface (incident surface) on which light beams emitted from the light-emitting elements 50 is incident. As the light-transmissive resin member 180, a resin (silicone resin, epoxy resin, or epoxy-modified silicone resin, for example) having excellent thermal resistance and weather resistance can be used.

Mold Resin Portion 60

The mold resin portion 60 includes the base portion 61 and the plurality of lens portions 70. The base portion 61 and the lens portions 70 are integrally formed.

Base Portion 61

As illustrated in FIGS. 2A to 2E, the base portion 61 of the mold resin portion 60 covers the primary surface 100*a* of the resin package 100 and the plurality of light-emitting elements 50. The base portion 61 serves to seal the light-emitting elements 50, and to hold the lens portions 70 integrally formed with the base portion 61 in predetermined positions.

In the present embodiment, the base portion 61 includes, for example, the upper surface 61*a* positioned above the primary surface 100*a* of the resin package 100. The upper surface 61*a* may be one size larger than the primary surface 100*a* of the resin package 100.

In a lateral side view, the base portion 61 includes the lateral surface portion 61*b* extending from the upper surface 61*a* of the base portion 61 in a back surface direction of the resin package 100. The lateral surface portion 61*b* covers at least a part of the outer side portion 100*c* of the resin package 100.

The lateral surface portion 61*b* preferably covers only a part of the outer side portion 100*c* of the resin package 100. That is, a part of the outer side portion 100*c* of the resin package 100 is preferably exposed from the lateral surface portion 61*b* of the base portion 61. As illustrated, the outer side portion 100*c* of the resin package 100 may be exposed from the lateral surface portion 61*b* of the base portion 61 at a part closer to the back surface 100*b* than the first step surface st1, for example.

A lowermost end of the base portion 61 positioned furthest in the −z direction is preferably positioned above portions of the outer side portion 100*c* where the leads 11*a* to 13*b* are exposed and is preferably designed so that the mold resin portion 60 and the leads 11*a* to 13*b* do not come into direct contact with each other. With this structure, a part of the mold resin portion 60 does not partially cover the mounting surfaces of the leads 11*a* to 13*b*. Therefore, a decrease in the areas of the mounting surfaces by the mold resin portion 60 can be reduced.

In the present embodiment, in a cross-sectional view, the first light-emitting element 51 is preferably positioned closer to the back surface 100*b* (−z side) of the resin package 100 than the first point P and is preferably positioned above the second point Q (+z side). In the z-axis direction, the first light-emitting element 51 may be positioned between the first point P and the second point Q. With this structure, a distance between the first light-emitting element 51 and the first lens portion 71 in the z-axis direction can be reduced. Similarly, in a cross-sectional view, each of the second light-emitting element 52 and the third light-emitting element 53 may be positioned closer to the back surface 100*b* of the resin package 100 than the first point P and may be positioned above the second point Q.

In the cross-sectional views illustrated in FIGS. 2D and 2E, a portion of the lateral surface portion 61*b* of the base portion 61 from the first point P to the second point Q does not include a bend portion. Not including the bend portion means that the portion from the first point P to the second point Q does not include a bent shape in a cross-sectional view. The portion of the lateral surface portion 61*b* from the first point P to the second point Q may be an inclined surface inclined relative to the back surface 100*b* (here, parallel to the xy plane). An angle formed by the inclined surface and the xy plane may be, for example, in a range from 5° to 45°. This makes it easier to demold the mold resin portion 60 from a casting case 120 in a curing step described below. As illustrated, in a cross-sectional view, the portion of the lateral surface portion 61*b* of the base portion 61 between the first point P and the second point Q may have a linear shape (that is, may be a line segment connecting the first point P and the second point Q). In a cross-sectional view, the second point Q may be positioned outward of the first point P. In a cross-sectional view, the third point R may be positioned inward of the first point P.

Further, by disposing the first light-emitting element 51 to the third light-emitting element 53 above the second point Q, it is possible to sufficiently separate the first light-emitting element 51 to the third light-emitting element 53 from the interface portion 1000*u* between the mold resin portion 60 and the resin package 100.

In a cross-sectional view, the second point Q is preferably positioned closer to the back surface 100*b* of the resin package 100 than the inner upper surface 21*a* of the first recessed portion 21. In the z-axis direction, the second point Q may be positioned between the inner upper surface 21*a* of the first recessed portion 21 and the back surface 100*b* of the resin package 100. This makes it possible to sufficiently separate the first light-emitting element 51 to the third light-emitting element 53 from the interface portion 1000*u* between the mold resin portion 60 and the resin package 100.

In a cross-sectional view, a portion of the lateral surface portion 61*b* of the base portion 61 from the second point Q to the third point R is preferably curved in a recessed shape. In the example illustrated in FIGS. 2D and 2E, in a cross-sectional view, a portion (hereinafter referred to as “first portion”) S of an outer lateral surface of the lateral surface portion 61*b* positioned between the second point Q and the third point R is entirely curved into a protruding shape toward the outer side portion 100*c* of the resin package 100 (a recessed shape toward the outside). With the first portion S of the outer lateral surface including the curved portion, the rise of the waterproof resin to be disposed on the lateral surface of the light-emitting device 1000 from the back surface 100*b* of the resin package 100 to the upper surface 61*a* of the base portion 61 can be more effectively reduced. Further, with the first portion S being curved, a length of the first portion S in a cross-sectional view can be increased, making it possible to increase an adhesion area between the first portion S and the waterproof resin and to improve the adhesion between the waterproof resin and the mold resin portion 60. Furthermore, if the first portion S is a curved surface, the waterproof resin is readily kept thereon. For example, in a cross-sectional view, an uppermost end of a portion of an outer lateral surface of the mold resin portion 60 that comes into contact with the waterproof resin may be the second point Q (refer to FIG. 3B) or may be any point on the first portion S of the outer lateral surface.

By increasing the length of the first portion S in a cross-sectional view, it is possible to further improve a waterproof performance. The reason is as follows. When moisture penetrates from an uppermost end of a contact portion between the lateral surface of the light-emitting device 1000 and the waterproof resin, the penetrated moisture flows downward (−z direction) between first portion S of the outer lateral surface of the mold resin portion 60 and the waterproof resin. When a part of this moisture reaches the interface portion 1000*u* between the mold resin portion 60 and the resin package 100 (FIG. 2A and the like), the moisture may penetrate an interior of the light-emitting device 1000 from the interface portion 1000*u*, causing deterioration of the characteristics of the light-emitting device 1000. In response, increasing the length of the first portion S in a cross-sectional view can lengthen a path to the interface portion 1000*u* by the moisture penetrating from the uppermost end of the contact portion between the waterproof resin and the lateral surface of the light-emitting device 1000, and thus can more effectively reduce moisture penetration.

In the present embodiment, a height Hr of the third point R is preferably less than ½ of the height Ha of the primary surface 100*a* of the resin package 100. The height Hr of the third point R is the shortest distance between the third point R and the back surface 100*b* in the z-axis direction. With this structure, the interface portion 1000*u* that is to be the moisture penetration area can be disposed lower (−z side) in the light-emitting device 1000, making it possible to further improve the waterproof performance of the light-emitting device 1000.

With reference to FIG. 2D, the length of the first portion S in a cross-sectional view can be adjusted by, for example, the height Hq of the second point Q, the height Hr of the third point R, and a distance (shortest distance) Hx between the second point Q and the third point R in the x-axis direction. As an example, a ratio Hr/Hq of the height Hr of the third point R to the height Hq of the second point Q is set to 0.8 or less, preferably 0.7 or less, thereby enabling securement of the length of the first portion S. Note that, in order to prevent contact between the mold resin portion 60 and the leads, the ratio Hr/Hq can be set to 0.2 or greater, preferably 0.4 or greater.

The distance Hx between the second point Q and the third point R in the x-axis direction is not particularly limited, but may be, for example, 0.05 mm or greater, preferably 0.1 mm or greater. This makes it possible to more effectively reduce the rise of the waterproof resin to above the first portion S. Further, by lengthening the distance Hx, it is possible to increase the length of the first portion S in a cross-sectional view. On the other hand, from the viewpoint of miniaturization of the light-emitting device 1000, the distance Hx may be, for example, 0.5 mm or less, preferably 0.3 mm or less.

With such a configuration, the rise of the waterproof resin disposed on the lateral surface of the light-emitting device 1000 can be more effectively reduced. As described below, the lateral surface portion 61*b* having the cross-sectional shape described above can be easily formed by utilizing the rise of the resin material when forming the mold resin portion.

In a cross-sectional view, the second point Q of the mold resin portion 60 is preferably positioned above (+z side) the first step surface st1 of the resin package 100 and is preferably positioned below (−z side) the primary surface 100*a*. This makes it possible to reduce the contact of the lowermost end of the mold resin portion 60 with the leads 11*a* to 13*b*. With this structure, when the light-emitting device 1000 is mounted, it is possible to ensure the mounting surfaces of the leads 11*a* to 13*b* with respect to the mounting substrate.

As illustrated in FIG. 2D, the distance (height of the second point Q) Hq from the back surface 100*b* of the resin package 100 to the second point Q of the mold resin portion 60 is in a range from 0.6 mm to 1.9 mm, more preferably in a range from 0.7 mm to 1.4 mm, and even more preferably in a range from 0.75 mm to 1.1 mm. If the height Hq of the second point Q is 0.6 mm or greater, a distance between a lead mounting surface of the back surface 100*b* of the resin package 100 and a point at which the resin material to be the mold resin portion 60 starts to rise in the −z direction can be increased in the immersion step when forming the mold resin portion 60 by a casting method. Therefore, a part of the resin material reaching the lead mounting surface can be reduced, making it possible to increase a reliability of the light-emitting device 1000. On the other hand, when the height Hq of the second point Q is 1.9 mm or less, the resin package 100 can be fixed more firmly by the mold resin portion 60.

As illustrated in FIG. 2D, in a cross-sectional view, the width Wq, which is the distance from the second point Q of the base portion 61 to the outer side portion 100*c* of the resin package 100 in a direction along a plane (xy plane) parallel to the primary surface 100*a*, is in a range from 0.2 mm to 0.6 mm, more preferably in a range from 0.4 mm to 0.5 mm. Further, for example, a ratio of the width Wq to a maximum width W1 at the first surface p1 of the resin package 100 in a direction parallel to the primary surface 100*a* is in a range from 0.1 to 0.5. In the illustrated example, the resin package 100 has a shape that increases in width in a direction parallel to the primary surface 100*a*, from the primary surface 100*a* toward the back surface 100*b*.

If the ratio Wq/W1 is 0.1 or greater, a distance between the resin package 100 positioned in the casting case and an inner wall of the casting case can be sufficiently ensured when the mold resin portion 60 is formed by a casting method. Accordingly, voids in the resin material injected into the casting case can readily escape to the outside through a gap between the casting case and the side portion of the resin package 100.

If the gap between the resin package 100 and the inner wall of the casting case is too small, a maximum amount of resin material that can rise to the outer side portion 100*c* of the resin package 100 when the resin package 100 is immersed in the casting case, that is, the maximum amount of the resin material that rises from the gap but does not reach the leads, is reduced. Accordingly, it may no longer be possible to dispose enough resin material on the outer side portions 100*c* of the resin package 100, or the amount of the resin material may be greater than a predetermined range, making it difficult to reduce the rise of the resin material at the first step surface st1. Note that, even in such a case, for example, as long as the width of the first step surface st1 is increased, the base portion 61 having a desired shape can be formed. In contrast, if the size of W1 is fixed and Wq/W1 is 0.1 or greater, the gap between the resin package 100 and the inner wall of the casting case increases. Therefore, a range of the rise amount of the resin material that can achieve the desired shape also increases. Accordingly, the base portion 61 having a desired shape can be formed. Further, the amount of the resin material is easily adjusted, making it possible to increase a degree of freedom of design of the first step surface st1 that can control the shape of the mold resin portion 60. The width Wq is preferably designed to be, for example, 0.4 mm or greater. On the other hand, when the size of W1 is fixed and Wq/W1 is 0.5 or less, the size of the light-emitting device 1000 can be suppressed to a smaller size.

Lens Portion 70

The lens portion 70 has a light distribution function of controlling a direction and a distribution of the light to be emitted.

In the present embodiment, each of the plurality of lens portions 70 has a convex shape protruding upwardly from the upper surface 61*a* of the base portion 61. The planar shape of each lens portion 70 is, for example, elliptical or circular. In the illustrated example, the planar shape of each lens portion 70 is elliptical, with a major axis of the elliptical shape extending in the x-axis direction and a minor axis of the elliptical shape extending in the y-axis direction. Thus, a light distribution that is wide in the x-axis direction and narrow in the y-axis direction can be obtained. The light-emitting device 1000 having such a light distribution can be particularly suitably used in a display device such as an LED display. Note that, in a lateral side view as viewed in the x-axis direction or the y-axis direction, an outer edge of the lens portion 70 may have a linear portion in addition to a curved portion such as an elliptical arc shape or an arc shape. The linear portion may be positioned between the curved portion and the upper surface 61*a* of the base portion 61. For example, the lens portion 70 may have a shape in which a part of a sphere (hemisphere, for example) is disposed on a circular truncated cone, or a shape in which a part of an ellipsoid is disposed on an elliptical truncated cone.

Each of the plurality of lens portions 70 is disposed correspondingly to one of the light-emitting elements 50 in a one-to-one relationship. An optical axis of each lens portion 70 may coincide with a center of the corresponding light-emitting element 50 (center of the light-emitting surface). With this structure, controllability of the light distribution of the light-emitting device 1000 can be further improved.

Note that the shape and arrangement of each of the lens portions 70 in a plan view can be selected as appropriate taking into account light distribution performance, light collection performance, and the like. Further, the cross-sectional shape of the lens portion is not limited to a convex shape. The lens portion may be, for example, concave or a Fresnel lens.

In the present embodiment, the first light emitted from the first light-emitting element 51 is transmitted through the first lens portion 71 and exits from an emission surface of the light-emitting device 1000. The direction of emission and the distribution of the first light are controlled by the first lens portion 71. Similarly, the second light emitted from the second light-emitting element 52 is transmitted through the second lens portion 72, and the third light emitted from the third light-emitting element 53 is transmitted through the third lens portion 73. The second lens portion 72 and the third lens portion 73 control the light distribution of the second light and the third light, respectively.

When the first light-emitting element 51, the second light-emitting element 52, and the third light-emitting element 53 are illuminated, mixed light of the light beams transmitted through the first lens portion 71, the second lens portion 72, and the third lens portion 73 is, for example, white.

In the example illustrated in FIG. 2C, in a plan view, the first lens portion 71, the second lens portion 72, and the third lens portion 73 are arrayed in the y-axis direction. In a plan view, centers of the first lens portion 71 to the third lens portion 73 may be positioned in a straight line parallel to the y-axis. Note that the arrangement of the lens portions 70 is not limited to this example. For example, the center of the lens portion among the first lens portion 71, the second lens portion 72, and the third lens portion 73 that is positioned centrally in the x-axis direction or the y-axis direction may not be positioned on a line connecting the centers of the other two lens portions.

Material of Mold Resin Portion 60

The mold resin portion 60 includes a base material having light transmissivity. The mold resin portion 60 preferably has a light transmittance of 90% or greater at respective peak wavelengths of the plurality of light-emitting elements 50. With this structure, the light extraction efficiency of the light-emitting device 1000 can be further improved.

As the base material of the mold resin portion 60, a thermosetting resin such as an epoxy resin, a urea resin, a silicone resin, or a modified silicone resin such as an epoxy-modified silicone resin, glass, or the like having excellent weather resistance and light transmissivity is suitably used.

The mold resin portion 60 according to the present embodiment can also contain a light-diffusing material in order to improve a uniformity of the quality of the light of the light-emitting device 1000. With the mold resin portion 60 containing the light-diffusing material, the light emitted from the light-emitting element 50 can be diffused to suppress unevenness in light intensity. As such a light-diffusing material, an inorganic material such as barium oxide, barium titanate, silicon oxide, titanium oxide, and aluminum oxide, or an organic material such as a melamine resin, a CTU guanamine resin, and a benzoguanamine resin is suitably used.

The mold resin portion 60 may contain various fillers. Although a specific material of the filler is similar to the light-diffusing material, the central particle size ($D_{50}$) differs from that of the light-diffusing material. In this description, "filler" refers to a filler having a central particle size in a range from 100 nm to 100 μm. When the filler having such a particle size is contained in a light-transmissive resin, chromaticity variation of the light-emitting device 1000 can be improved by a light-scattering effect, and further heat shock resistance of the light-transmissive resin can be enhanced and internal stress of the resin can be alleviated.

A surface roughness of the base portion 61 is not particularly limited, but from the perspective of improving the display contrast, the surface roughness is preferably large. A part or all of the surface of the base portion 61 may be roughened, for example. Of the upper surface 61*a* of the base portion 61, at least the portion that does not overlap the plurality of lens portions 70 in a plan view is preferably roughened. An outer surface of the lateral surface portion 61*b* of the base portion 61 may also be roughened. A surface roughness of the upper surface 61*a* and a surface roughness of the outer surface of the lateral surface portion 61*b* may be the same or may be different. From the perspective of ease of processing, the surface roughness of the upper surface 61*a* and the surface roughness of the outer surface of the lateral surface portion 61*b* are preferably the same. With the surface roughness of the base portion 61 being large, external light such as sunlight can be scattered on the surface of the base portion 61, and thus the reflection intensity can be reduced. With this structure, deterioration in contrast due to external light reflection can be reduced.

The surface roughness of the portion, of the upper surface 61*a* of the base portion 61, that does not overlap the plurality of lens portions 70 in a plan view may be greater than the surface roughness of the lens portion 70, for example. Such a structure is obtained by, for example, forming the mold resin portion 60 including the base portion 61 and the lens portions 70, and subsequently performing roughening processing such as blasting on a predetermined region of the surface of the base portion 61. Alternatively, a casting case (refer to FIG. 4) whose inner surface is partially roughened may be used for forming the mold resin portion 60. As will be described in detail below, for example, by roughening, in advance, a portion of the inner surface of the casting case that forms the upper surface 61*a* of the base portion 61, the surface roughness of a portion of the upper surface 61*a* of the base portion 61 that does not overlap the plurality of lens portions 70 in a plan view can be increased.

An arithmetic mean roughness Ra of the upper surface 61*a* of the base portion 61 is preferably in a range from 0.4 μm to 5 μm. More preferably, Ra is in a range from 0.8 μm to 3 μm. Ra of an outer surface of the lateral surface portion 61*b* of the base portion 61 may also be in the same range as described above. Ra can be measured in accordance with the method for measuring the surface roughness stipulated in JIS B 0601-2001. Specifically, Ra is expressed by the following equation, when a portion of a measurement length L is extracted from a roughness curve in the direction of the center line thereof, the center line of the extracted portion is the x-axis, a direction of the longitudinal magnification is the y-axis, and the roughness curve is y=f(x).

$$Ra = \frac{1}{L}\int_{O}^{L} |f(x)|dx$$

A contact type surface roughness measuring machine, a laser microscope, or the like can be used for measuring Ra. In this description, the laser microscope VK-250 available from Keyence is used.

The base portion 61 preferably has a light transmittance of 90% or greater at respective peak wavelengths of the plurality of light-emitting elements 50. With this structure, the light extraction efficiency of the light-emitting device 1000 can be further improved.

Display Device 2000

The light-emitting device of the present embodiment can be applied to a display device such as an outdoor display, for example. An example of a display device that uses the light-emitting device according to the present embodiment will be described below.

Figure 3A:
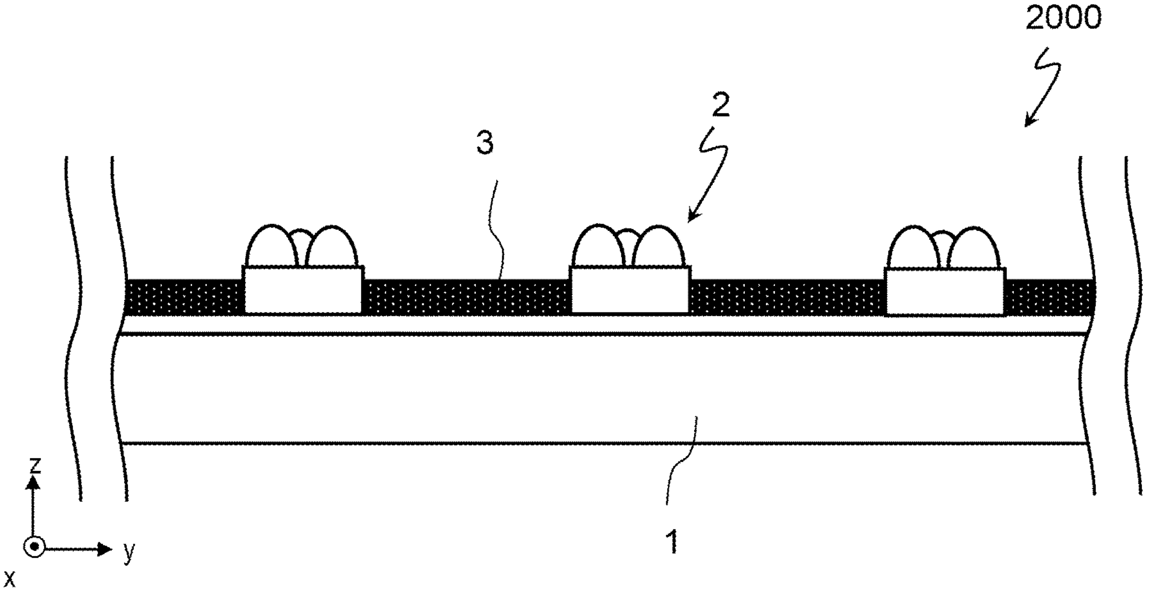
FIG. 3A is a schematic cross-sectional view illustrating apart of a display device that uses the light-emitting device illustrated in FIG. 1.

FIG. 3A is schematic cross-sectional view illustrating a display device 2000.

Figure 3B:
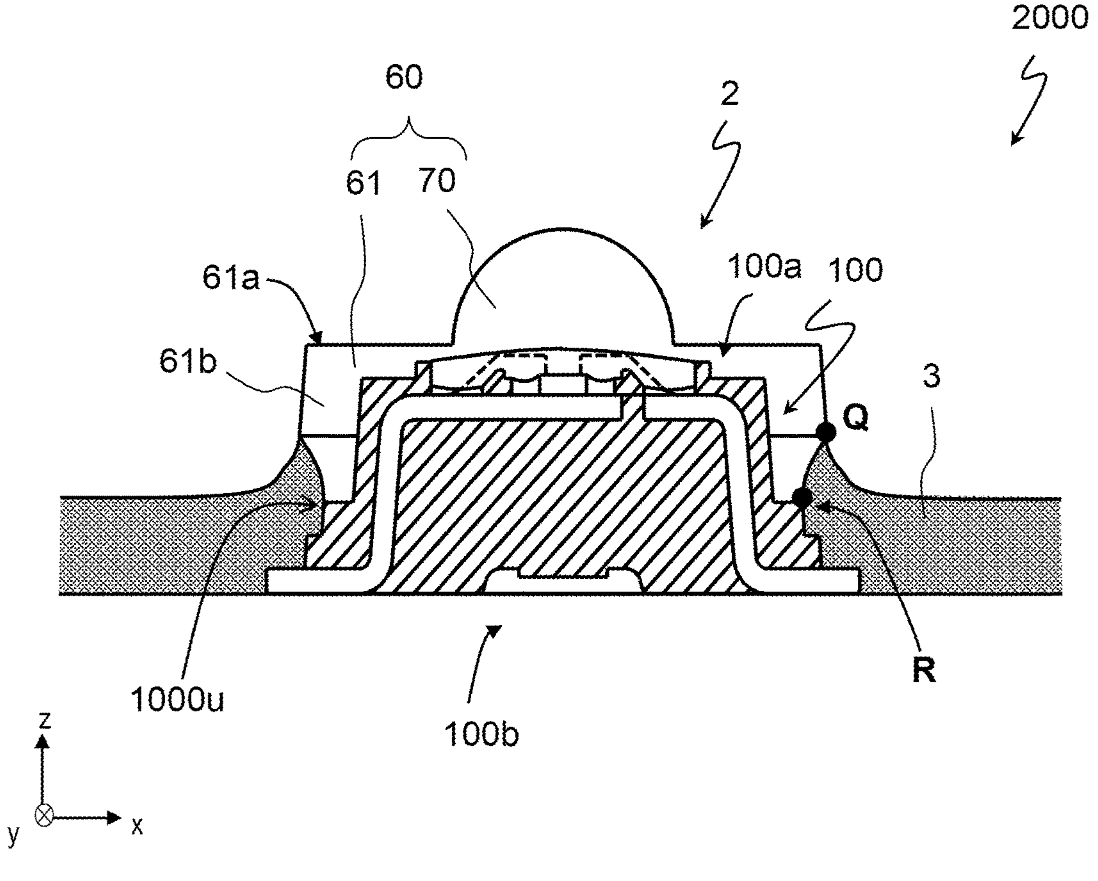
FIG. 3B is an enlarged schematic cross-sectional view illustrating a part of the display device illustrated in FIG. 3A.

The display device 2000 includes a substrate 1 such as a printed circuit board, a plurality of light-emitting devices 2 arrayed in two dimensions on the substrate 1, and a waterproof resin 3. The light-emitting device 2 illustrated in FIG. 3A differs from the light-emitting device 1000 described with reference to FIGS. 1 and 2A to 2H in the arrangement of the lens portions but can otherwise have a similar structure. As the light-emitting device 2, the light-emitting device 1000 described with reference to FIGS. 1 and 2A to 2H may be used. FIG. 3B is an enlarged cross-sectional view illustrating an enlarged part of the display device 2000 in a case in which the light-emitting device illustrated in FIGS. 1 and 2A to 2H is used as the light-emitting device 2.

The waterproof resin 3 covers a surface of the substrate 1 and a part of a lateral surface of the light-emitting device 2. The waterproof resin 3 prevents moisture from penetrating into an interior of the light-emitting device 2 and protects terminal portions and light-emitting elements.

In the illustrated configuration, moisture from outside the display device 2000 readily penetrates the interior of the light-emitting device 2 from the interface portion (including the third point R) 1000*u* between the resin package 100 and the mold resin portion 60, for example. Therefore, preferably the waterproof resin 3 provides coverage from a lowermost portion of the lateral surface of the light-emitting device 2 to a portion positioned above the interface portion, which is to become the moisture penetration area, between the resin package 100 and the mold resin portion 60. On the other hand, an uppermost end of the waterproof resin 3 is preferably positioned below the upper surface 61*a* of the base portion 61. This is because, when the waterproof resin 3 is disposed on the upper surface 61*a* of the base portion 61 and on the lens portion 70, the extraction efficiency of light from the light-emitting device 2 may deteriorate, and light distribution controllability by the lens portion 70 may deteriorate.

The waterproof resin (silicone resin, for example) 3 is typically applied after the plurality of light-emitting devices 2 are mounted on the substrate 1. In the present embodiment, in a cross-sectional view of the light-emitting device 2, the third point R that is the moisture penetration area is positioned closer to the lens portion 70 than the second point Q that is the outermost point of the lateral surface portion 61*b* of the base portion 61, and thus the waterproof resin 3 readily covers the lateral surface of the light-emitting device 2 from the lowermost portion to at least the third point R. Accordingly, the penetration of moisture from the interface portion 1000*u* between the mold resin portion 60 and the resin package 100 can be more effectively reduced. Further, the lateral surface of the light-emitting device 2 (outer surface of the base portion 61) extends to the second point Q like an eave, and thus the waterproof resin 3 is unlikely to rise along the lateral surface of the light-emitting device 2 beyond the second point Q. Accordingly, arrangement of a part of the waterproof resin 3 on the upper surface 61*a* of the base portion 61 and the lens portions 70 can be reduced. For example, in a cross-sectional view, the uppermost end of the waterproof resin 3 may be positioned above the interface portion 1000*u* and below the second point Q. In other words, of the lateral surface of the base portion 61, a portion positioned above the second point Q may be exposed from the waterproof resin 3.

Note that, although the display device 2000 for an outdoor display is described here as an example, application of the display device 2000 is not particularly limited. Further, in a case in which the lateral surface of the light-emitting device 2 is covered with a resin for purposes other than waterproofing, the arrangement of the resin can be controlled by the shape of the lateral surface of the light-emitting device 2, and thus the same effects as those described above can be achieved.

Method of Manufacturing Light-Emitting Device 1000

An example of a method of manufacturing the light-emitting device 1000 will be described below.

FIGS. 4A to 4G are each a step cross-sectional view for describing the method of manufacturing the light-emitting device 1000 illustrating a cross section taken along line 2D-2D illustrated in FIG. 2C.

First Step: Preparation of Resin Package 100

Figure 4A:
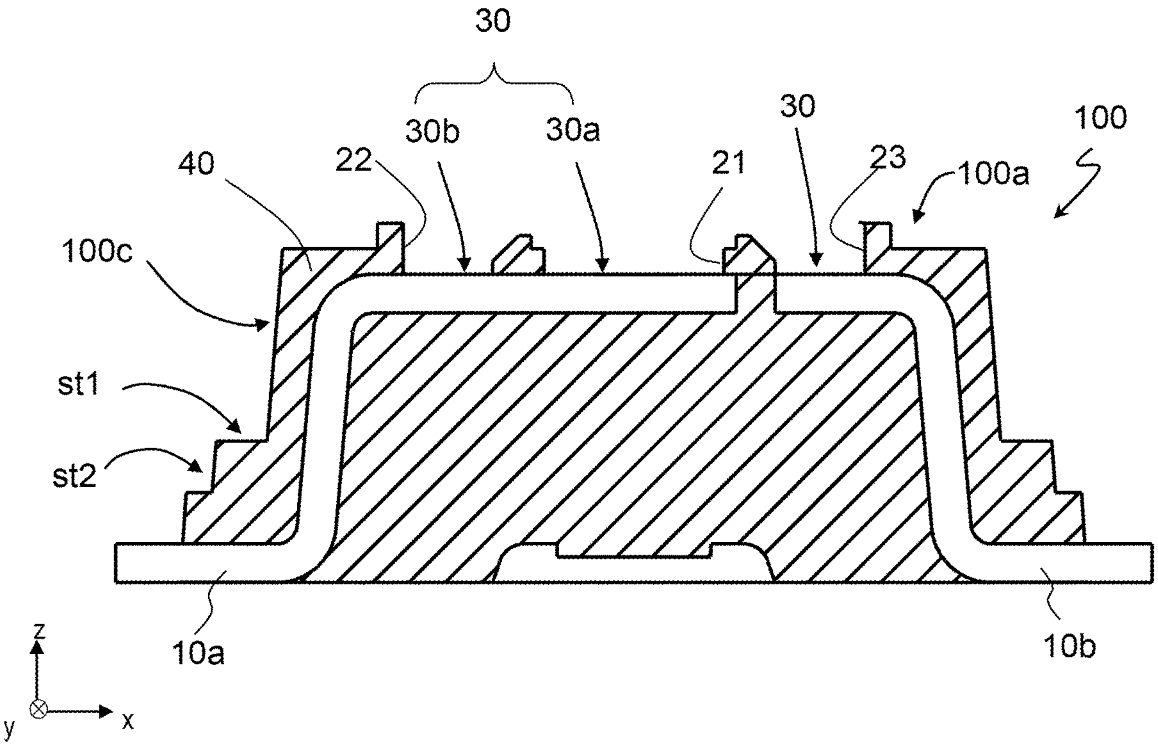
FIG. 4A is a step cross-sectional view illustrating a manufacturing step of the light-emitting device illustrated in FIG. 1.

In a first step, the resin package 100 is prepared that includes the first dark-colored resin member 40 and the plurality of leads, as illustrated in FIG. 4A. The resin package 100 can be formed by transfer molding, insert molding, or the like. Here, a method of forming the resin package 100 using a transfer molding method will be described.

First, a lead frame including a plurality of leads is prepared. In this example, the lead frame includes three pairs of leads per package. Each of the lead pairs includes the leads 10*a* and 10*b* that are spaced apart from each other.

Subsequently, a mold is prepared, and the lead frame is placed in the mold. After this, a thermoplastic resin material colored to a dark color is injected into the mold and solidified by being cooled. Thus, the resin package 100 that holds the plurality of leads 10*a* and 10*b* is obtained by means of the first dark-colored resin member 40.

A structure of the resin package 100 is similar to the structure described above with reference to FIGS. 2F to 2H. The first dark-colored resin member 40 in the resin package 100 defines the first recessed portion 21 and the second recessed portions 22 and 23. Further, the first dark-colored resin member 40 includes the first step surface st1 in the outer side portion 100*c* of the resin package 100. A configuration of the first dark-colored resin member 40 can be formed according to a shape of the mold in this step.

Second Step: Mounting of Light-Emitting Elements 50

Figure 4B:
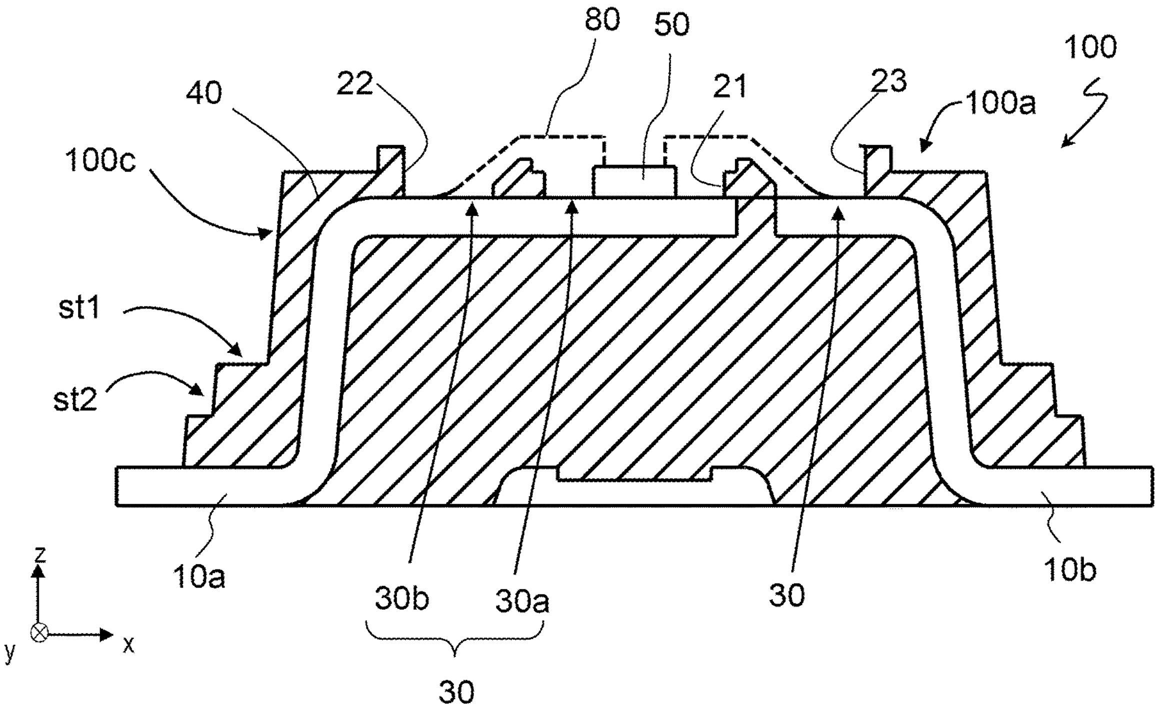
FIG. 4B is a step cross-sectional view illustrating a manufacturing step of the light-emitting device illustrated in FIG. 1.

In a second step, as illustrated in FIG. 4B, the plurality of light-emitting elements 50 are mounted on the resin package 100. First, in the primary surface 100*a* of the resin package 100, the light-emitting elements 50 are each bonded to a part of the exposed region 30 of one lead 10*a* of the corresponding lead pair using, for example, a conductive paste. Subsequently, the positive and negative electrodes of each of the light-emitting elements 50 are electrically connected to parts of the exposed regions 30 of the leads 10*a* and 10*b*, respectively, by a pair of wires 80.

Third Step: Formation of Reflective Member 150 and Light-Transmissive Resin Member 180

Figure 4C:
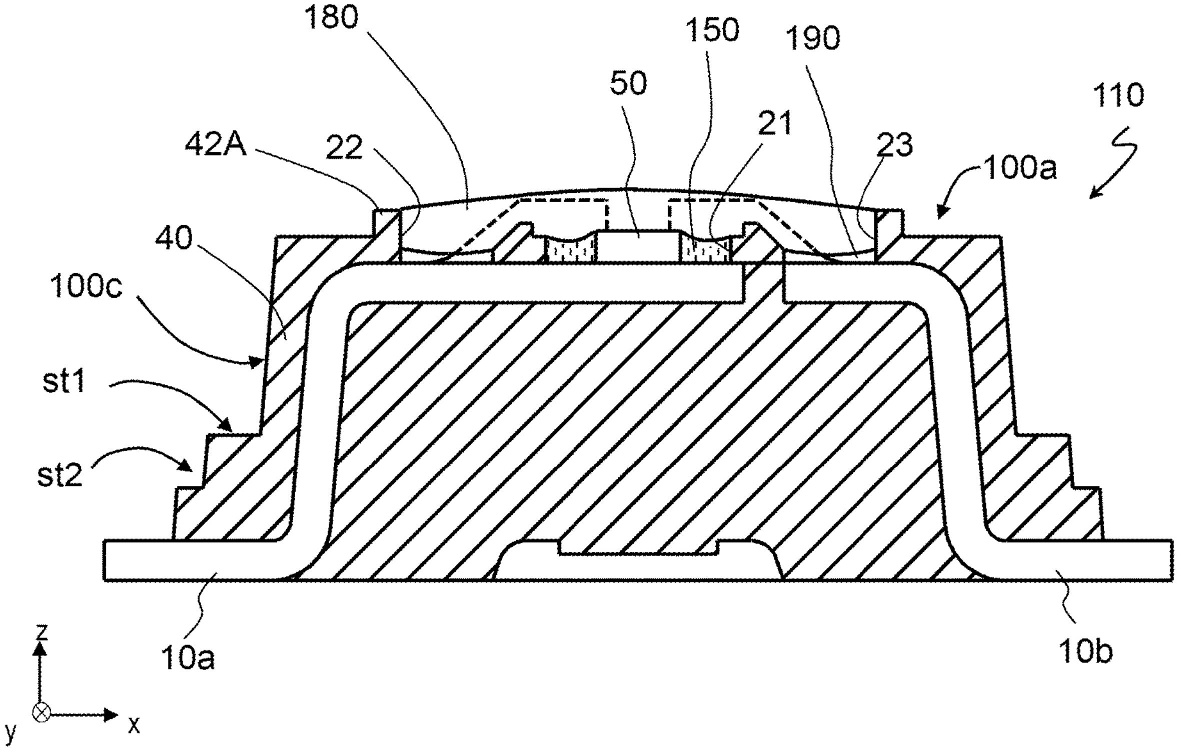
FIG. 4C is a step cross-sectional view illustrating a manufacturing step of the light-emitting device illustrated in FIG. 1.

In a third step, as illustrated in FIG. 4C, the reflective member 150 and the light-transmissive resin member 180 are formed around each light-emitting element 50.

The reflective member 150 is obtained by first applying the first resin material serving as the reflective member to inside the first recessed portion 21 of the resin package 100 using a nozzle, and then curing the first resin material.

Further, the second dark-colored resin member 190 may be formed by applying a dark-colored resin material to inside the second recessed portions 22 and 23 and then curing the resin material. Note that the first resin material and the resin material that serve as the second dark-colored resin member may be simultaneously applied using a plurality of nozzles and simultaneously cured. Because the work can be performed simultaneously, the steps can be simplified. Further, the second dark-colored resin may be applied and cured, and then the first resin material may be applied.

Subsequently, the light-transmissive resin member 180 is obtained by applying a second resin material, which is to become the light-transmissive resin member, so as to cover the light-emitting elements 50, the reflective member 150, and the resin portions 42C in the region defined by the resin portion 42A of the second resin portion 42.

Note that the resin materials that are to become the reflective member and the second dark-colored resin member may be heated at a temperature below a curing temperature to provisionally cure the resin materials, and the second resin material that is to become the light-transmissive resin member may be disposed on the provisionally cured bodies that are to become the reflective member and the second dark-colored resin member. Subsequently, the provisionally cured bodies that are to become the reflective member and the second dark-colored resin member and the second resin material may be heated at a temperature equal to or higher than the curing temperature and fully cured. Alternatively, the mold resin portion may be formed in a state in which the resin materials of the reflective member, the second dark-colored resin member, and the light-transmissive resin member are provisionally cured. In this case, these resin materials may be fully cured in a curing step for forming the mold resin portion. Thus, a first structure 110 is obtained in which the light-emitting elements 50, the reflective member 150, and the light-transmissive resin member 180 are disposed on the primary surface 100*a* of the resin package 100.

Fourth Step: Formation of Mold Resin Portion 60

In a fourth step, the mold resin portion 60 is formed by using, for example, a casting method. The base portion 61 of the mold resin portions 60 and the lens portions 70 are, for example, integrally formed. The base portion of the mold resin portion 60 and the lens portions 70 may be separated.

Preparation of Casting Case 120

Figure 4D:
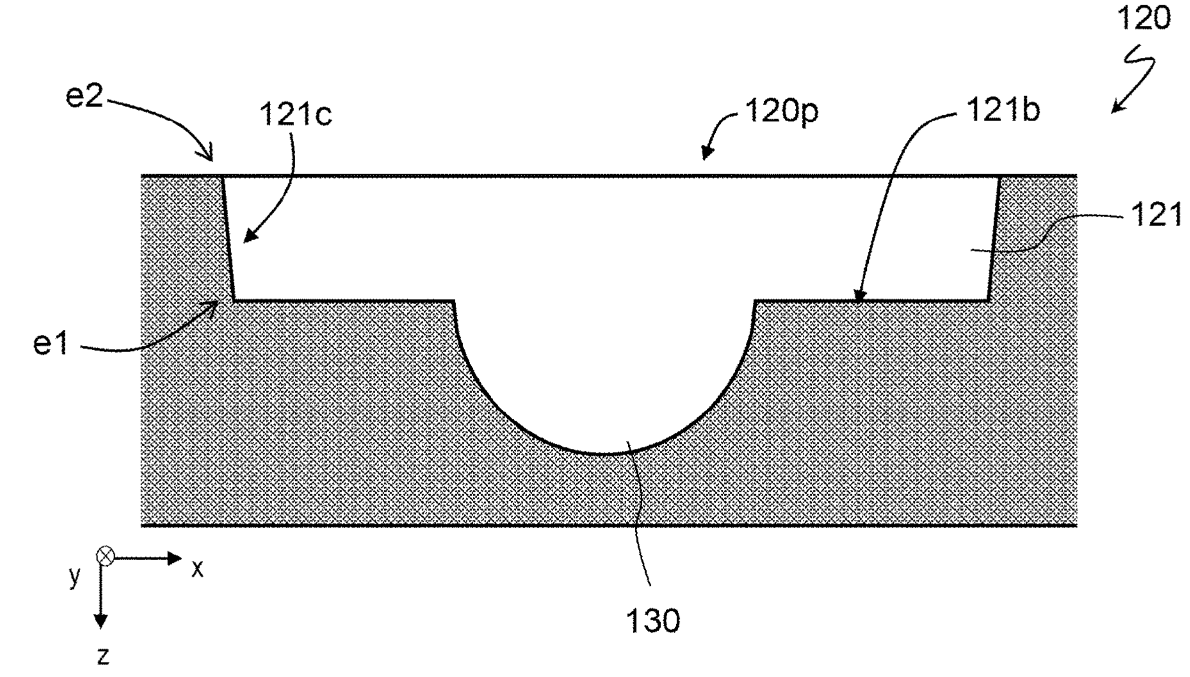
FIG. 4D is a step cross-sectional view illustrating a manufacturing step of the light-emitting device illustrated in FIG. 1.

First, as illustrated in FIG. 4D, the casting case 120 is prepared that includes an opening 120*p*, an upper cavity 121, and a plurality of lower cavities 130. The upper cavity 121 includes a bottom surface 121*b* and an inner wall 121*c* formed continuously from the bottom surface 121*b*. The opening 120*p* is positioned opposite (−z side) to the bottom surface 121*b*. Each of the lower cavities 130 protrudes from the bottom surface 121*b* of the upper cavity 121 in a direction opposite (+z side) to the opening 120*p*.

The upper cavity 121 has a shape corresponding to a part of the base portion. For example, the bottom surface 121*b* of the upper cavity 121 has a shape corresponding to the upper surface 61*a* (FIG. 2D) of the base portion 61, and the inner wall 121*c* has a shape corresponding to a part the lateral surface portion 61*b* (FIG. 2D) of the base portion 61. In a top view of the casting case as viewed from the opening 120*p*, a peripheral edge e1 of the bottom surface 121*b* is positioned inward of an upper end e2 of the inner wall 121*c*.

The lower cavity 130 has a shape corresponding to the lens portion. Here, the plurality of lower cavities 130 are three lower cavities including a first cavity for the first lens portion, a second cavity for the second lens portion, and a third cavity for the third lens portion.

Third Resin Material Injection Step

Figure 4E:
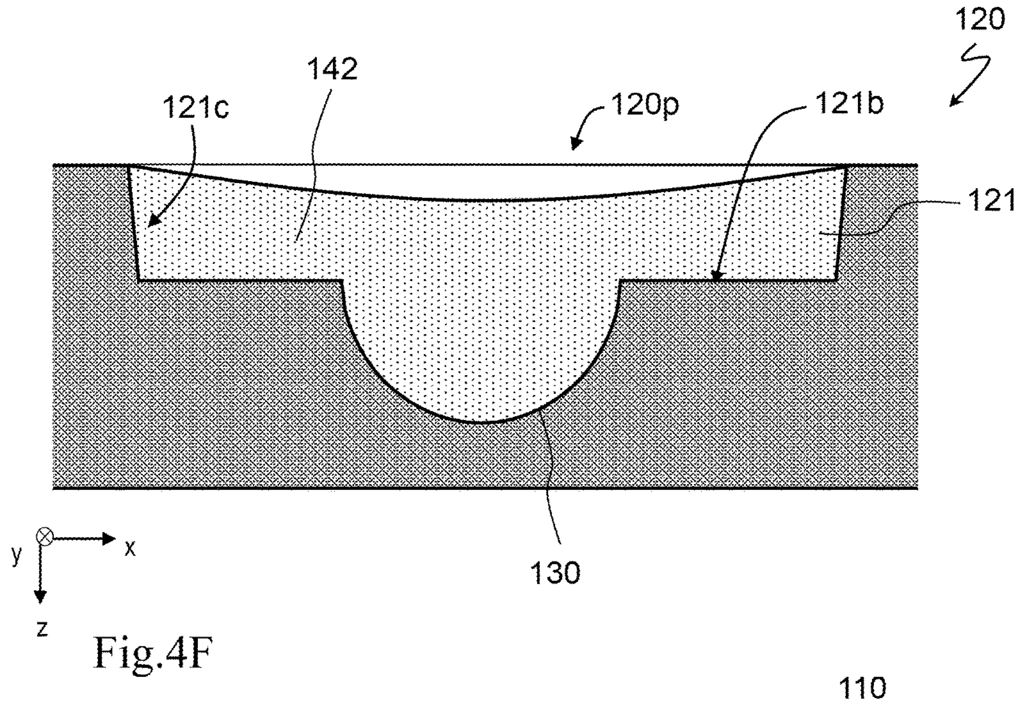
FIG. 4E is a step cross-sectional view illustrating a manufacturing step of the light-emitting device illustrated in FIG. 1.

Subsequently, as illustrated in FIG. 4E, a third resin material 142 whose base material is a thermosetting resin is injected into each of the plurality of lower cavities 130.

Here, an epoxy resin is used as the base material of the third resin material 142. The third resin material 142 is injected into the lower cavities 130 and the upper cavity 121. An injection volume of the third resin material 142 into the upper cavity 121 is preferably set to be smaller than a total volume of the upper cavity 121 and the lower cavities 130. This makes it possible to suppress the rise of the third resin material 142 in the subsequent immersion step to an amount controllable by the first step surface st1. As illustrated, the third resin material 142 may include an upper surface having a recessed shape that comes into contact with a peripheral edge of the opening 120*p*. On the other hand, when the injection volume of the third resin material 142 is too small, the third resin material 142 cannot be caused to rise in the subsequent immersion step. Therefore, the injection volume of the third resin material 142 is set to be greater than an amount obtained by subtracting a volume of a portion of the resin package 100 to be immersed from an internal volume of the upper cavity 121. Note that the third resin material 142 may be injected into the lower cavities 130 and provisionally cured, and subsequently the third resin material 142 may be injected into the upper cavity 121.

Immersion Step

Figure 4F:
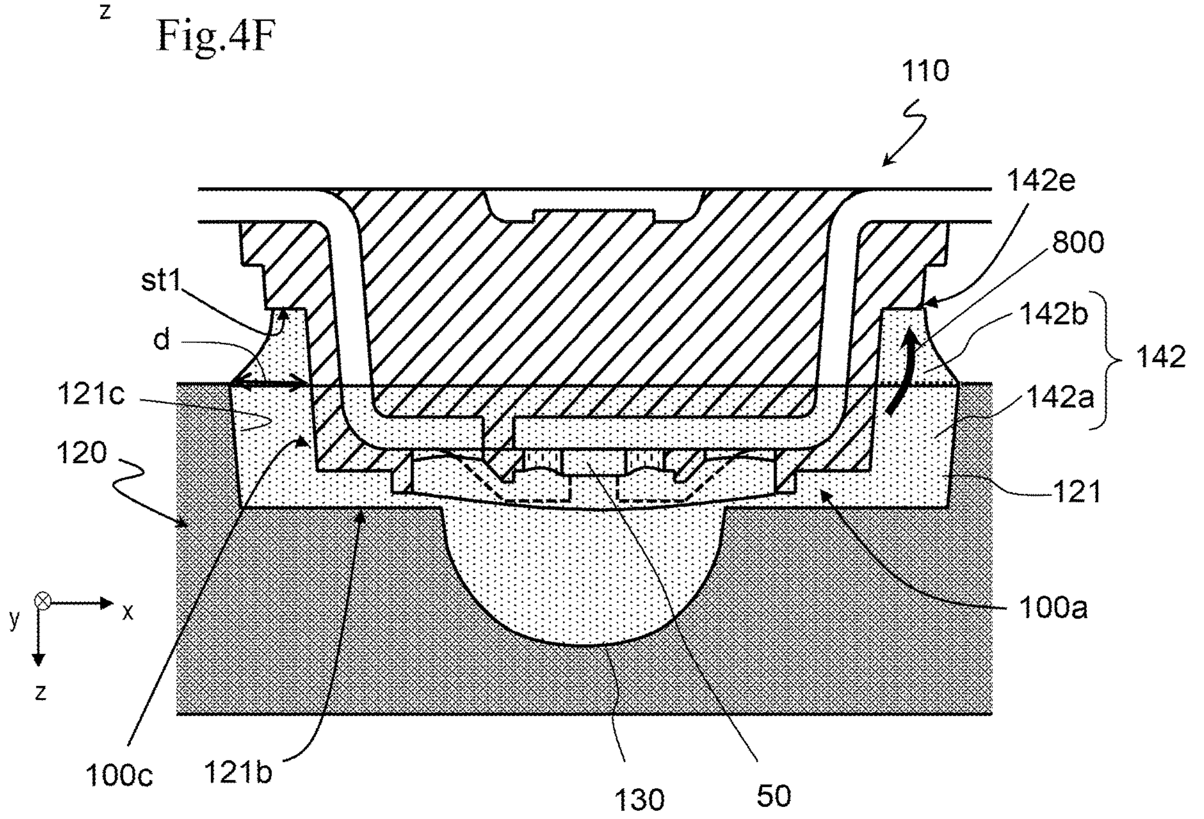
FIG. 4F is a step cross-sectional view illustrating a manufacturing step of the light-emitting device illustrated in FIG. 1.

Subsequently, as illustrated in FIG. 4F, with the first structure 110 placed facing downward, a part of the first structure 110 is immersed in the third resin material 142 in the casting case 120. Specifically, the light-emitting elements 50 and the primary surface 100*a* of the resin package 100 of the first structure 110 are immersed in the third resin material 142 so that each of the plurality of light-emitting elements 50 overlaps the corresponding one of the plurality of lower cavities 130 in a plan view.

A predetermined space (clearance) d is formed between the outer side portion 100*c* of the resin package 100 and the inner wall 121*c* of the upper cavity 121 of the casting case 120. The space d corresponds to the width Wq illustrated in FIG. 2D. The space d is a distance parallel to the xy plane between the upper end of the inner wall 121*c* and the outer side portion 100*c* of the resin package 100 in a cross-sectional view.

The first structure 110 is immersed, causing a part of the third resin material 142 to rise from between the outer side portion 100*c* of the resin package 100 and the inner wall 121*c* of the upper cavity 121 of the casting case 120 along the outer side portion 100*c* of the resin package 100 toward the first step surface st1 as illustrated by an arrow 800 in FIG. 4F.

The rise of the third resin material 142 is reduced by the first step surface st1 provided on the outer side portion 100*c* of the resin package 100. As illustrated in FIG. 4F, the rise of the third resin material 142 is stemmed by the first step surface st1. For example, an upper end 142*e* of the risen portion of the third resin material 142 (end portion of a position farthest away from the casting case 120 (−z direction)) may come into contact with the first step surface st1.

Note that the shape of the third resin material 142 is not limited to the shape illustrated in FIG. 4F. The shape of the third resin material 142 can vary depending on the amount of the third resin material 142, the space d, a depth to which the first structure 110 is immersed, the shape of the outer side portion 100*c* of the resin package 100, and the like. For example, as exemplified in FIG. 5A, the upper end 142*e* of the risen portion of the third resin material 142 may be partially in contact with the first step surface st1. Alternatively, as illustrated in FIG. 5B, a part of the third resin material 142 may be positioned below (+z side) the first step surface st1. Further, as illustrated in FIG. 5C, a part of the third resin material 142 may reach the second step surface st2 beyond the first step surface st1. In this case as well, the rise of the third resin material 142 is limited by the first step surface st1, and thus the rise of the third resin material 142 until it comes into contact with the leads 10*a* and 10*b*, for example, can be reduced.

Curing Step

Figure 4G:
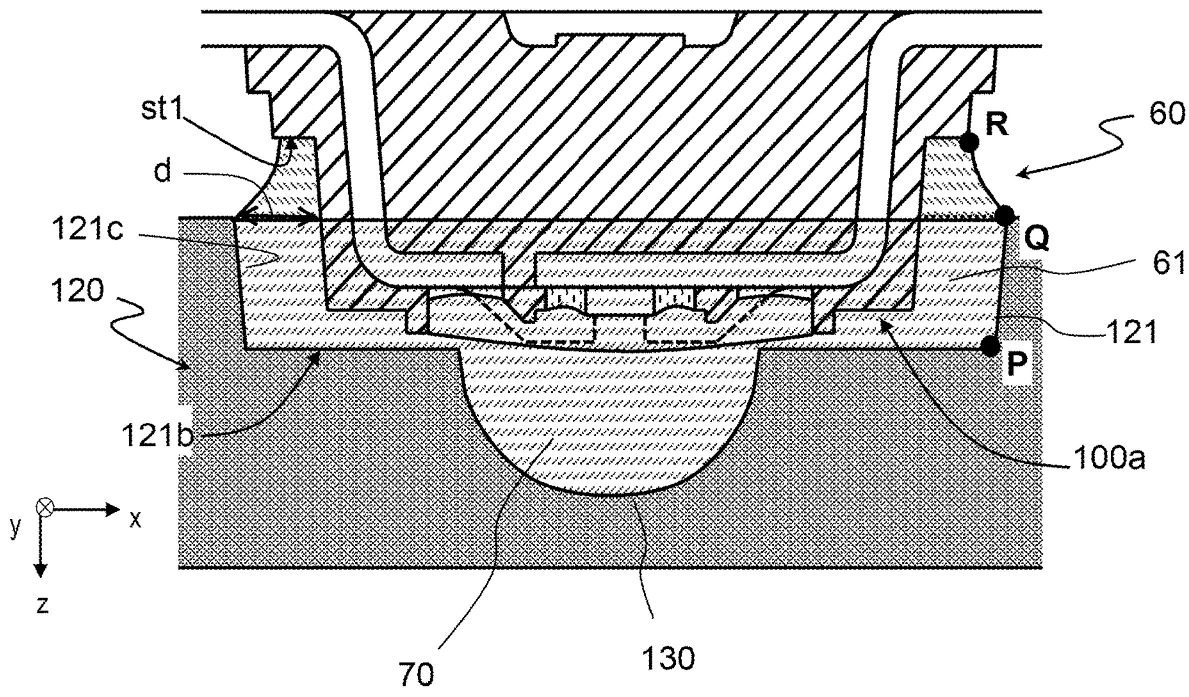
FIG. 4G is a step cross-sectional view illustrating a manufacturing step of the light-emitting device illustrated in FIG. 1.

With the first structure 110 immersed in the third resin material 142, the third resin material 142 is cured. A curing step is performed at a temperature equal to or greater than a curing temperature of the base material of the third resin material 142. After curing, the casting case 120 is removed. Thus, as illustrated in FIG. 4G, the mold resin portion 60 is formed that includes the base portion 61 covering the primary surface 100*a* of the resin package 100 and a plurality (here, three) of the lens portions 70. The lens portions 70 and the base portion 61 of the mold resin portion 60 are formed from the third resin material 142.

Note that, although the third resin material 142 is injected continuously into the lower cavities 130 and the upper cavity 121 here, the third resin material 142 may be injected into the lower cavities 130 and then provisionally cured, subsequently the third resin material 142 may be injected into the upper cavity 121, and then the provisionally cured lower cavities 130 and the third resin material 142 injected into the upper cavity 121 may be fully cured.

The first point P of the mold resin portion 60 may be a point corresponding to a corner portion of the bottom surface 121*b* and the inner wall 121*c* of the upper cavity 121. The second point Q may be a point corresponding to an upper end of the opening 120*p* of the upper cavity 121. The third point R may be a point corresponding to the upper end 142*e* of the risen portion of the third resin material 142.

Figure 5A:
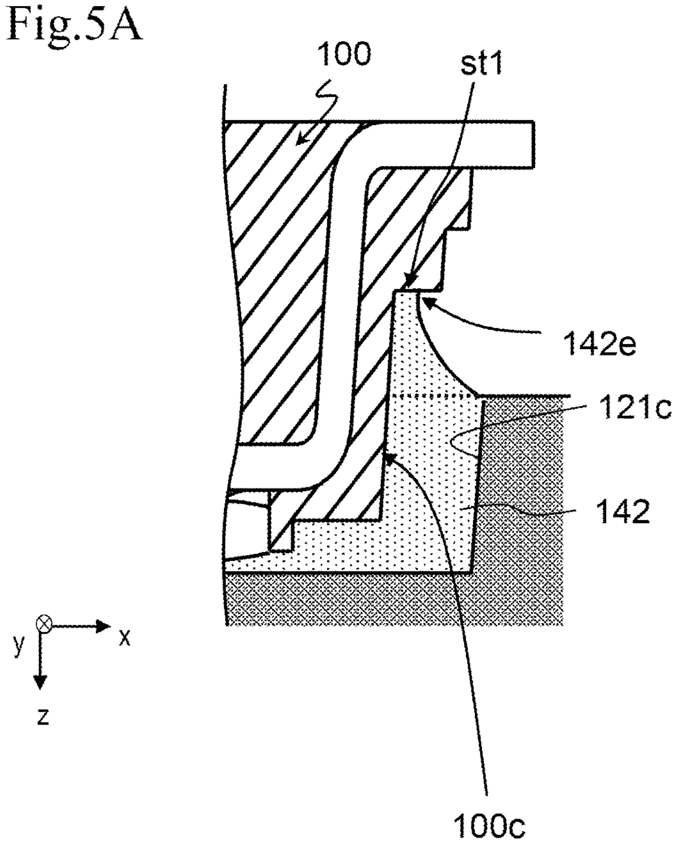
FIG. 5A is an enlarged step cross-sectional view illustrating a manufacturing step of another light-emitting device.
Figure 5B:
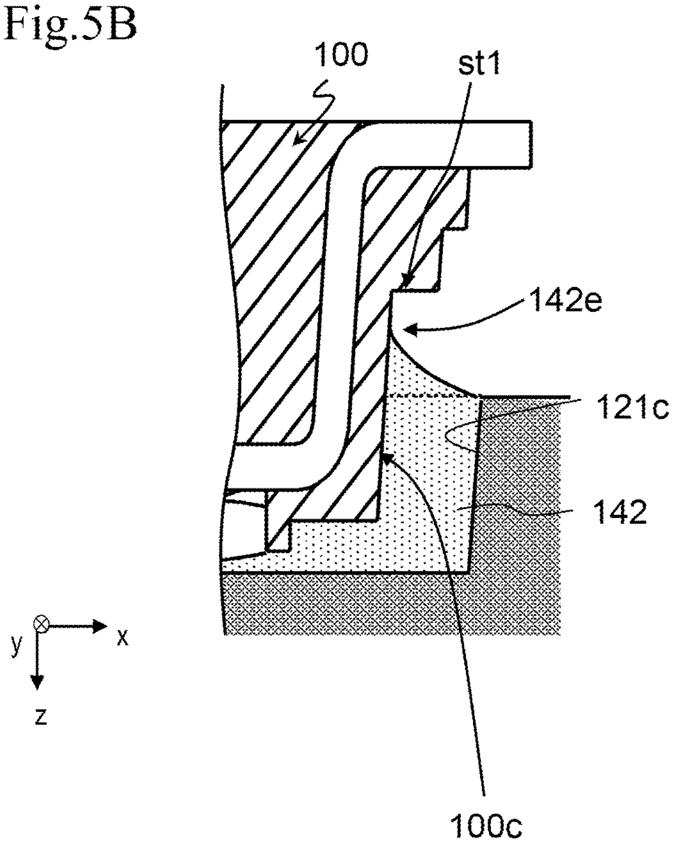
FIG. 5B is an enlarged step cross-sectional view illustrating a manufacturing step of another light-emitting device.
Figure 5C:
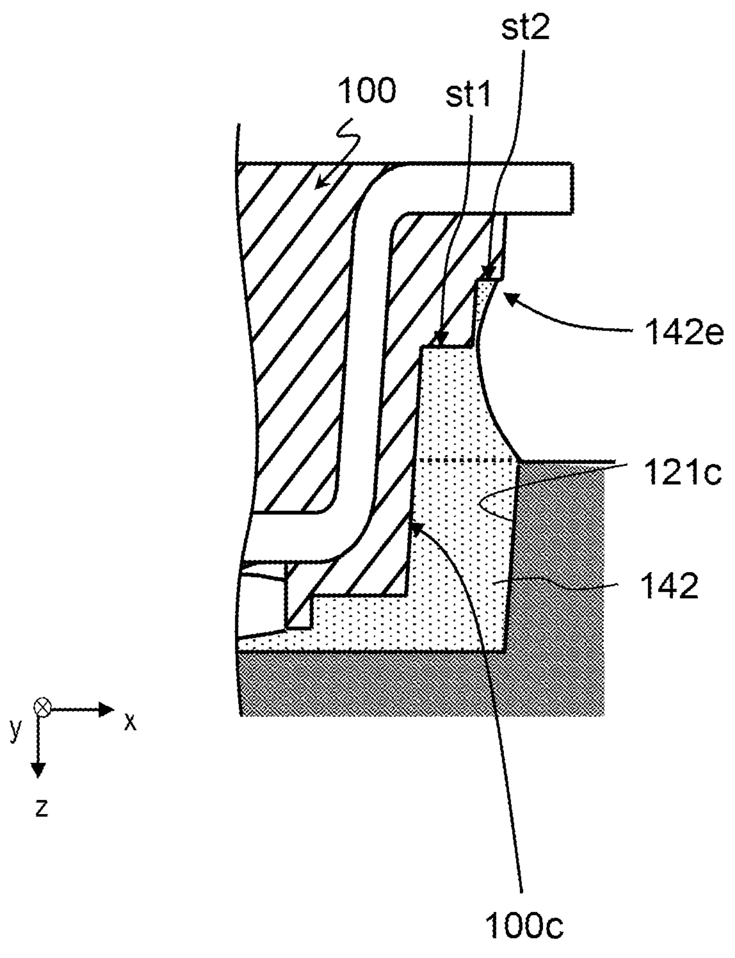
FIG. 5C is an enlarged step cross-sectional view illustrating a manufacturing step of another light-emitting device.
Figure 6A:
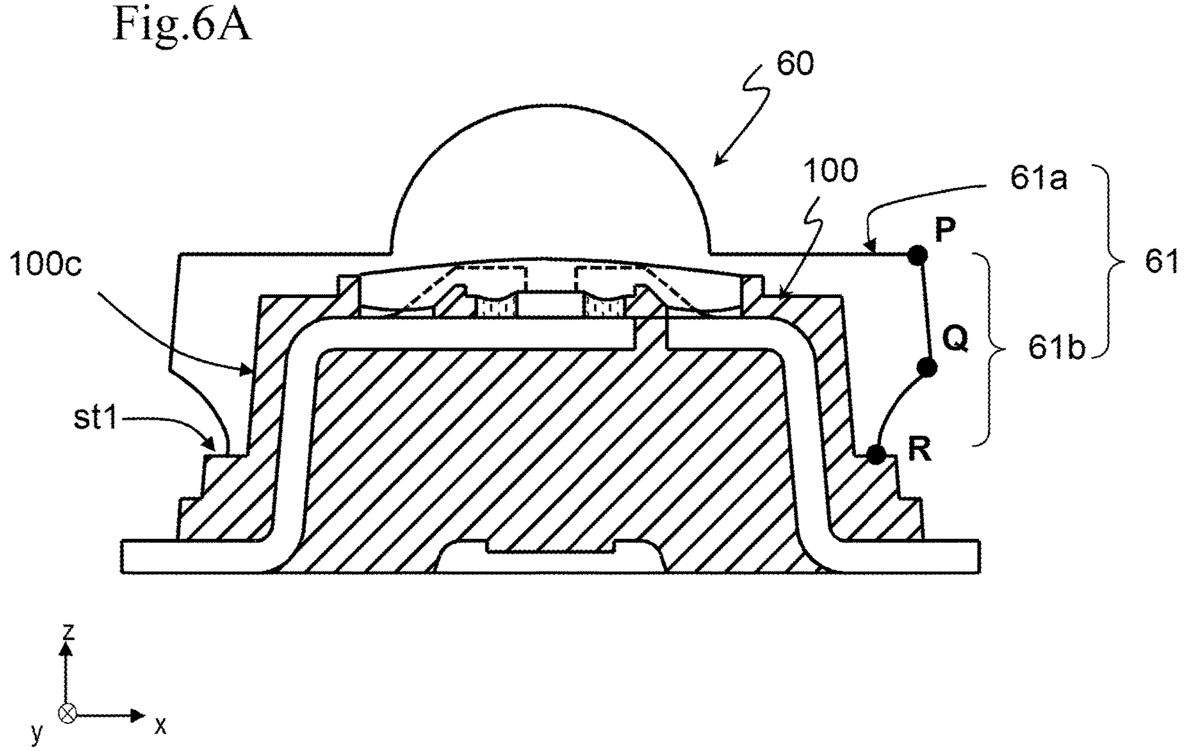
FIG. 6A is an enlarged schematic cross-sectional view illustrating a part of another light-emitting device.
Figure 6B:
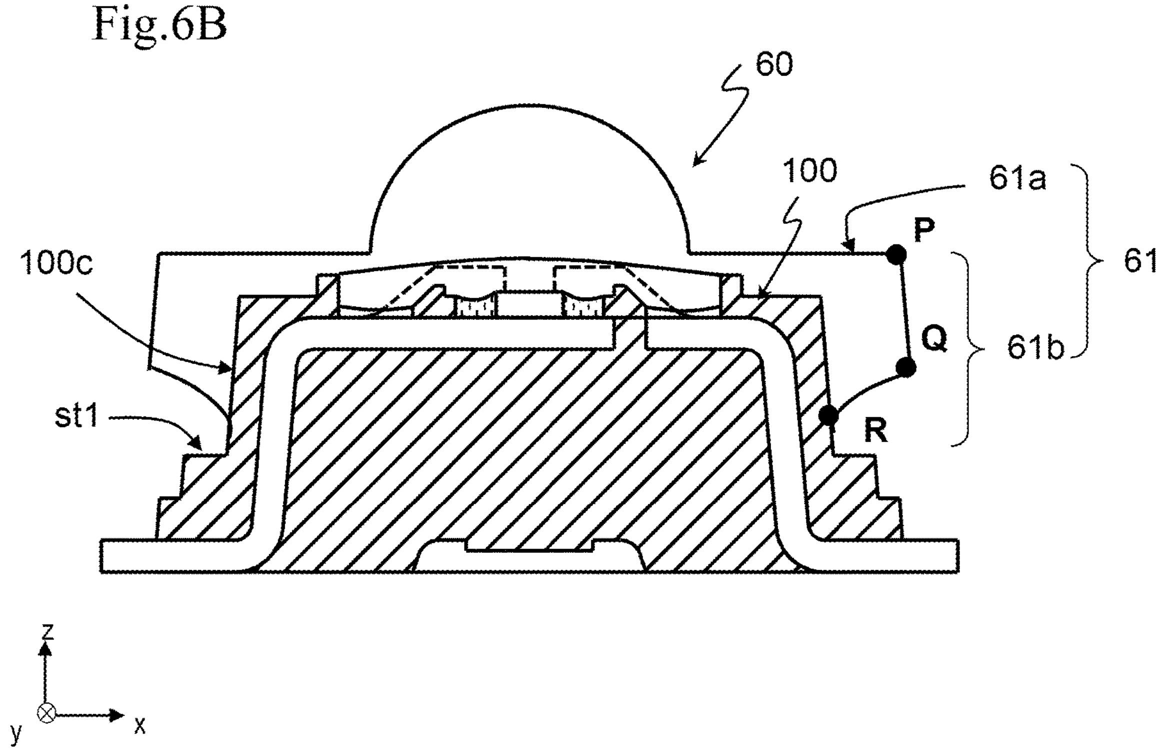
FIG. 6B is an enlarged schematic cross-sectional view illustrating a part of another light-emitting device.
Figure 6C:
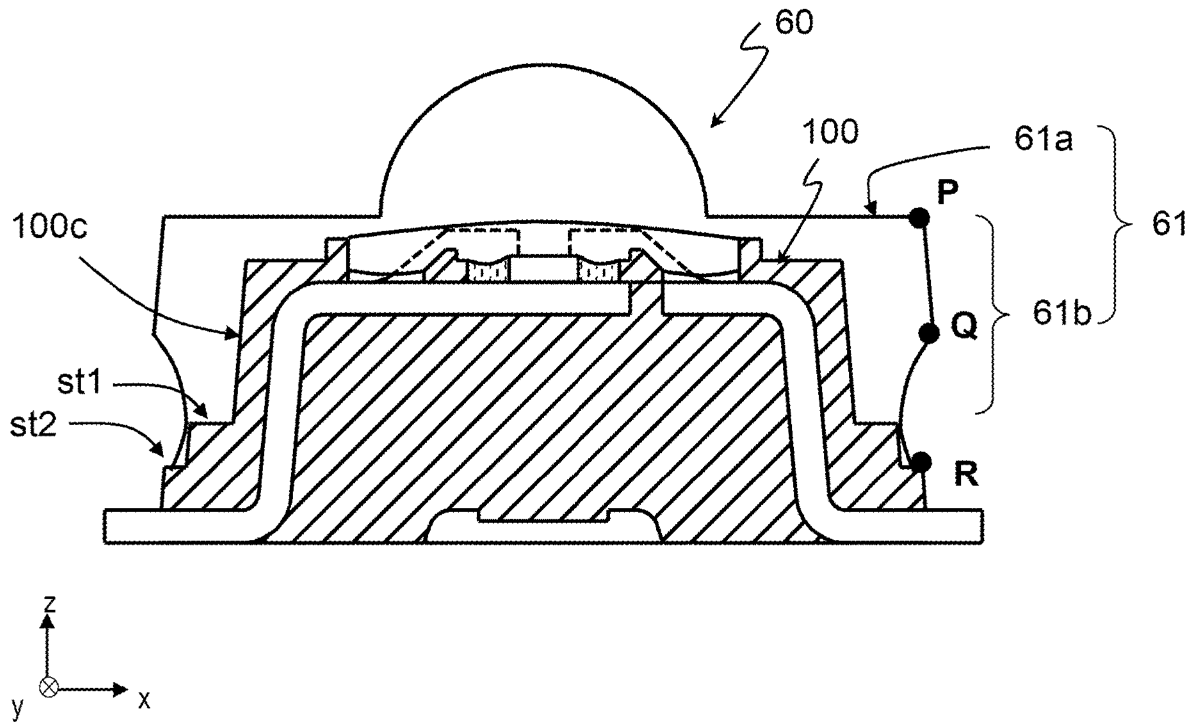
FIG. 6C is an enlarged schematic cross-sectional view illustrating a part of another light-emitting device.

In the examples illustrated in FIGS. 5A to 5C as well, when the third resin material 142 is cured and forms the mold resin portion 60, a point corresponding to the upper end 142*e* of the risen portion of the third resin material 142 can be the third point R. FIGS. 6A to 6C respectively illustrate the mold resin portions 60 formed from the third resin material 142 illustrated in FIGS. 5A to 5C.

Subsequently, the leads 11*a* to 13*b* are cut from the lead frame and separated, and thus the light-emitting device 1000 is obtained.

According to the method of manufacturing of the present embodiment, in the immersion step of the first structure, the mold resin portion 60 having a desired shape can be formed by utilizing the rise of the resin material. Thus, it is possible to reduce an increase in manufacturing costs and in the number of manufacturing steps.

Various modified examples can be conceived with respect to the light-emitting device. For example, the structure and arrangement of the light-emitting elements, the structure and form of the resin package, the configuration of the mold resin portion, and the like are not limited to those modes described in the above-described embodiment. Modes other than those described in the above-described embodiment can be suitably used in the light-emitting device of the present disclosure.

Modified examples of the light-emitting device of the present disclosure will be described below. In the following, points different from those of the light-emitting device 1000 will be mainly described, and a description of structures similar to those of the light-emitting device 1000 will be omitted. Further, in each of the drawings illustrating the modified examples, components similar to those of the light-emitting device 1000 are denoted by the same reference signs for ease of understanding.

First Modified Example

Figure 7A:
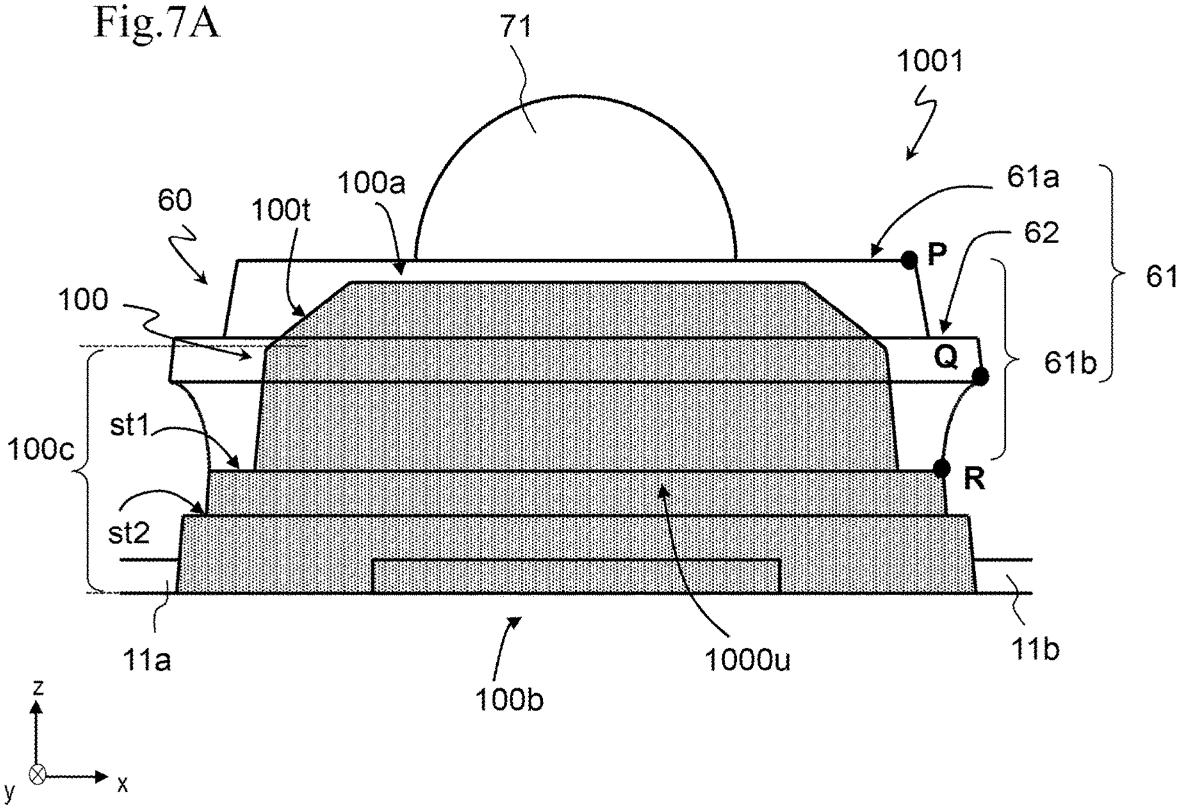
FIG. 7A is a schematic lateral side view of a light-emitting device of a first modified example when viewed in the y-axis direction.
Figure 7B:
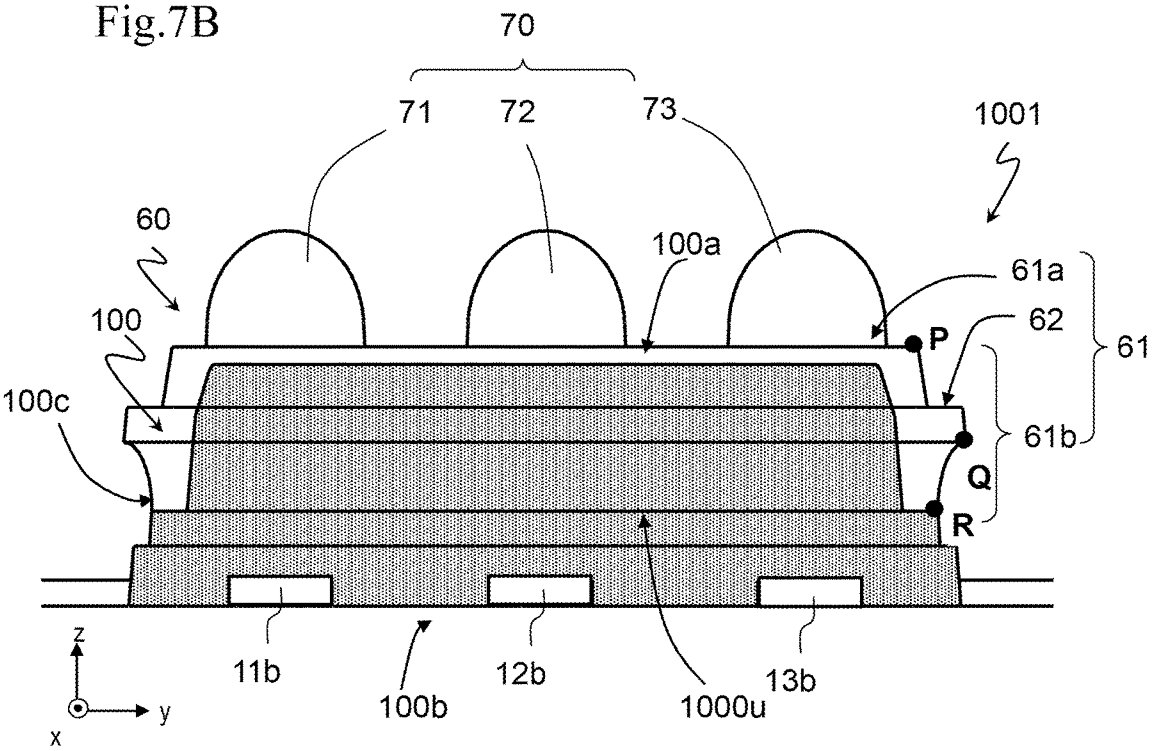
FIG. 7B is a schematic lateral side view of the light-emitting device of the first modified example when viewed in the x-axis direction.
Figure 7C:
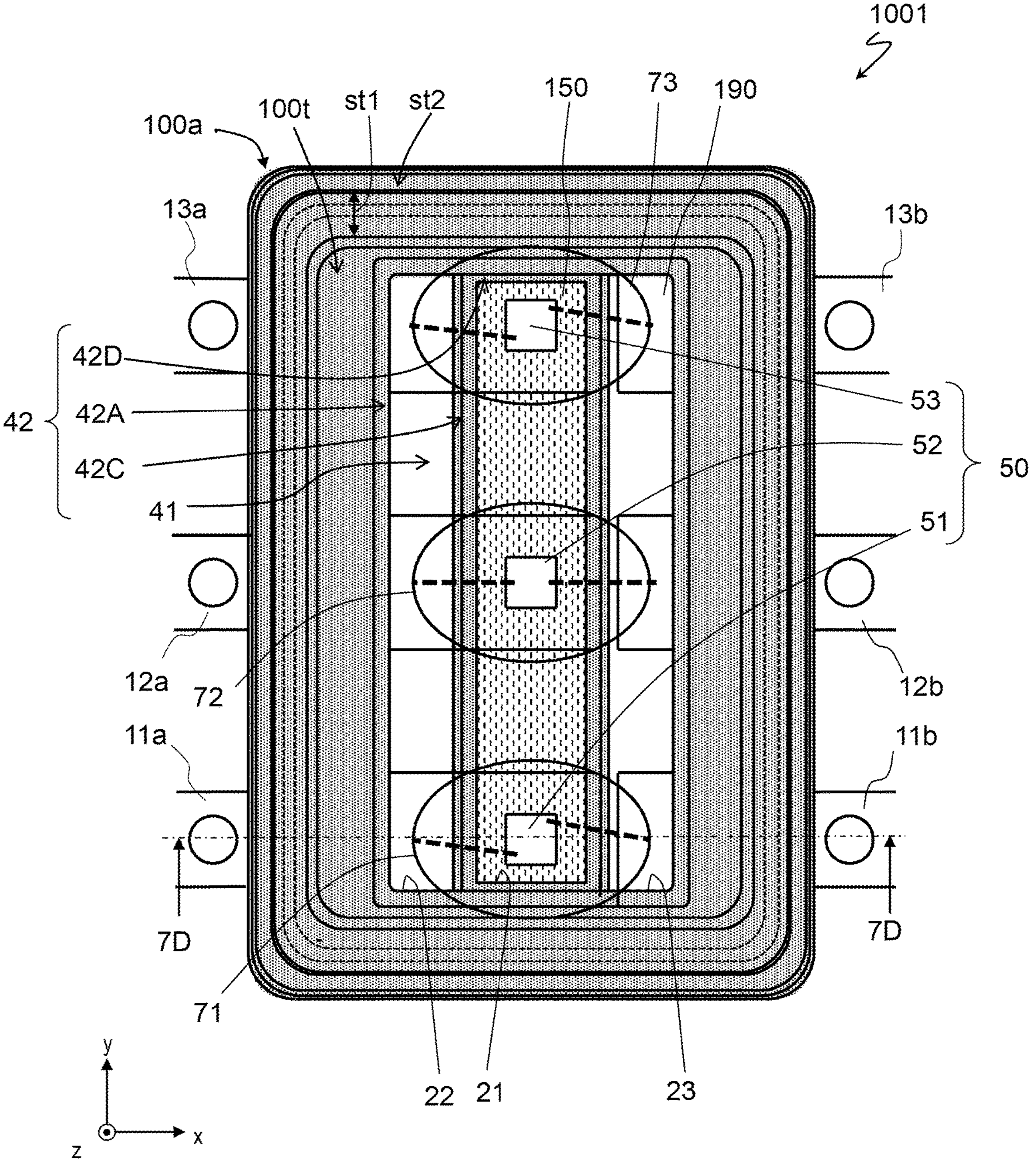
FIG. 7C is a schematic top view of the light-emitting device of the first modified example when viewed in the z-axis direction.
Figure 7D:
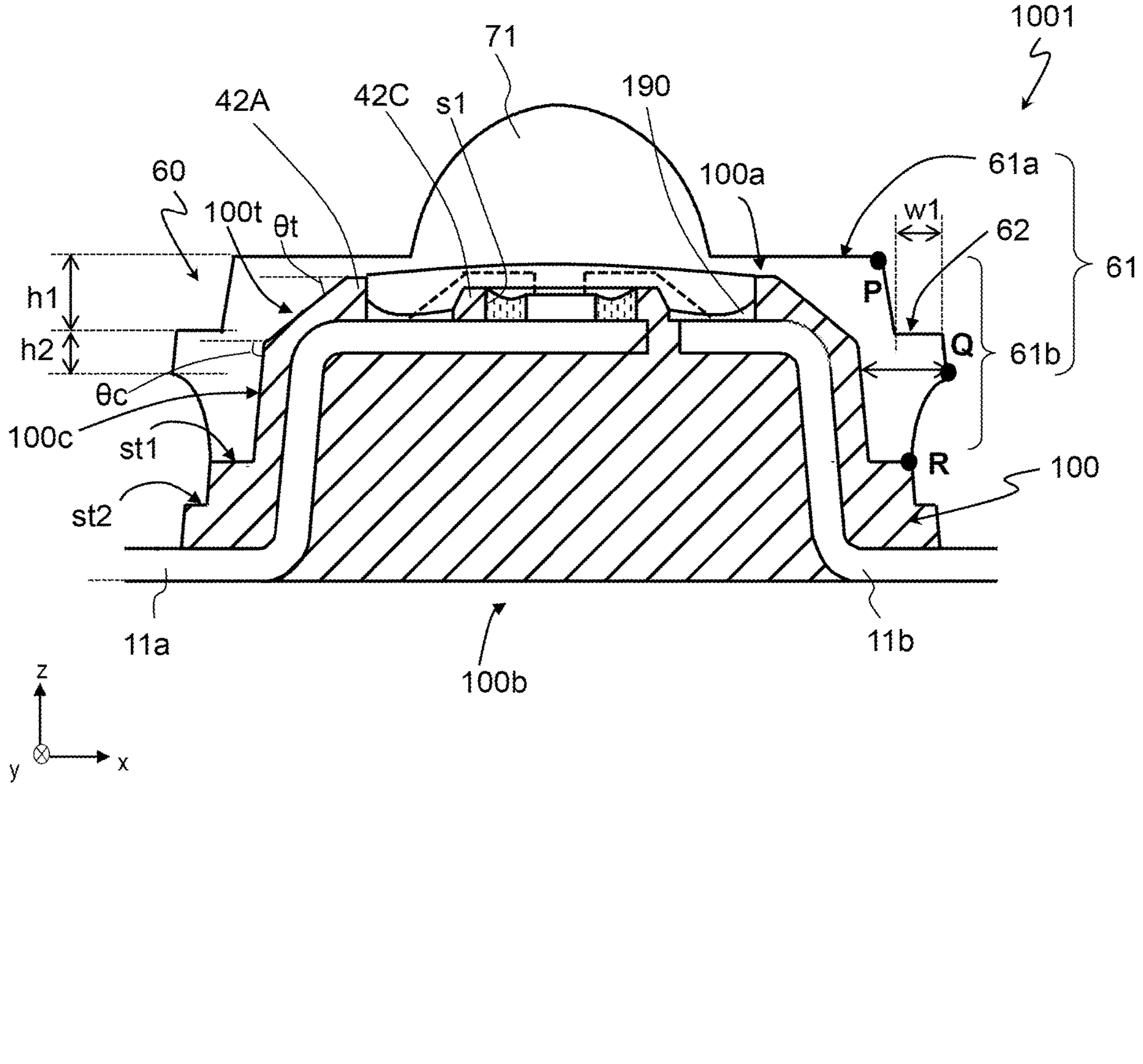
FIG. 7D is a schematic cross-sectional view taken along line 7D-7D illustrated in FIG. 7C.

FIG. 7A is a schematic lateral side view of a light-emitting device 1001 of a first modified example when viewed in the y-axis direction, and FIG. 7B is a schematic lateral side view of the light-emitting device 1001 when viewed in the x-axis direction. FIG. 7C is a schematic top view of the light-emitting device 1001. FIG. 7D is a schematic cross-sectional view taken along line 7D-7D illustrated in FIG. 7C.

The light-emitting device 1001 differs from the light-emitting device 1000 illustrated in FIGS. 2A to 2G in that the base portion 61 of the mold resin portion 60 includes a step.

In the present modified example, in a cross-sectional view, the outer lateral surface of the lateral surface portion 61*b* of the base portion 61 includes a step surface (hereinafter referred to as "base step surface") 62 oriented in the same direction as the primary surface 100*a*, between the first point P and the second point Q. The outer lateral surface of the lateral surface portion 61*b* of the base portion 61 has a stepped shape in a cross-sectional view, and the base step surface 62 is a surface corresponding to a tread of a step. In this example, the base step surface 62 is positioned below the primary surface 100*a* of the resin package 100. Further, in a top view, the base step surface 62 is formed around an outer periphery of the base portion 61.

As illustrated in FIG. 7D, a distance h1 from the upper surface 61*a* of the base portion 61 to the base step surface 62 along the z-axis direction may be greater than a distance h2 from the xy plane including the second point Q to the base step surface 62 along the z-axis direction. The distance h2 may be, for example, in a range from 0.1 mm to 0.3 mm. A width w1 of the base step surface 62 in a direction parallel with the primary surface 100*a* may be smaller than the width Wq, which is the distance from the second point Q of the base portion 61 to the outer side portion 100*c* of the resin package 100 in a direction along a plane (xy plane) parallel to the primary surface 100*a*. The width w1 may be, for example, in a range from 0.1 mm to 0.4 mm.

The resin package 100 in the present modified example may further include a tapered surface 100*t* inclined relative to the primary surface 100*a* of the resin package 100, between the primary surface 100*a* and the outer side portion 100*c*. The tapered surface 100*t* is positioned above the second point Q of the base portion 61. In a lateral side view, the base step surface 62 may overlap the tapered surface 100*t*.

The tapered surface 100*t* is a surface inclined at an angle θt in a range from 35° to 45°, for example, relative to the primary surface 100*a* (here, the xy plane), in the −z direction. The inclination angle θt of the tapered surface 100*t* relative to the xy plane is smaller than an inclination angle θc of a portion of the outer side portion 100*c* that comes into contact with the tapered surface 100*t*.

As illustrated in FIG. 7C, in a plan view, the tapered surface 100*t* may be disposed outward of the resin portion 42A, in contact with the resin portion 42A.

Structures of the first resin portion 41 and the resin portions 42A, 42C, and 42D, which are the second resin portion, in the present modified example are not particularly limited, but may be similar to or may be different from those of the light-emitting device 1000 described above, for example. As illustrated in FIG. 7D, the resin portion 42C may not include a step surface facing upward and positioned between the inner lateral surface 21*c* of the first recessed portion 21 and the upper surface u1.

According to the present modified example, by forming the base step surface 62 on the base portion 61, it is possible to form a mold resin portion having reduced voids using a casting method. The method will be described below with reference to the drawings.

Figure 8A:
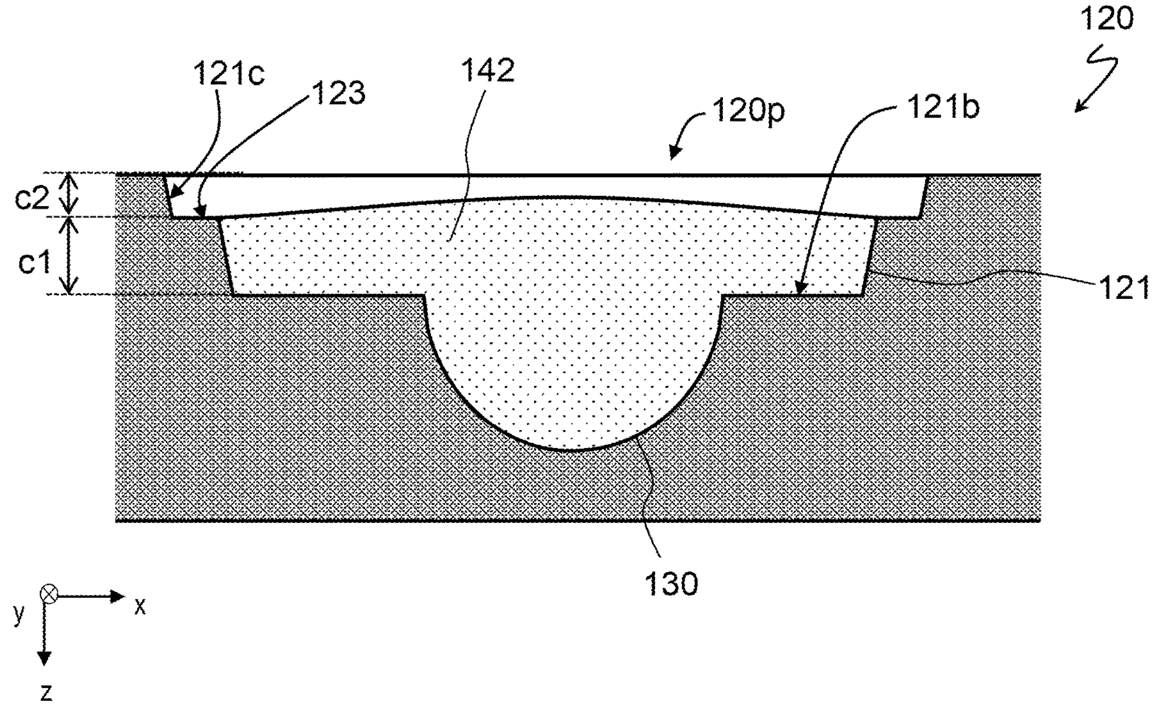
FIG. 8A is a step cross-sectional view illustrating a manufacturing step of the light-emitting device of the first modified example.
Figure 8B:
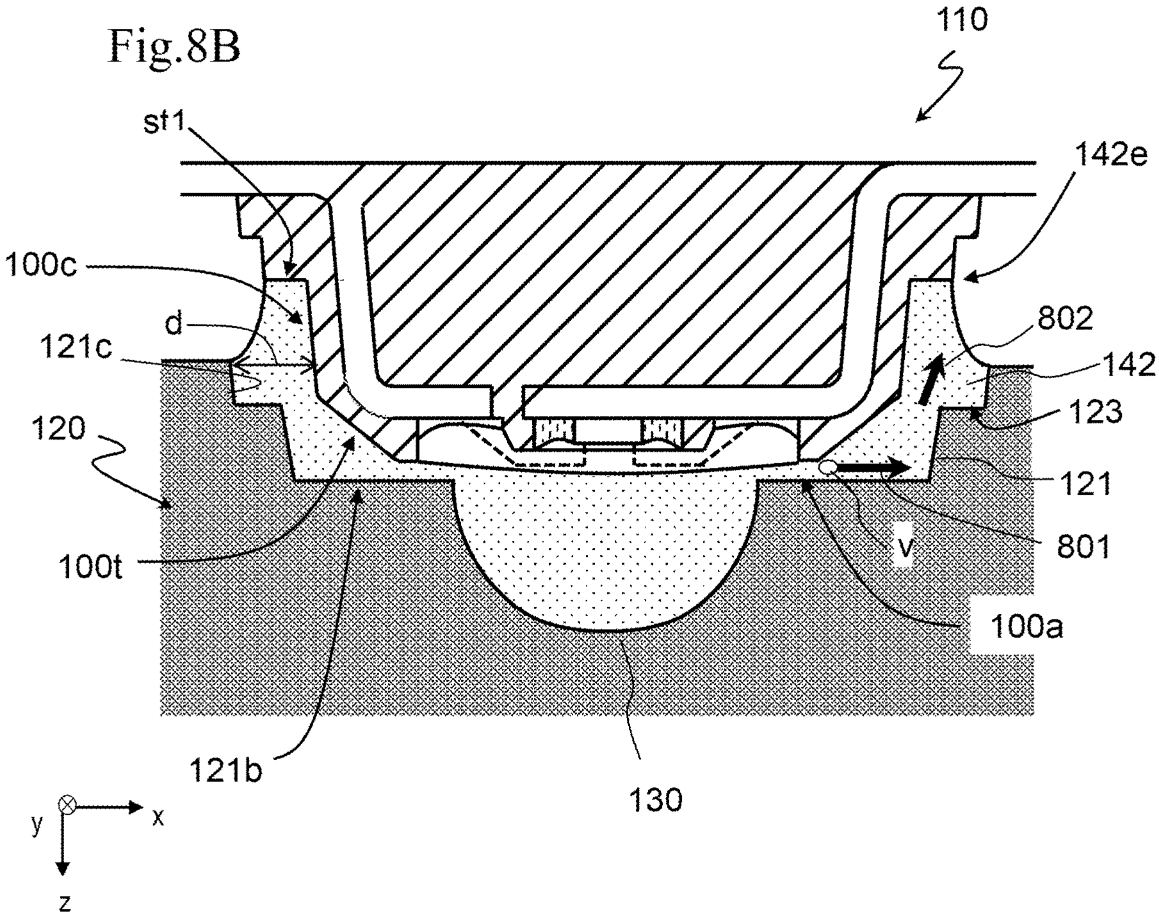
FIG. 8B is a step cross-sectional view illustrating a manufacturing step of the light-emitting device of the first modified example.

FIGS. 8A and 8B are each a step cross-sectional view illustrating a method of forming the mold resin portion by the casting method.

FIG. 8A illustrates a step of injecting the third resin material 142 into the lower cavities 130 and the upper cavity 121 of the casting case 120. As illustrated, in the present modified example, an inner wall of the upper cavity 121 of the casting case 120 includes a step surface 123 corresponding to the base step surface 62 (FIG. 7D) of the base portion 61. An amount of the third resin material 142 can be set to be greater than a volume from the bottom surface 121*b* of the upper cavity 121 to the step surface 123, and smaller than a volume of the entire upper cavity 121, for example. Thus, the third resin material 142 injected into the upper cavity 121 includes an upper surface having a convex shape in contact with an end portion of the step surface 123 on an inner side.

In the present modified example, the amount of the third resin material 142 can be set to be less than the volume of the upper cavity 121, and the step surface 123 can be utilized for control so as to ensure that the upper surface of the third resin material 142 is convex.

A distance c1 (corresponding to the distance h1 of the base portion) from the bottom surface 121*b* of the upper cavity 121 to the step surface 123 in the z-axis direction may be greater than a distance c2 (corresponding to the distance h2 of the base portion) from the upper end of the inner wall 121*c* of the upper cavity 121 to the step surface 123 in the z-axis direction. This makes it possible to accommodate a desired amount of the third resin material 142 in the upper cavity 121 and make the upper surface thereof convex in shape while suppressing a size (volume) of the upper cavity 121.

FIG. 8B illustrates a step of immersing the first structure 110 including the resin package 100 and the light-emitting elements 50 in the third resin material 142 injected into the upper cavity 121.

In this step, because the third resin material 142 includes an upper surface having a convex shape, it is possible to reduce the occurrence of voids v generated in the third resin material 142 in association with the immersion of the first structure 110 including the resin package 100. More specifically, because the upper surface of the third resin material 142 has a convex shape, a central portion of the resin package 100 comes into contact with the third resin material 142 before a peripheral edge portion.

Further, in the present modified example, because the resin package 100 includes the tapered surface 100*t*, a volume of a portion positioned in the upper cavity 121 between the outer side portion 100*c* of the resin package 100 and the inner wall 121*c* of the upper cavity 121 can be increased. As the resin package 100 is immersed deeper, the voids v generated in the third resin material 142 move from the central portion of the upper cavity 121 (a portion positioned between the central portion of the immersed resin package 100 and the bottom surface 121*b* of the upper cavity 121) toward the inner wall 121*c*, along an arrow 801 illustrated in FIG. 8B. The voids v that reach the vicinity of the inner wall 121*c* of the upper cavity 121 are released to a space above an area between the resin package 100 and the upper end of the inner wall 121*c* of the upper cavity 121 along an arrow 802 illustrated in FIG. 8B. This widens a path for the voids v in the third resin material 142 as the voids v move along the arrow 802 in the third resin material 142, making it possible to more effectively reduce the voids v.

If the upper cavity 121 includes the step surface 123, the path of the voids v is more likely to narrow below (+z side) the step surface 123. In this case, by making the space d between the upper end of the inner wall 121*c* of the upper cavity 121 and the outer side portion 100*c* of the resin package 100 larger, it is possible to ensure a pathway of the voids v. Further, by providing the tapered surface 100*t* in the resin package 100, it is possible to ensure an escape path for the voids v without increasing the volume of the upper cavity 121 (that is, increasing a size of the base portion).

A width of the step surface 123 in a direction parallel to the primary surface 100*a* (corresponding to the width w1 of the step surface of the mold resin portion) may be set to be smaller than the space d between the upper end of the inner wall 121*c* of the upper cavity 121 and the outer side portion 100*c* of the resin package 100. Thus, the path of the voids v can be ensured between the inner wall 121*c* and the outer side portion 100*c* of the resin package 100.

Note that the effect of the tapered surface 100*t* is not dependent on the shape of the upper cavity. For example, even in a case in which the upper cavity does not include a step surface, the effect of facilitating the removal of voids can be achieved by providing the resin package with the tapered surface 100*t*.

Second Modified Example

Figure 9A:
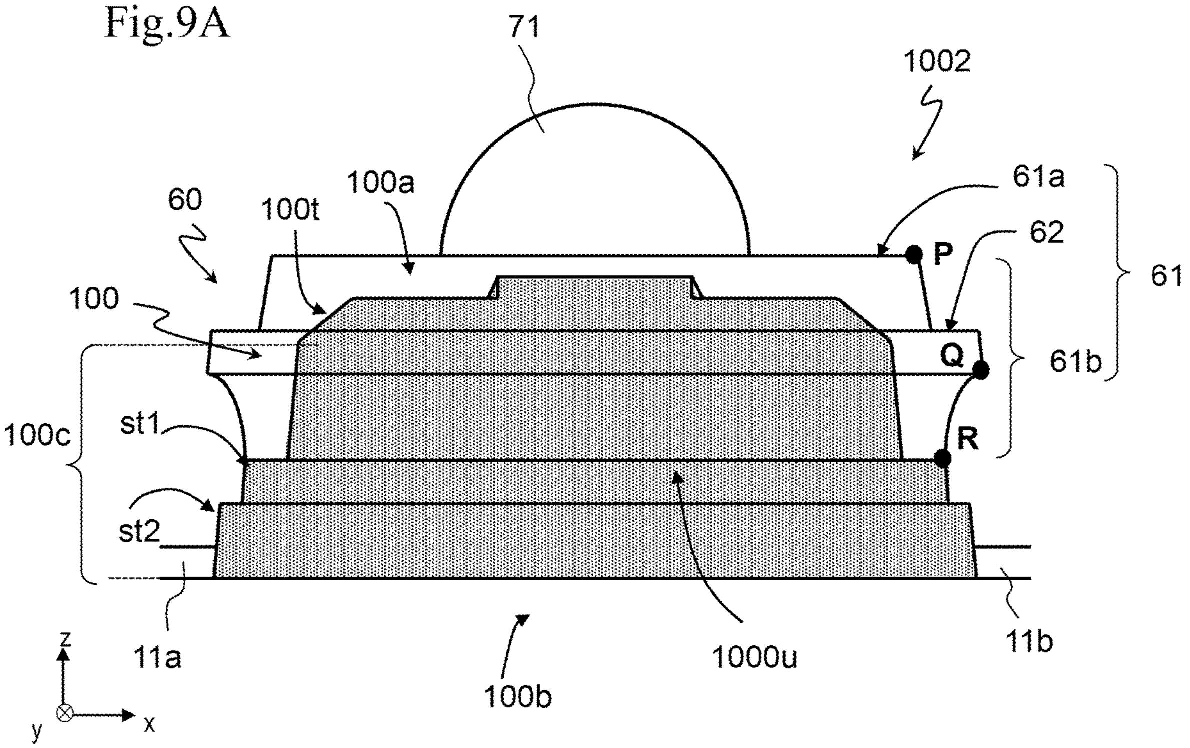
FIG. 9A is a schematic lateral side view of a light-emitting device of a second modified example when viewed in the y-axis direction.
Figure 9B:
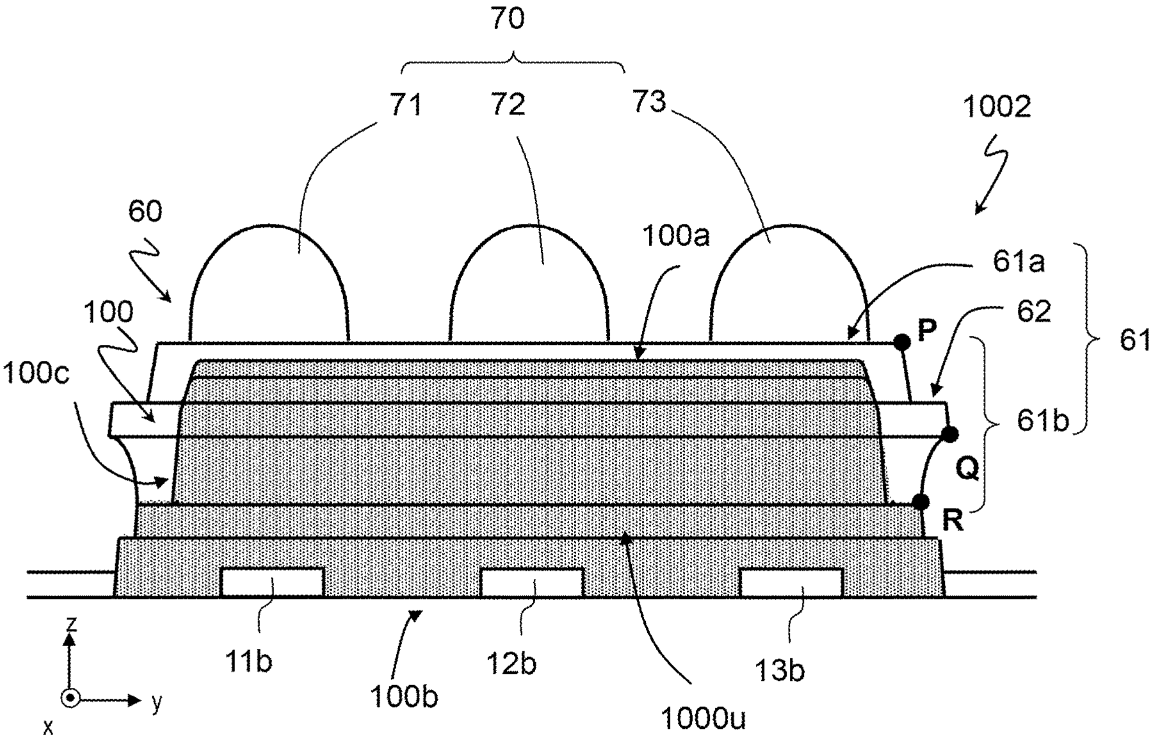
FIG. 9B is a schematic lateral side view of the light-emitting device of the second modified example when viewed in the x-axis direction.
Figure 9C:
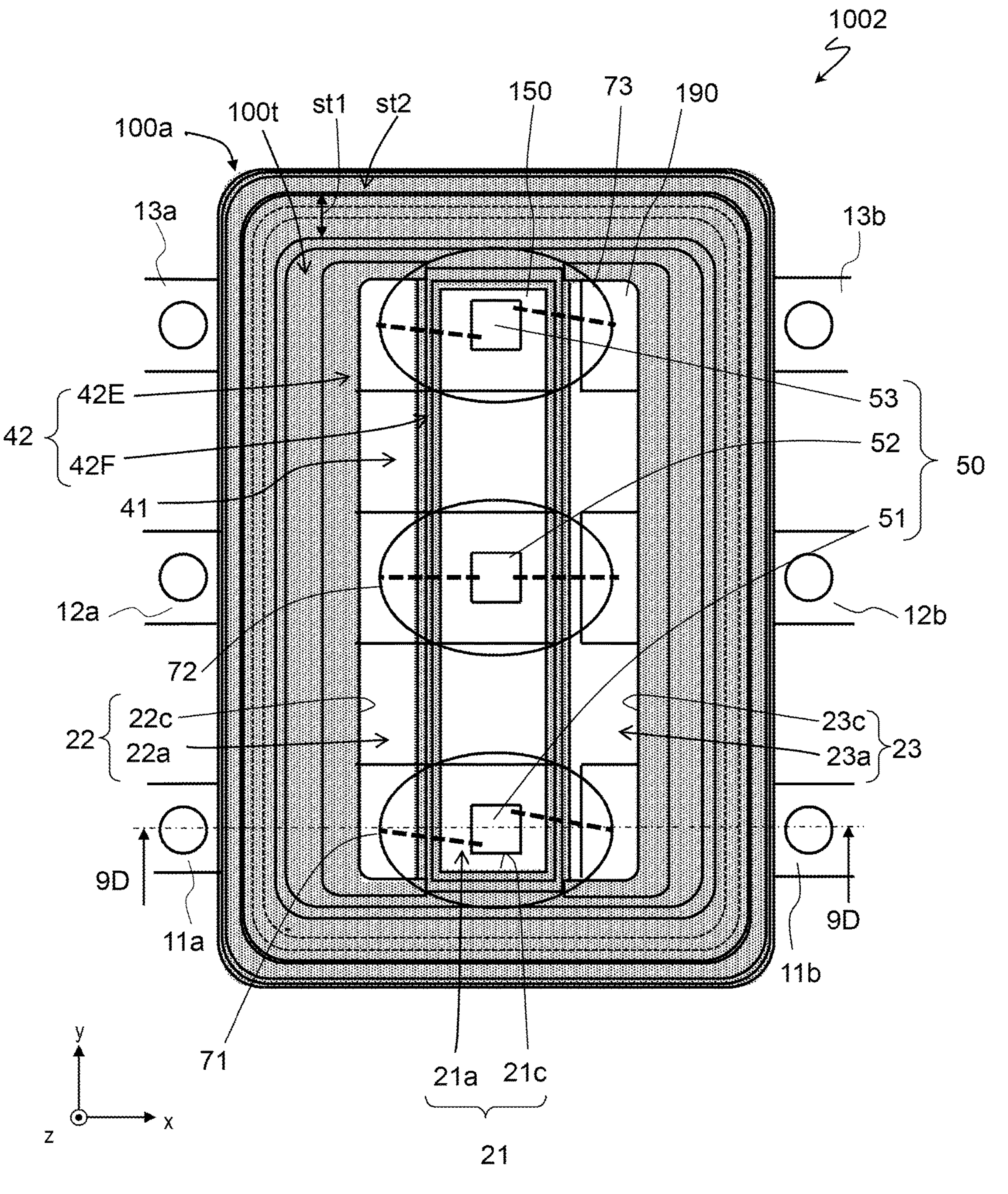
FIG. 9C is a schematic top view of the light-emitting device of the second modified example.
Figure 9D:
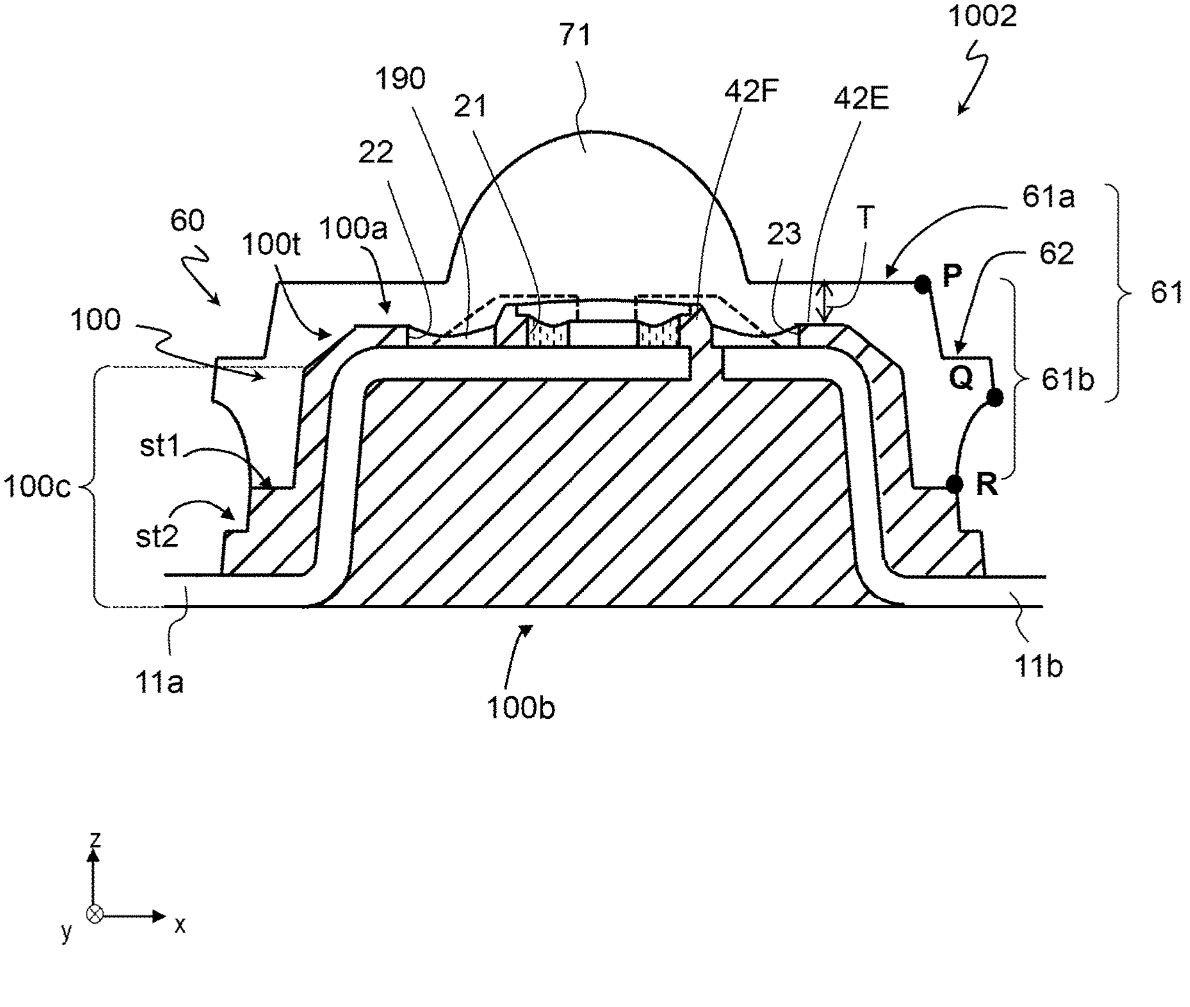
FIG. 9D is a schematic cross-sectional view taken along line 9D-9D illustrated in FIG. 9C.

FIGS. 9A and 9B are each a schematic lateral side view of a light-emitting device 1002 of a second modified example, and FIG. 9C is a top perspective view of the light-emitting device 1002. FIG. 9D is a schematic cross-sectional view taken along line 9D-9D illustrated in FIG. 9C. The perspective view of the light-emitting device 1002 is similar to the schematic view of the light-emitting device 1000 illustrated in FIG. 1.

The light-emitting device 1002 differs from the light-emitting device 1001 according to the first modified example in that, in the primary surface 100*a* of the resin package 100, an upper surface of a resin portion 42F positioned between the first recessed portion 21 and the second recessed portions 22 and 23 is higher than an upper surface of a resin portion 42E positioned outward of the resin portion 42F.

In the present modified example, in the primary surface 100*a*, the first dark-colored resin member 40 includes the first resin portion 41 positioned on the inner upper surface 21*a* of the first recessed portion 21 and the second resin portion 42 that surrounds the inner upper surface 21*a* of the first recessed portion 21 in a plan view and includes an upper surface positioned above an upper surface of the first resin portion 41. In a plan view of the primary surface 100*a* of the resin package 100, the second resin portion 42 includes the resin portion 42E (also referred to as "third resin portion") and the resin portion 42F (also referred to as "fourth resin portion") positioned between the resin portion 42E and the first resin portion 41. The upper surface of the resin portion 42F is positioned above the upper surface of the resin portion 42E, and the upper surface of the resin portion 42E is positioned above the upper surface of the first resin portion 41. In a top view, the tapered surface 100*t* may be formed outward of the resin portion 42E.

According to the configuration described above, as illustrated in FIG. 9D, a thickness of a portion of the base portion 61 positioned on the primary surface 100*a* of the resin package 100 (hereinafter referred to as "upper surface portion") is thin on the resin portion 42F and thick on the first resin portion 41 and on the resin portion 42E. The upper surface portion of the base portion 61 may have a sufficient thickness T excluding a portion overlapping the resin portion 42F in a plan view. Accordingly, in a plan view, a ratio of an area of the upper surface portion of the base portion 61 having the reduced thickness to an area of the upper surface portion of the base portion 61 can be made smaller, making it possible to ensure a strength of the base portion 61.

In the example illustrated in FIG. 9C, the inner upper surface 21*a* of the first recessed portion 21 is surrounded by the resin portion 42F. A lateral surface of the resin portion 42F proximate to the inner upper surface 21*a* is the inner lateral surface 21*c* of the first recessed portion 21.

The resin portion 42F includes, for example, a pair of wall-shaped portions having a rectangular planar shape extending in the y-axis direction and a pair of wall-shaped portions having a rectangular planar shape extending in the x-axis direction, and these wall-shaped portions define each side of the inner upper surface 21*a* having a quadrangular shape in a plan view. The inner upper surfaces 22*a* and 23*a* of the second recessed portions 22 and 23, respectively, are surrounded by the resin portion 42F and the resin portion 42E. For example, the resin portion 42E includes a pair of wall-shaped portions positioned on the −x side and the +x side of the resin portion 42E in a plan view. One of the pair of wall-shaped portions of the resin portion 42E extends so as to define three of the four sides of the inner upper surface 22*a* having a quadrangular shape in a plan view, excluding one side positioned proximate to the resin portion 42F. The other of the pair of wall-shaped portions of the resin portion 42E extends so as to define three of the four sides of the inner upper surface 23*a* having a quadrangular shape in a plan view, excluding one side positioned proximate to the resin portion 42F. That is, in a plan view, one of the four sides of each of the inner upper surfaces 22*a* and 23*a* is defined by the resin portion 42F, and the other three sides are defined by the resin portion 42E. A cross-sectional shape of the resin portion 42F is not particularly limited, but as illustrated in FIG. 9D, the resin portion 42F may have the same shape as the resin portion 42C illustrated in FIG. 2G or may have the same shape as the resin portion 42C illustrated in FIG. 7D.

Third Modified Example

Figure 10A:
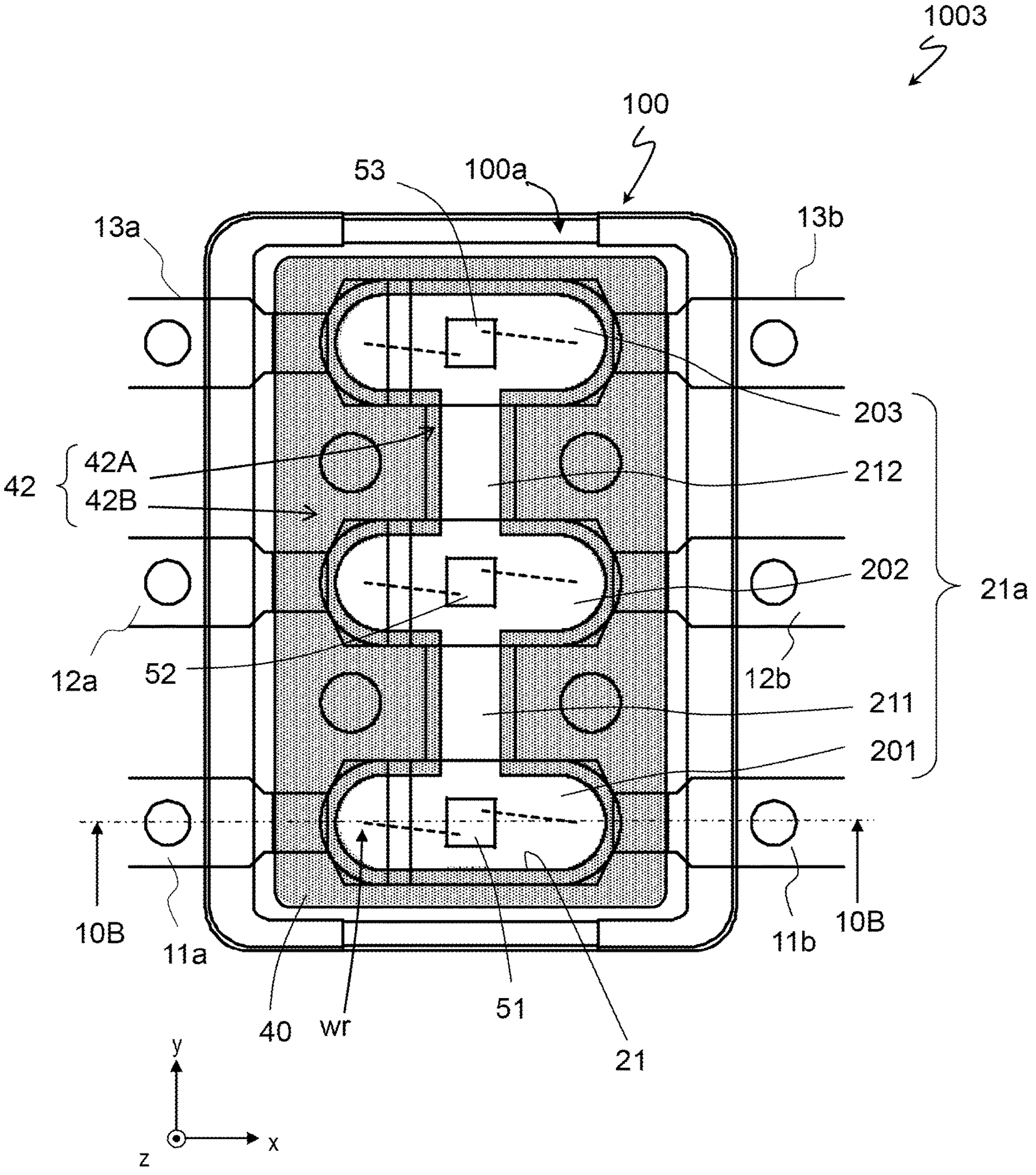
FIG. 10A is a schematic top view of a resin package and light-emitting elements in a light-emitting device of a third modified example.
Figure 10B:
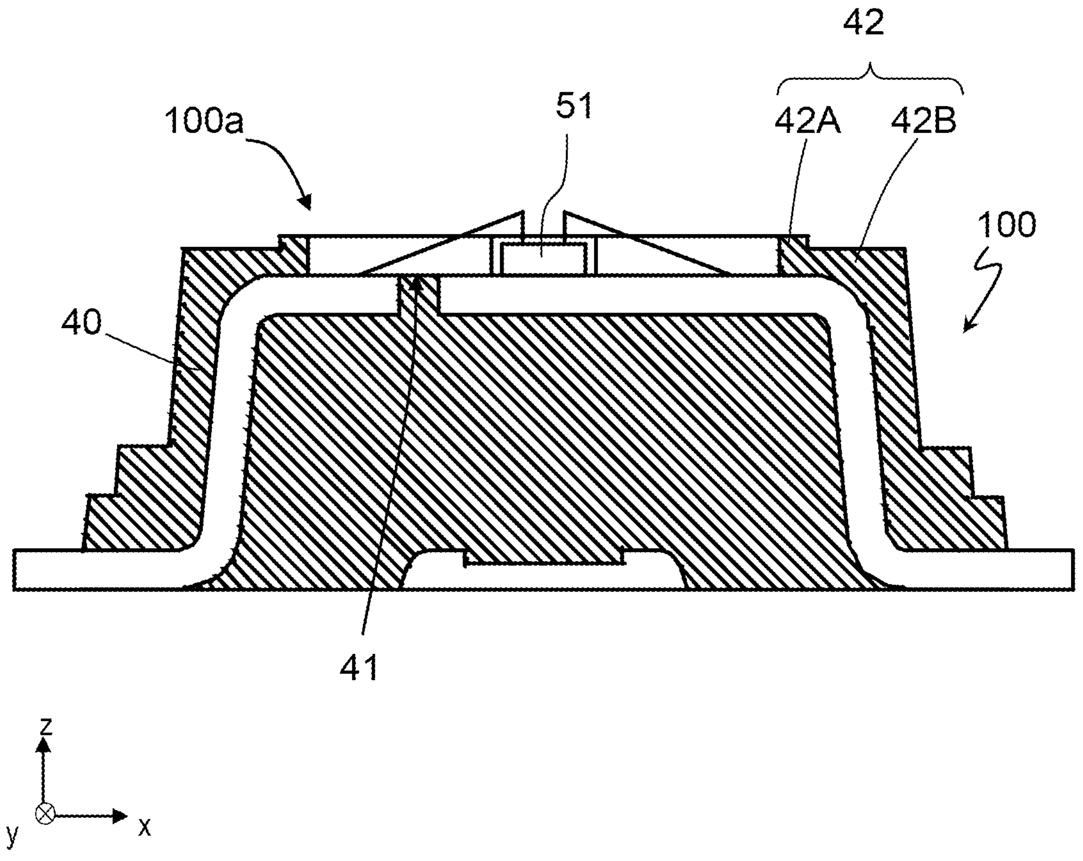
FIG. 10B is a schematic cross-sectional view taken along line 10B-10B illustrated in FIG. 10A.
Figure 10C:
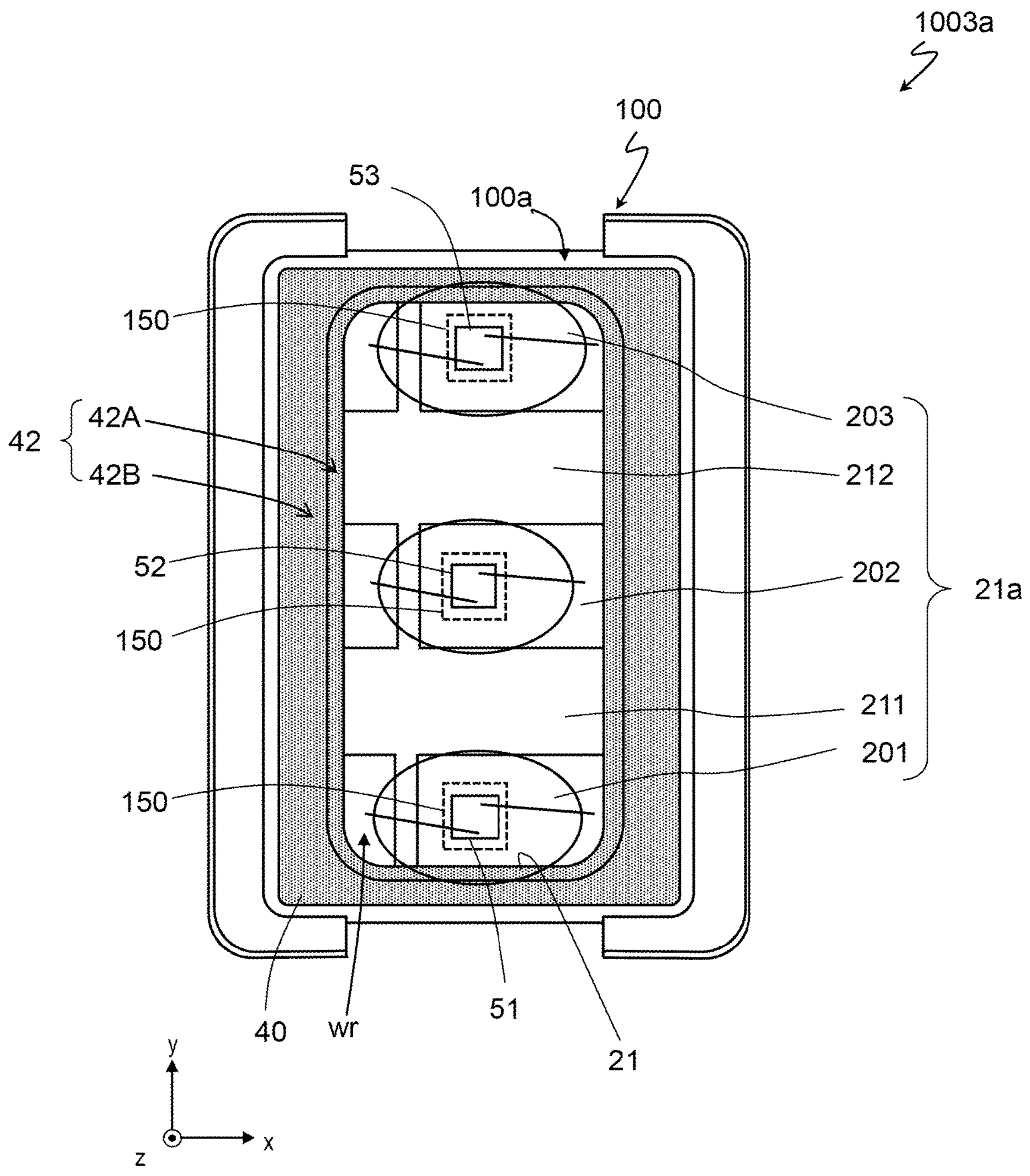
FIG. 10C is a schematic top view of another light-emitting device of the third modified example.

FIG. 10A is a schematic top transparent view of the light-emitting elements and the resin package of a light-emitting device 1003 according to a third modified example, and FIG. 10B is a schematic cross-sectional view taken along line 10B-10B illustrated in FIG. 10A. FIG. 10C is a schematic top view illustrating the light-emitting elements, the resin package, and the lens portions in another light-emitting device 1003*a* of the third modified example.

The light-emitting devices 1003 and 1003*a* of the present modified example differ, in the resin package 100, from the light-emitting device 1000 illustrated in FIGS. 2A to 2G in that the connection region wr for wire bonding is further disposed in the one first recessed portion 21.

In the light-emitting device 1003 illustrated in FIGS. 10A and 10B, the inner upper surface 21*a* of the first recessed portion 21 disposed on the primary surface 100*a* of the resin package 100 includes three element placement regions 201 to 203 and two intervening regions 211 and 212 arrayed in the y-axis direction in a plan view. The element placement regions 201 to 203 are connected to each other via the intervening regions 211 and 212. The element placement region 201 includes a region in which the first light-emitting element 51 is disposed. Similarly, the element placement region 202 includes a region in which the second light-emitting element 52 is disposed. The element placement region 203 includes a region in which the third light-emitting element 53 is disposed. Each of the element placement regions 201 to 203 may also include the connection region wr connecting a corresponding light-emitting element and a pair of leads. The intervening region 211 is positioned between the element placement region 201 and the element placement region 202 in the y-axis direction. A width of the intervening region 211 in the x-axis direction is smaller than widths of the element placement regions 201 and 202 in the x-axis direction. Similarly, the intervening region 212 is positioned between the element placement region 202 and the element placement region 203 in the y-axis direction. A width of the intervening region 212 in the x-axis direction is smaller than widths of the element placement regions 202 and 203 in the x-axis direction.

In the present modified example as well, the reflective member may be disposed in the first recessed portion 21. The reflective member is disposed at least in each of the element placement regions 201 to 203. The reflective member may also be disposed in the intervening regions 211 and 212.

The light-emitting device 1003*a* illustrated in FIG. 10C differs from the light-emitting device 1003 illustrated in FIGS. 10A and 10B in that the widths of the element placement regions 201 to 203 in the x-axis direction and the widths of the intervening regions 211 and 212 in the x-axis direction are the same. As illustrated, the reflective member 150 may only be disposed in each of the element placement regions 201 to 203 in the first recessed portion 21. Such a structure is obtained by, for example, arranging the first light-emitting element 51 to the third light-emitting element 53 each covered by the reflective member 150 on the lateral surface in advance on the inner upper surface 21*a* of the first recessed portion 21. With this structure, the reflective member 150 can be disposed on the inner upper surface 21*a* of the first recessed portion 21 only in a region in the vicinity of each of the first light-emitting element 51 to the third light-emitting element 53. Further, the second dark-colored resin member 190 may be disposed in a region where the first light-emitting element 51 to the third light-emitting element 53 each covered by the reflective member 150 on the lateral surface in advance are not disposed.

Fourth Modified Example

Figure 11A:
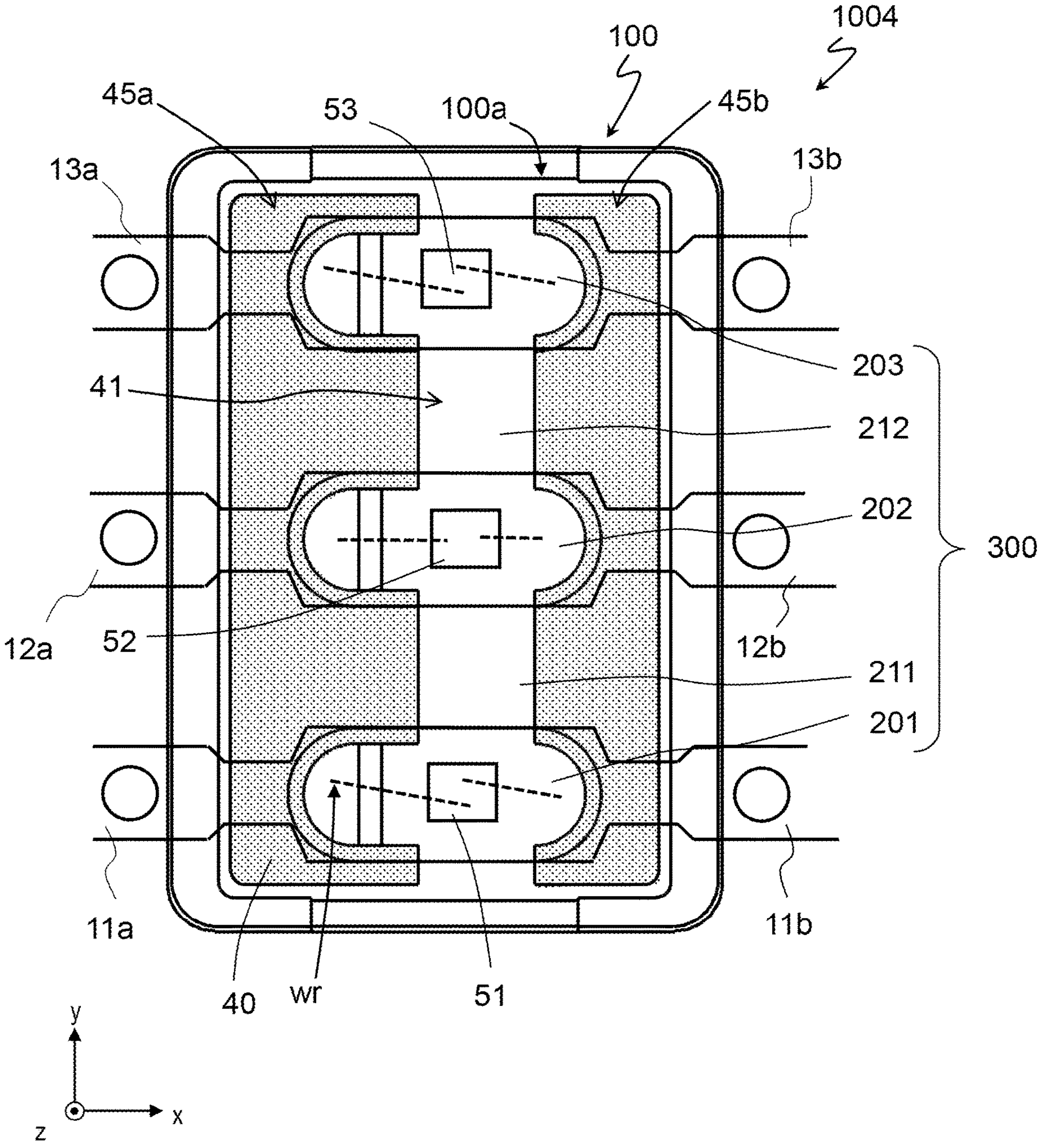
FIG. 11A is a schematic top view of a resin package and light-emitting elements in a light-emitting device of a fourth modified example.
Figure 11B:
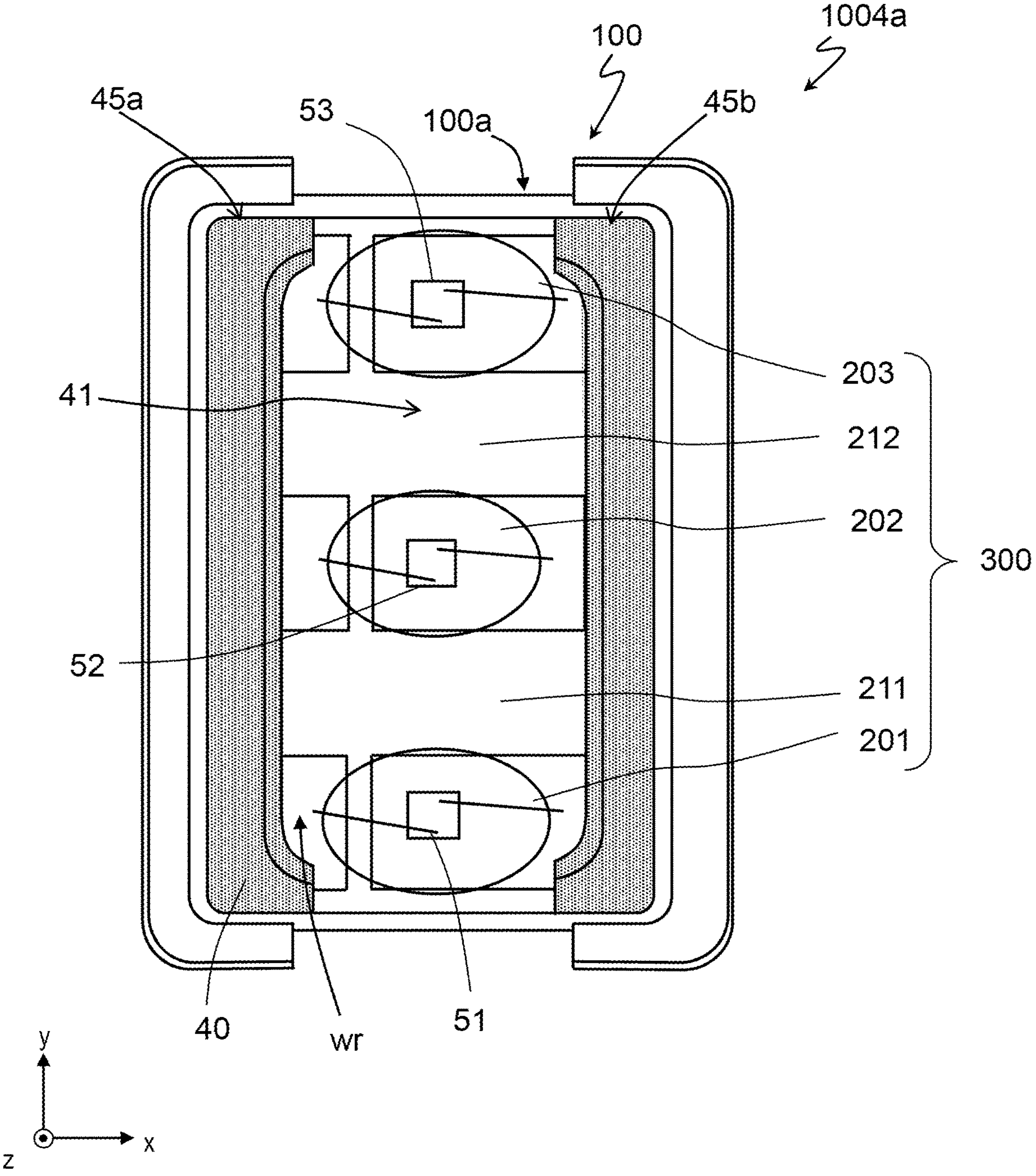
FIG. 11B is a schematic top view of another light-emitting device of the fourth modified example.
Figure 11C:
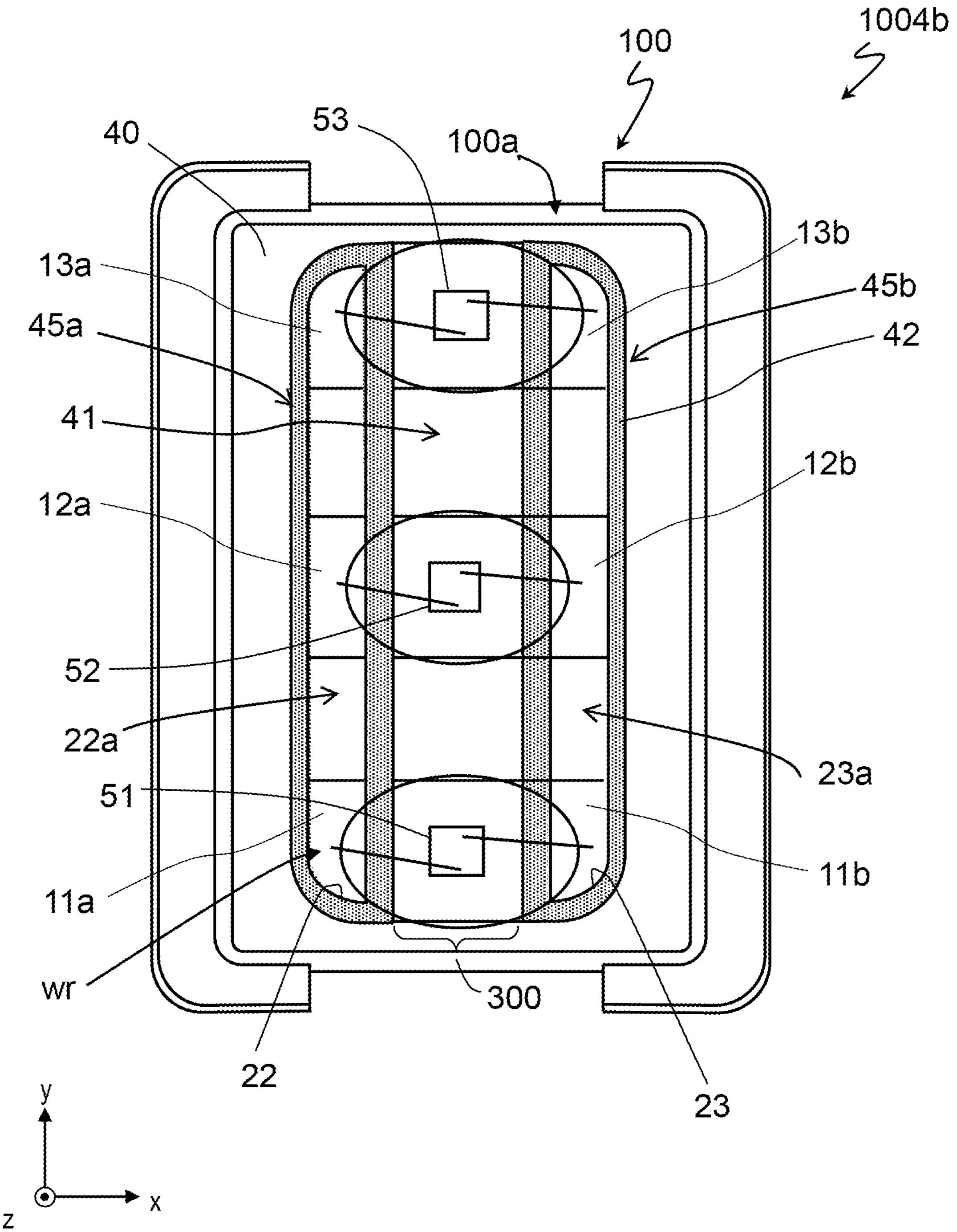
FIG. 11C is a schematic top view of yet another light-emitting device of the fourth modified example.

FIG. 11A is a schematic top transparent view illustrating the light-emitting elements and the resin package of a light-emitting device 1004 according to a fourth modified example. FIGS. 11B and 11C are schematic top views respectively illustrating the light-emitting elements, the resin package, and the lens portions of other light-emitting devices 1004*a* and 1004*b* of the fourth modified example.

The light-emitting devices 1004, 1004*a*, and 1004*b* of the present modified example differ from the light-emitting devices 1000 to 1003 described above in that the first recessed portion 21 is not provided in the primary surface 100*a* of the resin package 100. That is, in the present modified example, the region in which the light-emitting elements are disposed is not surrounded by a resin portion including an upper surface higher than the first resin portion 41. In the manufacture of the light-emitting devices 1004, 1004*a*, and 1004*b*, the first light-emitting element 51 to the third light-emitting element 53 each covered by the reflective member on the lateral surface in advance are preferably disposed on the primary surface 100*a* of the resin package 100 (refer to FIG. 10C).

In the light-emitting device 1004 illustrated in FIG. 11A, the first dark-colored resin member 40 includes a plurality of protruding portions 45*a* and 45*b* on the primary surface 100*a* of the resin package 100. In the illustrated example, the two protruding portions 45*a* and 45*b* are provided, but the number of protruding portions is not particularly limited. The primary surface 100*a* includes a first region 300 positioned in a region other than a region where the protruding portions 45*a* and 45*b* are disposed. A first region 300 includes exposed regions of the plurality of corresponding leads 11*a* to 13*b* and the first resin portion 41. The upper surface of each of the protruding portions 45*a* and 45*b* is positioned above (+z direction) the first region 300.

The protruding portions 45*a* and 45*b* are spaced apart from each other. In this example, the protruding portion 45*b* is disposed on the +x side of the protruding portion 45*a* and spaced apart from the protruding portion 45*a*. The protruding portions 45*a* and 45*b* include the corresponding side walls facing each other with the element placement regions 201 to 203 and the intervening regions 211 and 212 interposed therebetween. These sidewalls define a part of a peripheral edge of the first region 300. The other parts of the peripheral edge of the first region 300 (here, the portions positioned on the −y side and the +y side) may be defined by a peripheral edge of the primary surface 100*a* of the resin package 100.

Each of the first light-emitting element 51 to the third light-emitting element 53 is disposed in the exposed region 30 of one of the plurality of leads 11*a* to 13*b* in the first region 300. The first region 300 may include the connection region wr.

In the light-emitting device 1004 illustrated in FIG. 11A, the first region 300 can include the element placement regions 201 to 203 and the intervening regions 211 and 212, similarly to the inner upper surface of the first recessed portion in the third modified example. In a plan view, the protruding portion 45*a* includes a side wall that defines peripheral edges of the corresponding portions, which are positioned leftward (−x side) of the first light-emitting element 51 to the third light-emitting element 53, for example, of the element placement regions 201 to 203 and the intervening regions 211 and 212. The protruding portion 45*b* includes a side wall that defines peripheral edges of the corresponding portions, which are positioned rightward (+x side) of the first light-emitting element 51 to the third light-emitting element 53, for example, of the element placement regions 201 to 203 and the intervening regions 211 and 212.

Shapes of the protruding portions 45*a*, 45*b* in a plan view, a shape of the first region 300 defined by the protruding portions 45*a*, 45*b* in a plan view, and the like in the present modified example are not limited to the example illustrated in FIG. 11A. For example, in the light-emitting device 1004*a* illustrated in FIG. 11B, the protruding portions 45*a* and 45*b* are configured, in the first region 300, so that the widths of the element placement regions 201 to 203 in the x-axis direction and the widths of the intervening regions 211 and 212 in the x-axis direction are the same. As illustrated in FIG. 11B, the lateral surface of each of the protruding portions 45*a* and 45*b* on the first region 300 side may be substantially parallel to the y-axis direction. Further, the width of each of the protruding portions 45*a* and 45*b* in the x-axis direction may be substantially constant across the y-axis direction.

The light-emitting device 1004*a* may include, instead of the protruding portion 45*a*, a plurality of protruding portions spaced apart from each other. Similarly, the light-emitting device 1004*a* may include, instead of the protruding portion 45*b*, a plurality of protruding portions spaced apart from each other. Each of the plurality of protruding portions may include a lateral surface positioned on the corresponding one lead and defining a peripheral edge of the corresponding element placement regions 201 to 203. In a plan view, a width of each protruding portion in the y-axis direction may be larger than a width of the corresponding lead.

The light-emitting device 1004*b* illustrated in FIG. 11C differs from the light-emitting device 1004*a* illustrated in FIG. 11B in including the second recessed portions 22 and 23 on the +x side and the −x side of the first region 300, respectively, in the primary surface 100*a* of the resin package 100. The inner upper surfaces 22*a* and 23*a* of the second recessed portions 22 and 23, respectively, each include the connection region wr for wire bonding. In a plan view, the protruding portions 45*a* and 45*b* may have annular shapes surrounding the inner upper surfaces 22*a* and 23*a* of the second recessed portions 22 and 23, respectively. In a plan view, each of the second recessed portions 22 and 23 may extend in the y-axis direction and include, for example, a plurality (here, three) of the connection regions wr of the leads. In this example, the inner upper surface 22*a* of the second recessed portion 22 includes the connection regions wr for electrically connecting the first light-emitting element 51 to the third light-emitting element 53 to the leads 11*a* to 13*a*, respectively. The inner upper surface 23*a* of the second recessed portion 23 includes the connection regions wr for electrically connecting the first light-emitting element 51 to the third light-emitting element 53 to the leads 11*b* to 13*b*, respectively. Widths of the second recessed portions 22 and 23 in the x-axis direction may be substantially constant across the y-axis direction. Further, a width of the first region 300 in the x-axis direction may be substantially constant across the y-axis direction.

Fifth Modified Example

Figure 12:
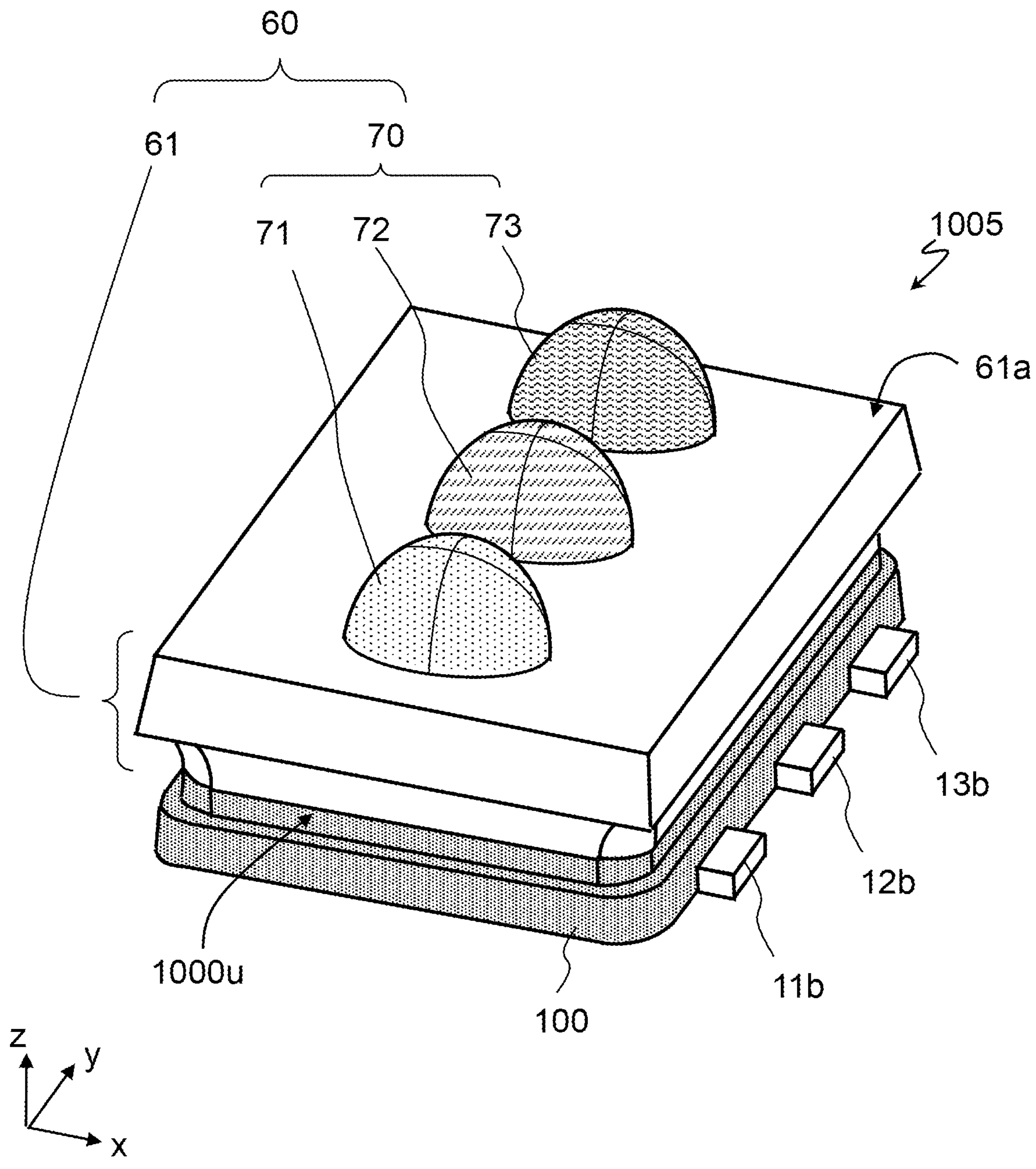
FIG. 12 is a schematic perspective view of a light-emitting device according to a fifth modified example.

FIG. 12 is a schematic perspective view of a light-emitting device 1005.

The light-emitting device 1005 differs from the light-emitting devices 1000 to 1003 described above in that the lens portions 70 are colored to the same type of color as emitted light colors of the corresponding light-emitting elements.

By disposing the lens portion 70, colored to the same type of color as the emitted light color of the light-emitting element 50, above (+z direction) the light-emitting element 50, it is possible to reduce deterioration in the display contrast caused by external light reflection on the reflective member surrounding the light-emitting element 50 and on the exposed surface of the lead while the light-emitting elements 50 are turned off, without interfering the emitted light color when the light-emitting element 50 is turned on.

Furthermore, in a case in which the first light-emitting element 51, the second light-emitting element 52, and the third light-emitting element 53 are all turned off, due to the subtractive color mixing of the first lens portion 71, the second lens portion 72, and the third lens portion 73, the first lens portion 71, the second lens portion 72, and the third lens portion 73 each appear darker than the color with which it is colored, that is, appear as a color of a lower color value than that of the color with which it is colored. Accordingly, the emission surface of the light-emitting device 1005 appears darker, so that the display contrast can be further increased.

The mold resin portion 60 of the light-emitting device 1005 can be manufactured by, for example, a casting method.

Figure 13A:
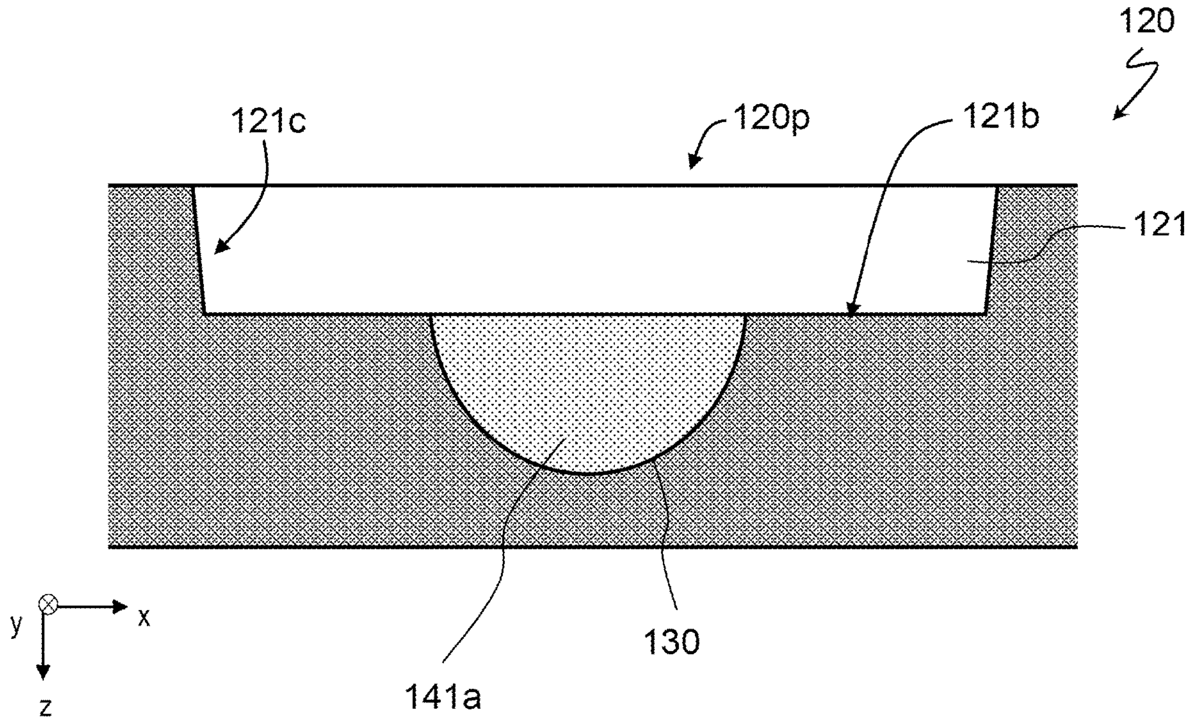
FIG. 13A is a step cross-sectional view illustrating a manufacturing step of the light-emitting device of the fifth modified example.
Figure 13B:
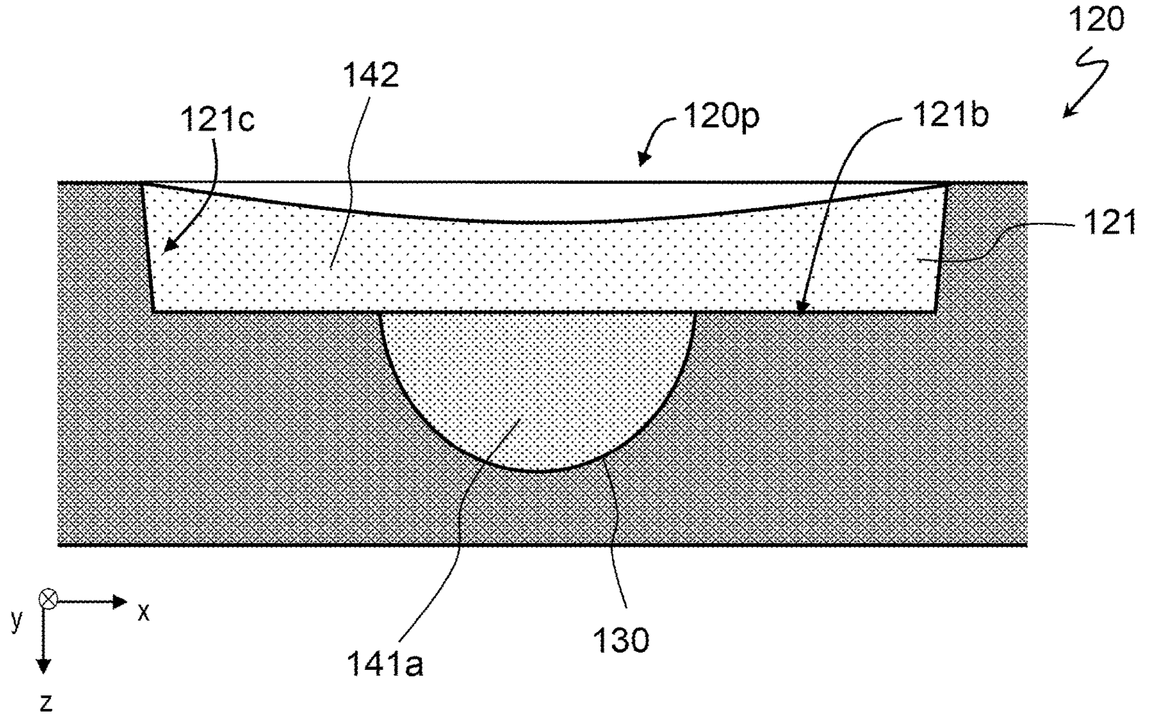
FIG. 13B is a step cross-sectional view illustrating a manufacturing step of the light-emitting device of the fifth modified example.

FIGS. 13A and 13B are step cross-sectional views each illustrating a method of forming the mold resin portion 60 according to a casting method.

As illustrated in FIG. 13A, a provisionally cured body 141*a* is obtained by injecting and provisionally curing a resin material colored to the same type of color as the emitted light color of the corresponding light-emitting element into each of the three lower cavities 130 of the prepared casting case 120. Subsequently, as illustrated in FIG. 13B, the third resin material 142 having light transmissivity is injected onto the provisionally cured body 141*a*. Subsequently, similarly to the step described above with reference to FIG. 4F, an immersion step of immersing the first structure including the resin package and the light-emitting elements in the third resin material 142 is performed. Subsequently, the provisionally cured body 141*a* of the colored resin material and the third resin material 142 having light transmissivity are fully cured, thereby obtaining the mold resin portion 60. The other steps are similar to those of the method described above with reference to FIGS. 4A to 4G. Further, the resin materials, structure of the casting case, and the like used are similar to the materials and the structure described above.

Sixth Modified Example

Figure 14B:
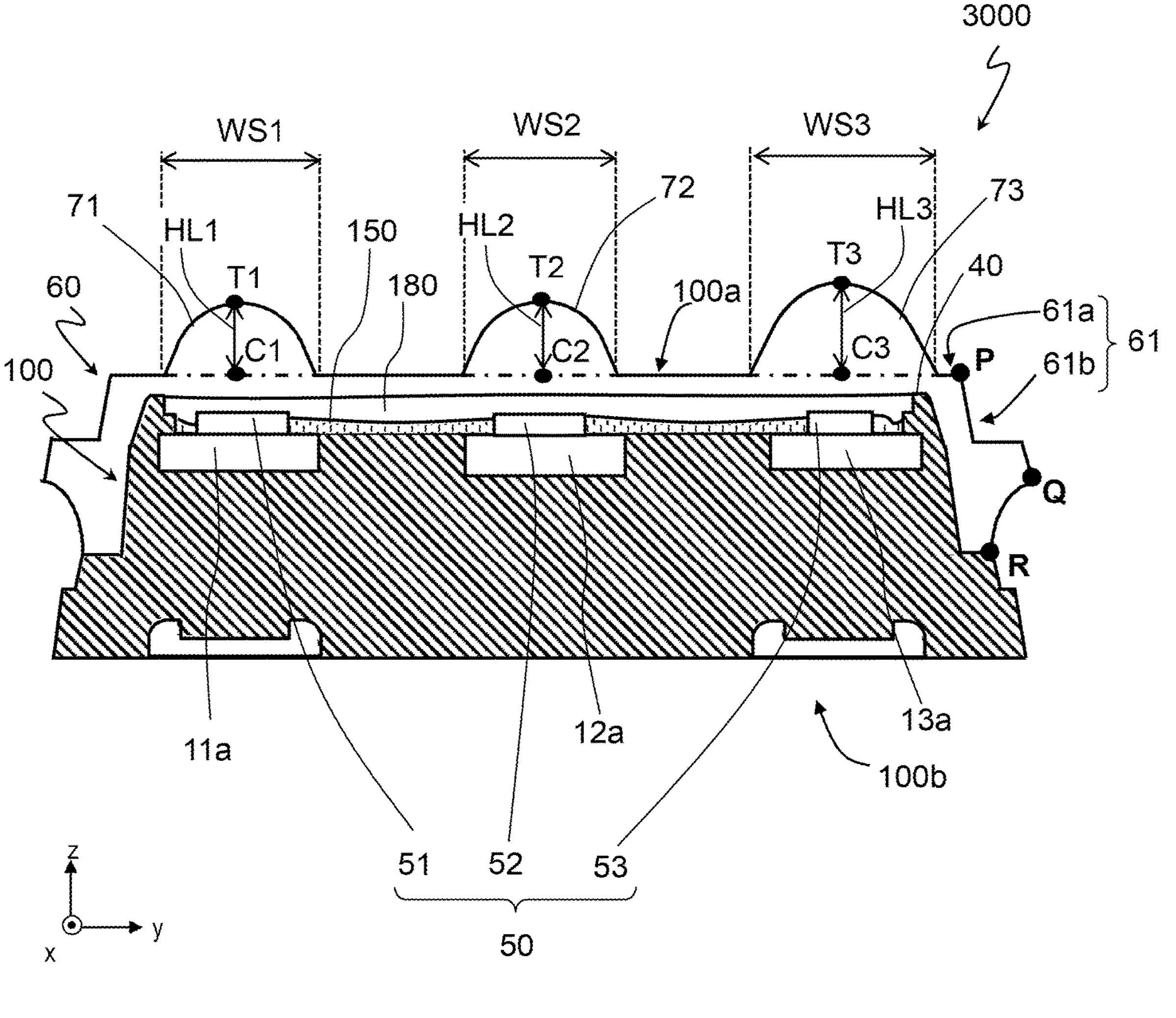
FIG. 14B is a schematic cross-sectional view taken along line 14B-14B illustrated in FIG. 14A.

FIG. 14A is a schematic top view of a light-emitting device 3000 of a sixth modified example, and FIG. 14B is a schematic cross-sectional view taken along line 14B-14B illustrated in FIG. 14A.

The light-emitting device 3000 according to the sixth modified example differs from the light-emitting device 1000 illustrated in FIGS. 1 and 2A to 2H and the light-emitting device 1001 illustrated in FIGS. 7A to 7D in that at least one light-emitting element of the plurality of light-emitting elements 50 is disposed non-parallel to the other light-emitting elements in a plan view, and that a height of a vertex of at least one lens portion of the plurality of lens portions 70 differs from a height of vertices of the other lens portions.

In the present modified example, the first light-emitting element 51, the second light-emitting element 52, and the third light-emitting element 53 each have a rectangular planar shape. In a plan view, each side of the rectangular shape of at least one light-emitting element (here, the third light-emitting element 53) of the first light-emitting element 51, the second light-emitting element 52, and the third light-emitting element 53 is non-parallel to each side of the rectangular shapes of the other light-emitting elements (here, the first light-emitting element 51 and the second light-emitting element 52).

This makes it possible to improve the light distribution controllability of the light-emitting device 3000 and achieve the desired light distribution, as described in detail below.

Structure and Arrangement of Light-Emitting Elements

The first light-emitting element 51 to the third light-emitting element 53 each include a first surface positioned proximate to the plurality of leads 11*a* to 13*b*, a second surface positioned opposite to the first surface (that is, proximate to the lens portion), and two electrodes positioned on the second surface. Note that, in each of the first light-emitting element 51 to the third light-emitting element 53, both the positive and negative electrodes will be described as being positioned on the second surface, but one may be positioned on the first surface and the other may be positioned on the second surface.

In the example illustrated in FIG. 14A, two electrodes (positive and negative electrodes) ce1, ce2 are positioned on the second surface of each of the first light-emitting element 51 to the third light-emitting element 53. The two electrodes ce1, ce2 of, among the first light-emitting element 51 to the third light-emitting element 53, each of the first light-emitting element 51 and second light-emitting element 52 are disposed at two mutually facing corner portions (that is, at opposing corner portions) on the second surface having a rectangular shape. In contrast, the two electrodes ce1, ce2 of the third light-emitting element 53 are disposed near centers of two sides facing each other on the second surface having a rectangular shape. Although the emitted light colors of the first light-emitting element 51 to the third light-emitting element 53 are not particularly limited, in the present modified example, the first light-emitting element 51 may be a red light-emitting element that emits red light, the second light-emitting element 52 may be a blue light-emitting element that emits blue light, and the third light-emitting element 53 may be a green light-emitting element that emits green light.

In the example illustrated in FIG. 14A, the first light-emitting element 51 to the third light-emitting element 53 are disposed in a single row on a line m0 that is virtual. Here, the line m0 is a line connecting center points C1 to C3 of the first lens portion 71 to the third lens portion 73, respectively, in a plan view. The four sides constituting each rectangular planar shape of the first light-emitting element 51 and the second light-emitting element 52 (here, four sides constituting outer edges of each rectangular shape of the second surface) are non-parallel to the line m0. In a plan view, the first light-emitting element 51 and the second light-emitting element 52 may each be disposed so that one pair of opposing sides of the outer edges of the rectangular shape of the second surface forms angles of 45° with the line m0. On the other hand, one pair of opposing sides of the rectangular planar shape of the third light-emitting element 53 (here, one pair of opposing sides of the outer edges of the rectangular shape of the second surface) is parallel to the line m0.

In this description, the smallest angle $\alpha$ of the angles formed by each side of the outer edges of the rectangular shape of the light-emitting element and the line m0 in a plan view is referred to as an "inclination angle relative to the line m0". In the illustrated example, the inclination angle $\alpha$ of each of the first light-emitting element 51 and the second light-emitting element 52 relative to the line m0 is 45°.

In a light-emitting device having a light-emitting element and a lens positioned above the light-emitting element and covering the light-emitting element, as the size of the lens decreases, the light distribution of the light-emitting device is more susceptible to being affected by light distribution characteristics of a near field of the light-emitting element. With this structure, light distribution control of the light-emitting device by adjusting the curvature of the lens may be difficult. The light distribution characteristics of the near field of the light-emitting element can be changed by, for example, the structure, such as the positions of the electrodes in the light-emitting element or the electrode size.

In contrast, in the present modified example, it is possible to achieve the light-emitting device 3000 having a desired light distribution (directional properties) by disposing the first light-emitting element 51 to the third light-emitting element 53 in the resin package 100 taking into consideration the positions of the electrodes of the first light-emitting element 51 to the third light-emitting element 53 and, more specifically, taking into consideration the light emission luminance distribution reflecting the positions and the like of electrodes on the second surface of these light-emitting elements.

Below, a relationship between the light emission luminance distribution of the light-emitting elements and the arrangement of the light-emitting elements in a plan view will be specifically described.

Figure 15A:
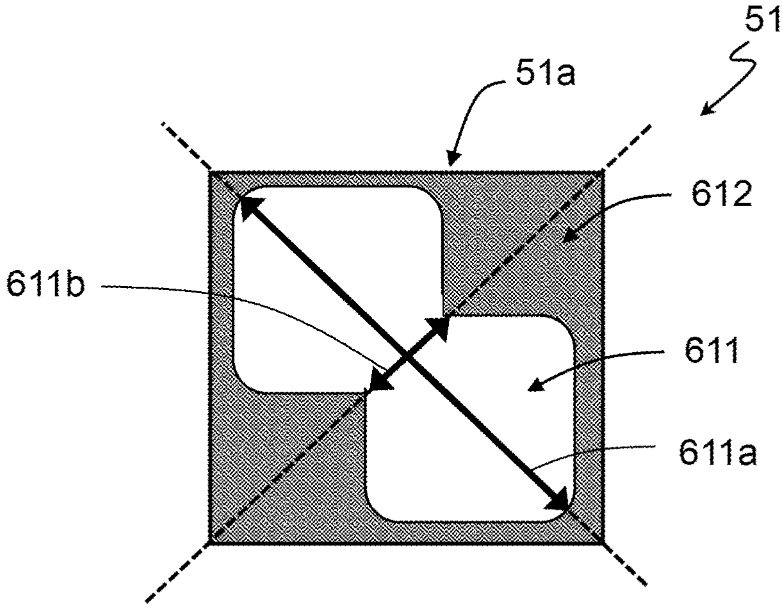
FIG. 15A is a schematic plan view exemplifying a light emission luminance distribution of a first light-emitting element 51.
Figure 15B:
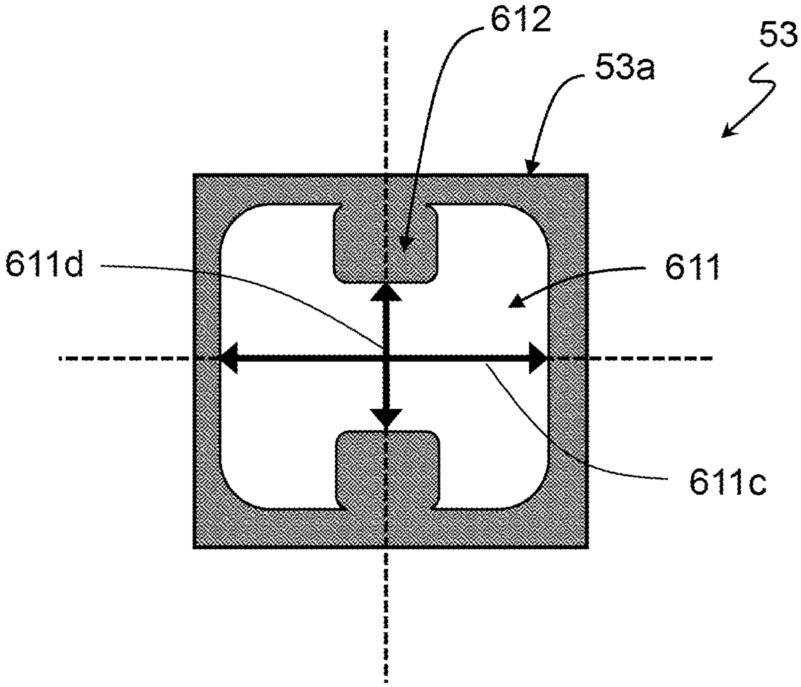
FIG. 15B is a schematic plan view exemplifying a light emission luminance distribution of a third light-emitting element 53.

FIGS. 15A and 15B are schematic plan views exemplifying the light emission luminance distribution of the second surfaces 51*a* and 53*a* of the first light-emitting element 51 and the third light-emitting element 53, respectively. In FIGS. 15A and 15B, a region having high light emission luminance is indicated in white, and a region having a light emission luminance lower than that of the region indicated in white is illustrated in black. In the following description, a region of the second surfaces 51*a* and 53*a* having high light emission luminance indicated in white is referred to as a "light-emitting portion", and a region having low light emission luminance indicated in black is referred to as a "non-light-emitting portion". The electrodes of each of the first light-emitting element 51 and the third light-emitting element 53 are connected to the leads by wires.

As illustrated in FIG. 15A, the light emission luminance distribution of the second surface 51*a* of the first light-emitting element 51 includes a light-emitting portion 611 and a non-light-emitting portion 612 having brightness lower than that of the light-emitting portion 611. The non-light-emitting portion 612 is positioned at two corner portions facing each other. The position of the non-light-emitting portion 612 corresponds to the position of the electrodes ce1 and ce2 (FIG. 14A). In this description, "non-light-emitting portion" includes not only the region of the second surface that does not emit light, but also regions where light is not emitted due to formation of the electrodes and regions that appear dark due to shadows of the wires. Given 100% as the maximum brightness of the second surface 51*a*, the brightness of the light-emitting portion 611 is in a range from 40% to 100%, and the brightness of the non-light-emitting portion 612 is in a range from 0% to less than 40%. In this example, a width 611*a* of the light-emitting portion 611 on a diagonal line connecting two corner portions of the second surface 51*a* where the electrodes are not formed is greater than a width 611*b* on a diagonal line connecting two corner portions where the electrodes are formed. Note that "the width of the light-emitting portion on a diagonal line" refers to a length of the light-emitting portion cut by the diagonal line, that is, a length of a portion of the light-emitting portion that overlaps the diagonal line in a plan view.

The second light-emitting element 52 includes the electrodes at positions similar to those of the first light-emitting element 51. Accordingly, in the light emission luminance distribution of the second light-emitting element 52 as well, similarly to the first light-emitting element 51, a width of the light-emitting portion on a diagonal line connecting two corner portions of the second surface where the electrodes are not formed can be greater than a width of the light-emitting portion on a diagonal line connecting two corner portions where the electrodes are formed.

As illustrated in FIG. 15B, the light emission luminance distribution of the second surface 53*a* of the third light-emitting element 53 includes the light-emitting portion 611 and the non-light-emitting portion 612 positioned near centers of two sides facing each other and having brightness lower than that of the light-emitting portion 611. In FIG. 15B, the position of the non-light-emitting portion 612 of the third light-emitting element 53 corresponds to the positions of the electrodes ce1 and ce2 in FIG. 14A. A width 611*c* of the light-emitting portion 611 on a line connecting central portions of two sides of the second surface 53*a* where the electrodes are not formed is greater than a width 611*d* of the light-emitting portion 611 on a line connecting central portions of two sides where the electrodes are formed. Note that "the width of the light-emitting portion on a line connecting central portions" refers to a length of the light-emitting portion cut by the line connecting the central portions of the two sides, that is, a length of a portion of the light-emitting portion that overlaps the line connecting the central portions of the two sides in a plan view.

In the present modified example, the first light-emitting element 51 to the third light-emitting element 53 are preferably disposed on the line m0 connecting the center points C1 to C3 of the first lens portion 71 to the third lens portion 73, respectively, in a plan view. In a plan view, a center of the second surface of each of the first light-emitting element 51 to the third light-emitting element 53 may be disposed on the line m0.

Figure 16:
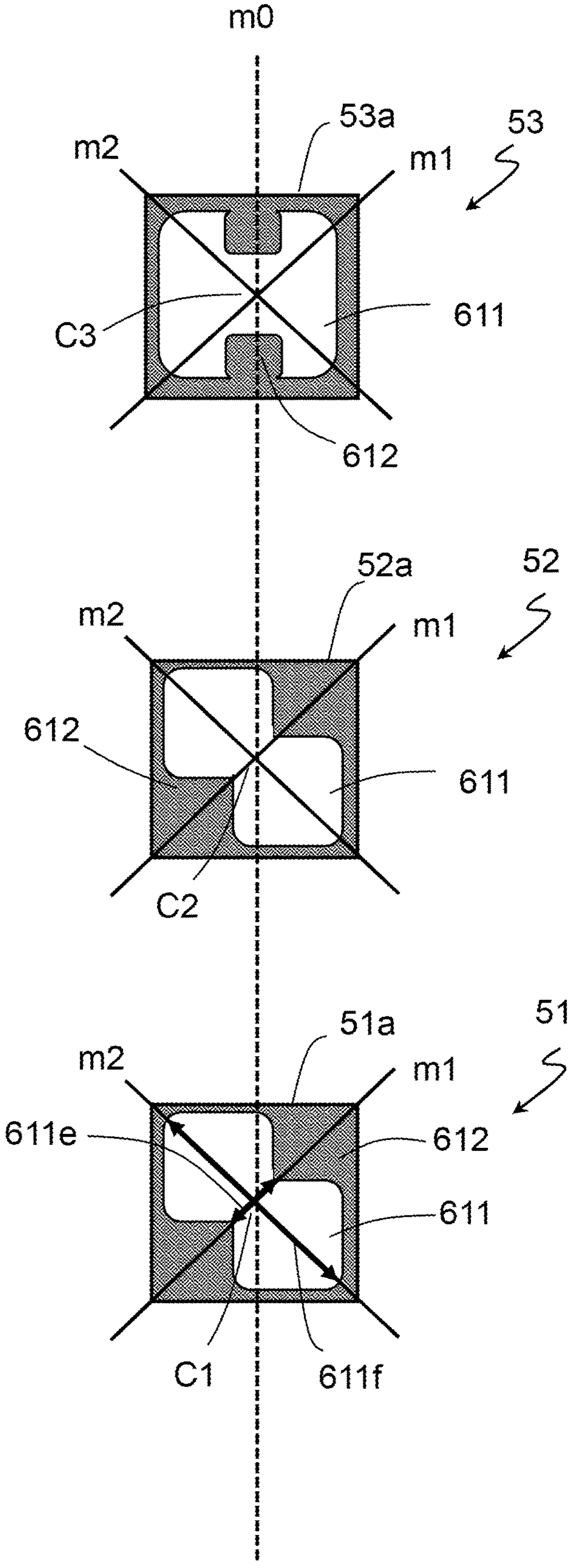
FIG. 16 is a schematic plan view illustrating an arrangement of the first light-emitting element 51 to the third light-emitting element 53 in a reference example.
Figure 17:
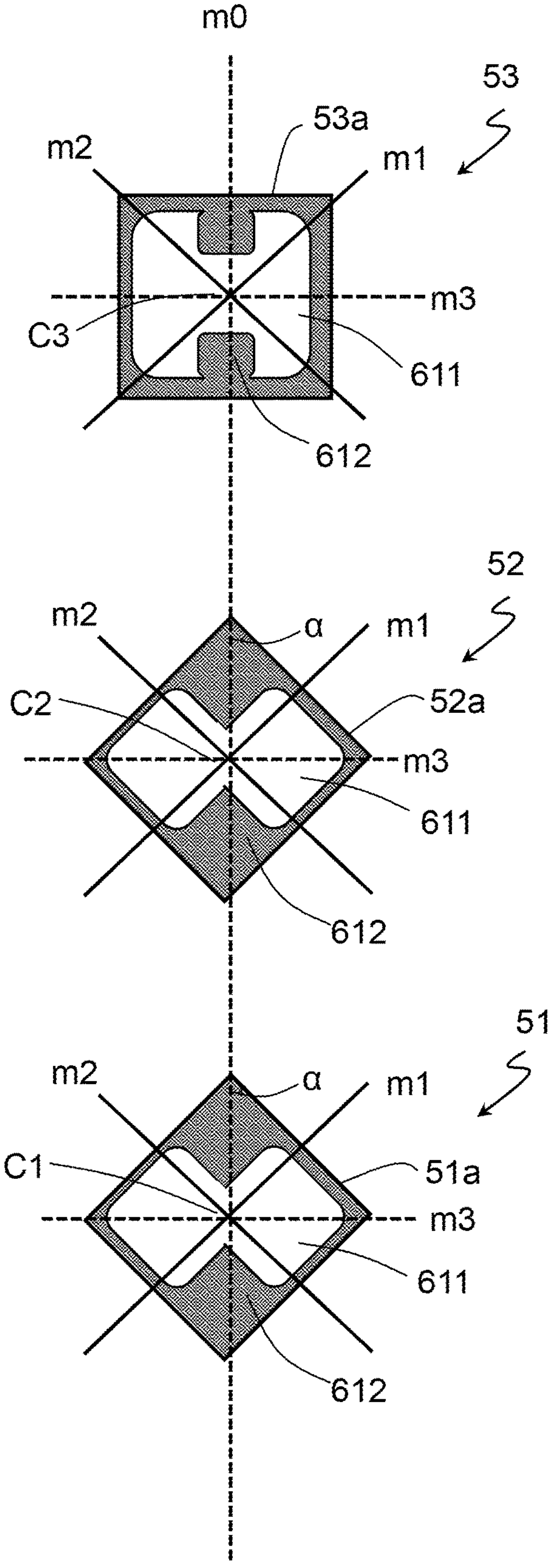
FIG. 17 is a schematic plan view illustrating an arrangement of the first light-emitting element 51 to the third light-emitting element 53 in the light-emitting device illustrated in FIG. 14A.

FIG. 16 is a schematic plan view illustrating an arrangement of a reference example of the first light-emitting element 51 to the third light-emitting element 53 having the light emission luminance distributions described with reference to FIGS. 15A and 15B. FIG. 17 is a schematic plan view illustrating the arrangement of the first light-emitting element 51 to the third light-emitting element 53 in the light-emitting device 3000 of the present modified example illustrated in FIGS. 14A and 14B. In FIGS. 16 to 17, only the second surfaces 51*a* to 53*a* of the first light-emitting element 51 to the third light-emitting element 53 and the light emission luminance distributions of the first light-emitting element 51 to the third light-emitting element 53, respectively, are illustrated. Other components such as the lens portions are omitted. Further, these drawings also illustrate, in each of the first light-emitting element 51 to the third light-emitting element 53, a line m1 virtually passing through the center of the second surface and forming a 450 angle clockwise from the line m0, and a line m2 virtually passing through the center of the second surface and forming a 1350 angle clockwise from the line m0. Further, FIG. 17 illustrates, in each of the first light-emitting element 51 to the third light-emitting element 53, a line m3 virtually passing through the second surface and orthogonal to the line m0 with a dashed line. In the example illustrated in FIGS. 16 to 17, the centers of the second surfaces of the first light-emitting element 51 to the third light-emitting element 53 match the center points C1 to C3 of the first lens portion to the third lens portion, respectively.

In the reference example illustrated in FIG. 16, in a plan view, the two sides (one set of opposing sides) of the second surface, having a rectangular shape, in each of the first light-emitting element 51 to the third light-emitting element 53 are parallel to the line m0. In the reference example illustrated in FIG. 16, in each of the first light-emitting element 51 and the second light-emitting element 52, a width of the light-emitting portion 611 on the line m1 is smaller than a width of the light-emitting portion 611 on the line m2. In this description, "the width of the light-emitting portion on the line m1 (or line m2)" refers to a length of the light-emitting portion cut by the line m1 (or line m2) in a plan view, that is, a length of a portion of the light-emitting portion that overlaps the line m1 (or line m2) in a plan view. For example, in the first light-emitting element 51 illustrated in FIG. 16, the width of the light-emitting portion 611 on the line m1 is a length 611*e* of the light-emitting portion 611 cut by the line m1, and the width of the light-emitting portion 611 on the line m2 is a length 611*f* of the light-emitting portion 611 cut by the line m2. Thus, in the first light-emitting element 51 and the second light-emitting element 52, the light emission distribution on the line m1 (light emission distribution of a cross section perpendicular to the second surface and including the line m1) and the light emission distribution on the line m2 (light emission distribution of a cross section perpendicular to the second surface and including the line m2) can be different. A half-value angle (directivity angle) of the first light-emitting element 51 on the line m1 can be smaller than a half-value angle of the first light-emitting element 51 on the line m2 by, for example, approximately 6.6° (for example, a difference between the half-value angle (directivity angle) on the line m1 and the half-value angle (directivity angle) on the line m2 of the third light-emitting element 53 is, for example, approximately 1.6°). In this description, the difference in light distribution indicated by the half-value angles (directivity angles) on the line m1 and on the line m2 is sometimes abbreviated as "light distribution difference". Note that, in the third light-emitting element 53, the width of the light-emitting portion 611 on the line m1 and the width of the light-emitting portion 611 on the line m2 are substantially the same. Therefore, the light distribution difference of the third light-emitting element 53 is suppressed to be smaller than those of the first light-emitting element 51 and the second light-emitting element 52.

When a light-emitting device arranged as in the present reference example is applied to a display device, display characteristics such as image color, video, and the like may be affected by the light distribution difference of the first and second light-emitting elements 51 and 52. For example, because the light distribution on the line m1 in the first light-emitting element 51 (red light-emitting element, for example) is narrow (half-value angle is small), when a display device that uses the light-emitting device is viewed from the direction of the line m1, image distortion such as a weak red color may occur.

In contrast, in the light-emitting device 3000 according to the present modified example, as illustrated in FIG. 17, the first light-emitting element 51 and the second light-emitting element 52 are each disposed so that the two sides (one set of opposing sides) of the respective second surfaces 51*a* and 52*a* having a rectangular shape form 450 angles relative to the line m0, in a plan view. That is, the inclination angles α, relative to the line m0, of the first light-emitting element 51 and the second light-emitting element 52 are 45°. With this structure, in each of the first light-emitting element 51 and the second light-emitting element 52, the difference between the width of the light-emitting portion 611 on the line m1 and the width of the light-emitting portion 611 on the line m2 can be made smaller than that of the reference example. In this example, the width of the light-emitting portion 611 on the line m1 and the width of the light-emitting portion 611 on the line m2 can be made substantially the same. With this structure, the difference between the light distribution on the line m1 and the light distribution on the line m2 can be reduced. Accordingly, influence of the light distribution characteristics of the near field of each of the first light-emitting element 51 and the second light-emitting element 52 on the light distribution of the light-emitting device 3000 can be further suppressed to be smaller, making it possible to further enhance the light distribution controllability.

In the present modified example, each of the first light-emitting element 51 to the third light-emitting element 53 is disposed so as to achieve a reduction in the difference between the width of the light-emitting portion 611 on the line m1 and the width of the light-emitting portion 611 on the line m2. For example, each of the first light-emitting element 51 to the third light-emitting element 53 may be disposed so that the electrodes do not overlap the line m1 and the line m2 in a plan view (that is, so that the electrodes are offset from the lines m1, m2). Alternatively, each of the first light-emitting element 51 to the third light-emitting element 53 may be disposed so that the shape of the light-emitting portion 611 in a plan view is substantially symmetric (line-symmetric) relative to the line m0 and/or the line m3.

By using the light-emitting device 3000 of the present modified example, it is possible to achieve a display device in which distortion of image color and video caused by a light distribution difference is further reduced.

As illustrated in FIGS. 14A and 17, in a plan view, the electrodes ce1 and ce2 of each of the first light-emitting element 51 to the third light-emitting element 53 are preferably disposed on the line m0. This makes it possible, in a plan view, to make a direction in which the electrodes ce1 and ce2 of each of the first light-emitting element 51 to the third light-emitting element 53 are connected, that is, a direction in which the width of the light-emitting portion in the light emission luminance distribution of each of the first light-emitting element 51 to the third light-emitting element 53 becomes relatively small, match the minor axis of the corresponding lens portion, and to make a direction in which the width of the light-emitting portion in the light emission luminance distribution of each of the first light-emitting element 51 to the third light-emitting element 53 becomes relatively large match the major axis of the corresponding lens portion. In this way, by increasing the sizes of the lens portions 71 to 73 relative to the widths of the light-emitting portions of the corresponding light-emitting elements 51 to 53, it is possible to reduce a total reflection on an inner surface of each of the lens portions 71 to 73 and capture more light by each of the lens portions 71 to 73. Accordingly, the extraction efficiency of light from each of the light-emitting elements to the corresponding lens can be improved, making it possible to improve the light extraction efficiency.

Figure 18:
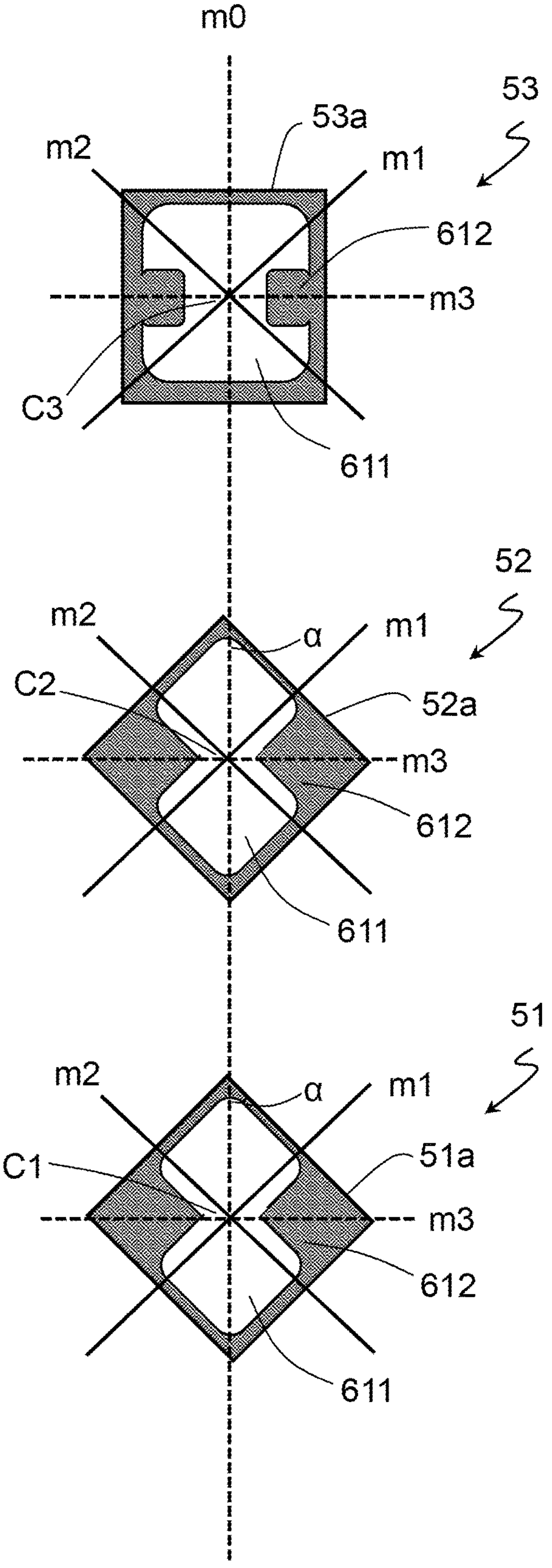
FIG. 18 is a schematic plan view illustrating another arrangement example of the first light-emitting element 51 to the third light-emitting element 53.

FIG. 18 is a schematic plan view illustrating another example of an arrangement of the first light-emitting element 51 to the third light-emitting element 53. The example illustrated in FIG. 18 differs from the example illustrated in FIG. 17 in the positions of the electrodes of the first light-emitting element 51 to the third light-emitting element 53. In the example illustrated in FIG. 18, in a plan view, electrodes of each of the first light-emitting element 51 to the third light-emitting element 53 are disposed on the line m3 that passes through the center of the second surface of each light-emitting element having a rectangular shape and forms a 900 angle clockwise from the line m0. In a plan view, the direction in which the electrodes of each of the first light-emitting element 51 to the third light-emitting element 53 are connected may coincide with the major axis of the corresponding lens portion. In this case as well, the difference generated between the light distribution on the line m1 and the light distribution on the line m2 in each of the first light-emitting element 51 to the third light-emitting element 53 can be reduced.

A shape of each of the first light-emitting element 51 to the third light-emitting element 53 in a plan view may be square. In this case, by disposing the first light-emitting element 51 to the third light-emitting element 53 as exemplified in FIG. 17 or 18, the difference between the light distribution on the line m1 and the light distribution on the line m2 in each of the light-emitting elements can be further reduced.

Note that the inclination angle α of each of the first light-emitting element 51 to the third light-emitting element 53 relative to the line m0 in a plan view can be set in accordance with the positions of the electrodes and the like in the light-emitting element, regardless of a wavelength of the light emitted from the light-emitting element. The inclination angle α of each of the first light-emitting element 51 to the third light-emitting element 53 relative to the line m0 can be selected in a range from 0° to 45° according to the planar shape of the light-emitting element, the position of the electrode, the electrode shape, and the like. In a case in which the planar shape of the light-emitting element is rectangular and includes the electrodes in two corner portions facing each other, the inclination angle α of the light-emitting element relative to the line m0 may be greater than 0° and less than 45°.

Size and Shape of Lens Portion

In the present modified example, the height of the vertex of at least one lens portion of the first lens portion 71, the second lens portion 72, and the third lens portion 73 differs from the heights of the vertices of the other lens portions.

In the example illustrated in FIG. 14B, a height HL3 of a vertex T3 of the third lens portion 73 is higher than a height HL1 of a vertex T1 of the first lens portion 71 and a height HL2 of a vertex T2 of the second lens portion 72. The height HL1 of the vertex T1 of the first lens portion 71 and the height HL2 of the vertex T2 of the second lens portion 72 may be the same or may be different from each other. Note that the heights HL1 to HL3 of the vertices T1 to T3 of the first lens portion 71 to the third lens portion 73, respectively, refer to the height of each vertex T1 to T3 from the upper surface 61*a* of the base portion 61, that is, the shortest distance between each of the vertices T1 to T3 and the upper surface 61*a* of the base portion 61. In the illustrated example, the heights HL1 to HL3 of the vertices T1 to T3 are the shortest distances between the vertices and the bottom surfaces of the convex shapes of the lens portions 71 to 73.

Further, in a plan view, sizes of the first lens portion 71 to the third lens portion 73 (widths WS1 to WS3 in the minor axis direction, widths WL1 to WL3 in the major axis direction) may be different from each other. Here, the width WS3 of the third lens portion 73 in the minor axis direction is larger than the widths WS1 and WS2 of the first lens portion 71 and the second lens portion 72, respectively, in the minor axis direction, and the width WL3 of the third lens portion 73 in the major axis direction is larger than the widths WL1 and WL2 of the first lens portion 71 and the second lens portion 72, respectively, in the major axis direction. The sizes of the first lens portion 71 and the second lens portion 72 in a plan view may be the same or may be different from each other.

In the example illustrated in FIG. 14B, the size of each of the lens portions 71 to 73 may be adjusted so that light emitted from the lens portion has a desired light distribution. For example, the half-value angle of the lens portion on the major axis may be in a range from 1000 to 120°, and the half-value angle on the minor axis may be in a range from 50° to 70°. The heights HL1, HL2 of the vertices T1, T2 of the first and second lens portions 71, 72, respectively, are in a range from 0.3 mm to 0.5 mm and are, for example, 0.40 mm, and the height HL3 of the vertex T3 of the third lens portion 73 is in a range from 0.4 mm to 0.6 mm and is, for example, 0.50 mm. Further, the width WS1 of the first lens portion 71 in the minor axis direction is in a range from 0.6 mm to 1.0 mm and is, for example 0.8 mm, and the width WL1 of the first lens portion 71 in the major axis direction is in a range from 1.0 mm to 1.4 mm and is, for example 1.2 mm. The width WS2 of the second lens portion 72 in the minor axis direction is in a range from 0.6 mm to 1.0 mm and is, for example, 0.8 mm, and the width WL2 of the second lens portion 72 in the major axis direction is in a range from 1.0 mm to 1.4 mm and is, for example, 1.2 mm. The width WS3 of the third lens portion 73 in the minor axis direction is in a range from 0.8 mm to 1.2 mm and is, for example, 1.0 mm, and the width WL3 of the third lens portion 73 in the major axis direction is in a range from 1.4 mm to 1.8 mm and is, for example, 1.6 mm.

As described above, in a lateral side view as viewed in the x-axis direction and/or the y-axis direction, the outer edge of each of the first lens portion 71 to the third lens portion 73 may include a linear portion in addition to a curved portion. As an example, in a lateral side view as viewed in the y-axis direction, each of the lens portions 71 to 73 may include a linear portion, and in a lateral side view as viewed in the x-axis direction, each of the lens portions 71 to 73 may not include a linear portion. Further, shapes of the outer edges of the first lens portion 71 to the third lens portion 73, in a lateral side view, may be different from each other. For example, in a lateral side view as viewed in the y-axis direction, the outer edge of at least one lens portion of the first lens portion 71 to the third lens portion 73 may include a linear portion, and the outer edges of the other lens portions may not include linear portions.

A curvature of at least one lens portion of the first lens portion 71 to the third lens portion 73 may be different from the curvatures of the other lens portions. The curvatures of the first lens portion 71 to the third lens portion 73 may be different from each other. Alternatively, the first lens portion 71 to the third lens portion 73 may have the same curvature. In this description, "the curvature of the lens portion" refers to the curvature of a curved portion that, in a cross section along the major axis direction or the minor axis direction of the lens portion including the vertex of the lens portion, includes the vertex of the outer edge of the lens portion.

According to the present modified example, the light distribution controllability of the light that passes through each the lens portions 71 to 73 and is emitted from each of the first light-emitting element 51 to the third light-emitting element 53 can be enhanced by adjusting the size (for example, the heights HL1 to HL3 of the vertices T1 to T3, the widths WS1 to WS3 in the minor axis direction, and the widths WL1 to WL3 in the major axis direction), the curvature, and the like of the corresponding lens portion 70 in accordance with the respective light emission luminance distributions of the first light-emitting element 51 to the third light-emitting element 53. Further, the light distribution controllability and the light extraction efficiency of the light-emitting device 3000 can be improved by combining a configuration, described above, that makes the direction in which the width of the light-emitting portion in the light emission luminance distribution of each of the first light-emitting element 51 to the third light-emitting element 53 becomes relatively small match the minor axis of the corresponding lens portion and makes the direction in which the width of the light-emitting portion in the light emission luminance distribution of each of the first light-emitting element 51 to the third light-emitting element 53 becomes relatively large match the major axis of the corresponding lens portion, and a configuration that makes the size of the corresponding lens portion 70 increase in accordance with the light emission luminance distribution of each of the first light-emitting element 51 to the third light-emitting element 53.

For example, when the distribution of light emitted from a certain light-emitting element through the lens portion is to be narrowed, first the curvature of the lens portion is adjusted. When the light distribution is not sufficiently narrowed by the adjustment of the curvature alone, the size of the lens portion may be made larger than those of the other lens portions. Alternatively, the size of the lens portion may be made larger without changing the curvature of the lens portion.

In a case in which the light distribution of a certain light-emitting element (here, third light-emitting element 53) is wider than the light distribution of the other light-emitting elements, the distribution of the light (here, green light) emitted through the third lens portion 73 can be narrowed by making the size of the third lens portion 73 corresponding to the third light-emitting element 53 (for example, the height HL3 of the vertex of the lens portion 73) higher than those of the other lens portions 71 and 72. For example, as illustrated in FIG. 17, in a case in which the light distribution of the third light-emitting element 53 on the line m0 is wider than the light distributions of the first and second light-emitting elements 51 and 52 on the line m0, the height HL3 of the vertex of the third lens portion 73 corresponding to the third light-emitting element 53 may be made higher than those of the other lens portions 71 and 72.

Note that, in the present modified example, the size of the third lens portion 73 is larger than those of the first lens portion 71 and the second lens portion 72, but a size relationship between the first lens portion 71 to the third lens portion 73 is not particularly limited. The sizes of these lens portions 71 to 73 can be set in accordance with the light emission luminance distribution caused by the electrode positions and the like of each of the light-emitting elements.

Of the first lens portion 71 to the third lens portion 73, the lens portion having the highest vertex (hereinafter referred to as the "highest lens portion") is preferably disposed at one end of a row in which the first lens portion 71 to the third lens portion 73 are arrayed in one direction (hereinafter, "lens row"), in a plan view. In the example illustrated in FIG. 14A, the third lens portion 73, which is the highest lens portion, is disposed at one end (here, the end on the +y-most side) of the lens row composed of the first lens portion 71 to the third lens portion 73. This makes it possible to reduce the proportion of light emitted from the other lens portions that is blocked by the highest lens portion (light from the other lens portions incident on the highest lens portion and changed in emission direction). Note that, in a case in which the heights of the vertices of the first lens portion 71 to the third lens portion 73 differ from each other, the highest lens portion may be disposed on one end of the lens row, and the lens portion having the lowest vertex height (hereinafter, referred to as "lowest lens portion") may be disposed on the other end of the lens row.

Figure 19A:
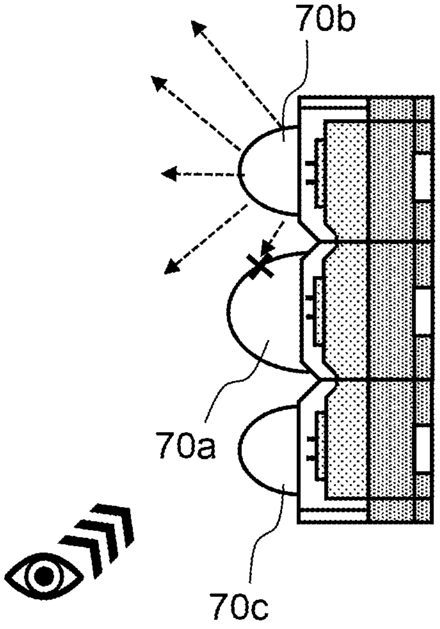
FIG. 19A is a schematic lateral side view exemplifying an array of lens portions.
Figure 19B:
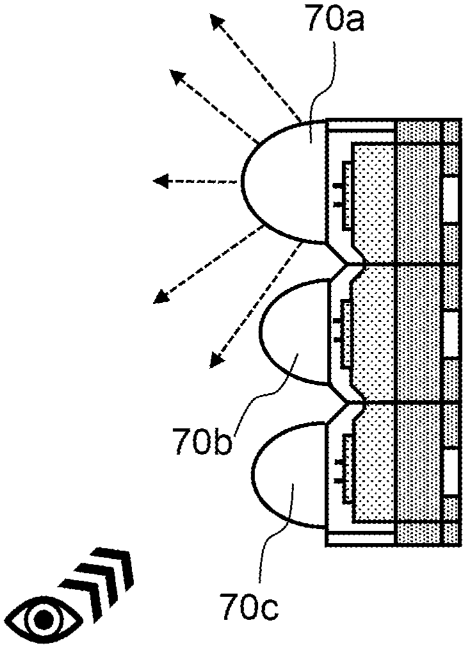
FIG. 19B is a schematic lateral side view illustrating another example of the array of the lens portions.

When the light-emitting device according to the present modified example is used in a display device such as an outdoor display, for example, three lens portions 70*a* to 70*c* of the light-emitting device may be disposed in a vertical direction of a display surface (surface from which light is emitted) of the display device. When such a display surface is viewed from below and the highest lens portion 70*a* is positioned in a center of the lens row as exemplified in FIG. 19A, a part of the light directed downward (toward a direction of an observer) from the lens portion 70*b* positioned at an upper end of the lens row is incident on the highest lens portion 70*a* and less likely to exit to the direction of the observer. In contrast, as illustrated in FIG. 19B, when the highest lens portion 70*a* is disposed at the upper end of the lens row, of the light directed downward from the lens portion (highest lens portion) 70*a* at the upper end of the lens row, the proportion of light incident on the other lens portions 70*b* and 70*c* can be reduced compared to that in the example illustrated in FIG. 19A. Accordingly, the light directed downward from each of the three lens portions 70*a* to 70*c* can be more efficiently emitted to the direction of the observer.

Figure 19C:
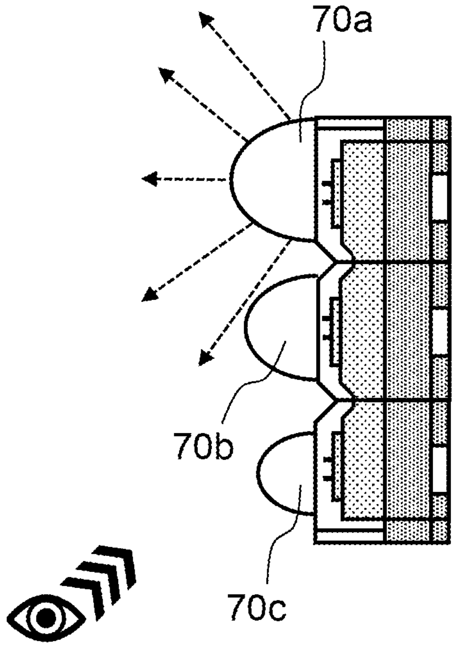
FIG. 19C is a schematic lateral side view illustrating yet another example of the array of the lens portions.

When the heights of the vertices of the three lens portions 70*a* to 70*c* are different from each other, the highest lens portion 70*a* is preferably disposed at the upper end of the lens row and the lowest lens portion 70*c* is preferably disposed at the lower end of the lens row as illustrated in FIG. 19C. This makes it possible to reduce, of the light directed downward from the lens portion (highest lens portion) 70*a* at the upper end of the lens row and the lens portion 70*b* positioned at the center, the proportion of light blocked by another lens portion.

Figure 20:
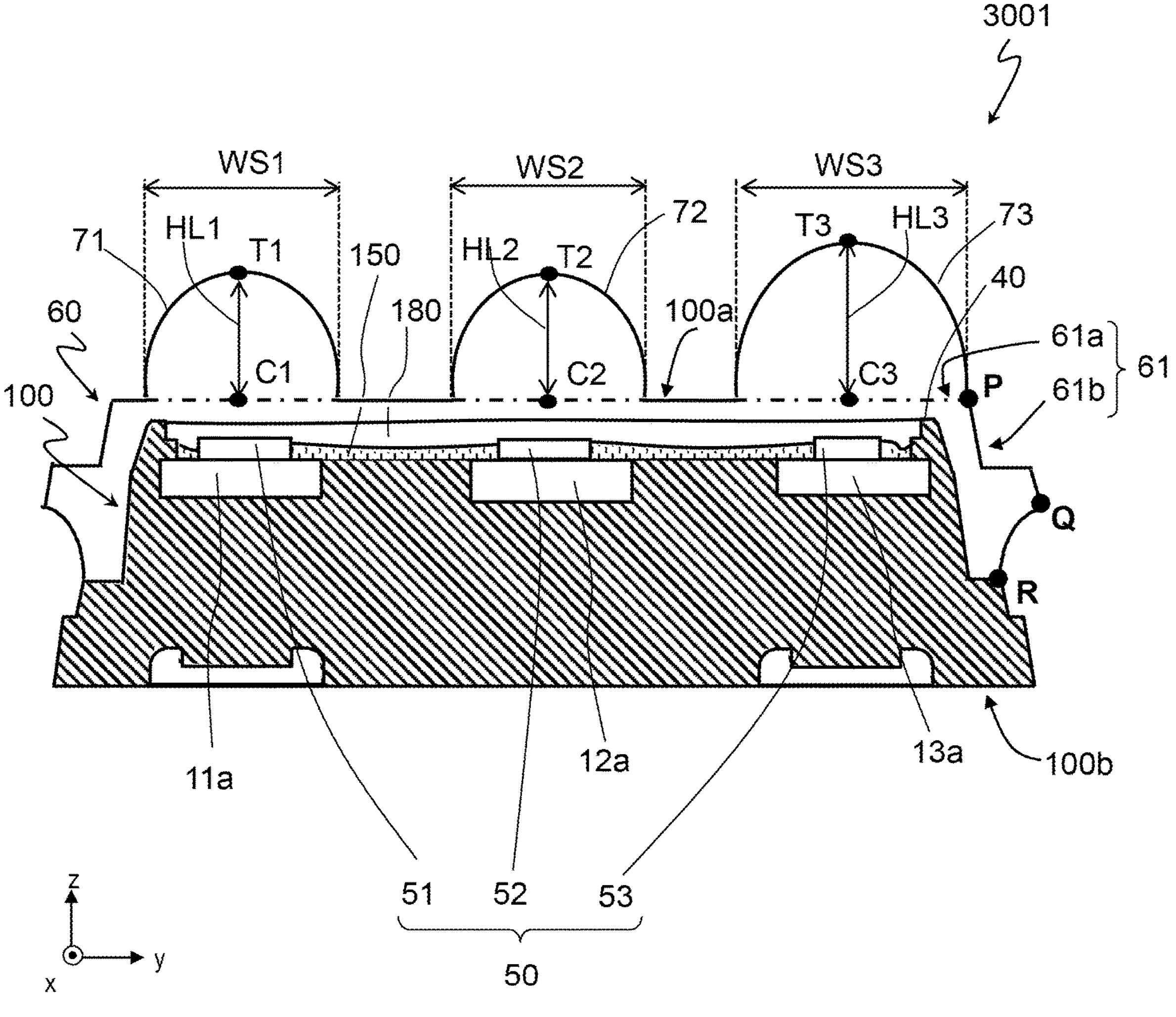
FIG. 20 is a schematic cross-sectional view of another light-emitting device of the sixth modified example.

FIG. 20 is a schematic cross-sectional view of another light-emitting device 3001 according to the present modified example, illustrating a cross section that includes the line m0 and is parallel to the yz plane.

The light-emitting device 3001 and the light-emitting device 3000 illustrated in FIGS. 14A and 14B differ in the shapes and the sizes of the first lens portion 71 to the third lens portion 73. The shapes, sizes, and the like of the first lens portion 71 to the third lens portion 73 are adjusted so that the light-emitting device 3001 has a light distribution that is narrower (that is, has a higher directivity) than that of the light-emitting device 3000. In this example, the sizes (heights HL1 to HL3 of the vertices, widths WS1 to WS3 in the minor axis direction, and widths WL1 to WL3 in the major axis direction) of the first lens portion 71 to the third lens portion 73 of the light-emitting device 3001 are larger than those of the light-emitting device 3000. Further, the curvatures of the first lens portion 71 to the third lens portion 73 of the light-emitting device 3001 are smaller than the curvatures of the first lens portion 71 to the third lens portion 73 of the light-emitting device 3000.

In the example illustrated in FIG. 20, the size of each lens portion 71 to 73 may be adjusted so that the light emitted from the lens portion has a desired light distribution. For example, the half-value angle on the major axis of the lens portion may be in a range from 800 to less than 100°, and the half-value angle on the minor axis may be in a range from 350 to less than 50°. The heights HL1 and HL2 of the vertices T1 and T2 of the first and second lens portions 71 and 72, respectively, are in a range from 0.6 mm to 0.8 mm and are, for example, 0.7 mm, and the height HL3 of the vertex T3 of the third lens portion 73 is in a range from 0.8 mm to 1.0 mm and is, for example, 0.9 mm. Further, the width WS1 of the first lens portion 71 in the minor axis direction is in a range from 0.8 mm to 1.2 mm and is, for example, 1.0 mm, and the width WL1 of the first lens portion 71 in the major axis direction is in a range from 1.2 mm to 1.6 mm and is, for example, 1.4 mm. The width WS2 of the second lens portion 72 in the minor axis direction is in a range from 0.8 mm to 1.2 mm and is, for example 1.0 mm, and the width WL2 of the second lens portion 72 in the major axis direction is in a range from 1.3 mm to 1.7 mm and is, for example, 1.5 mm. The width WS3 of the third lens portion 73 in the minor axis direction is in a range from 1.0 mm to 1.4 mm and is, for example, 1.2 mm, and the width WL3 of the third lens portion 73 in the major axis direction is in a range from 1.6 mm to 2.0 mm and is, for example, 1.8 mm.

Note that, in the present modified example, the arrangement (inclination angle $\alpha$ relative to the line m0) of at least one light-emitting element of the first light-emitting element 51 to the third light-emitting element 53 is made to differ from those of the other light-emitting elements in accordance with the light emission luminance distribution of the first light-emitting element 51 to the third light-emitting element 53, and the sizes of the first lens portion 71 to the third lens portion 73 may be the same. Alternatively, the sizes of at least one lens portion of the first lens portion 71 to the third lens portion 73 is made to differ from those of the other lens portions in accordance with the light emission luminance distribution of the first light-emitting element 51 to the third light-emitting element 53, and the inclination angles α relative to the line m0 of the first light-emitting element 51 to the third light-emitting element 53 may be the same.

Seventh Modified Example

Figure 21:
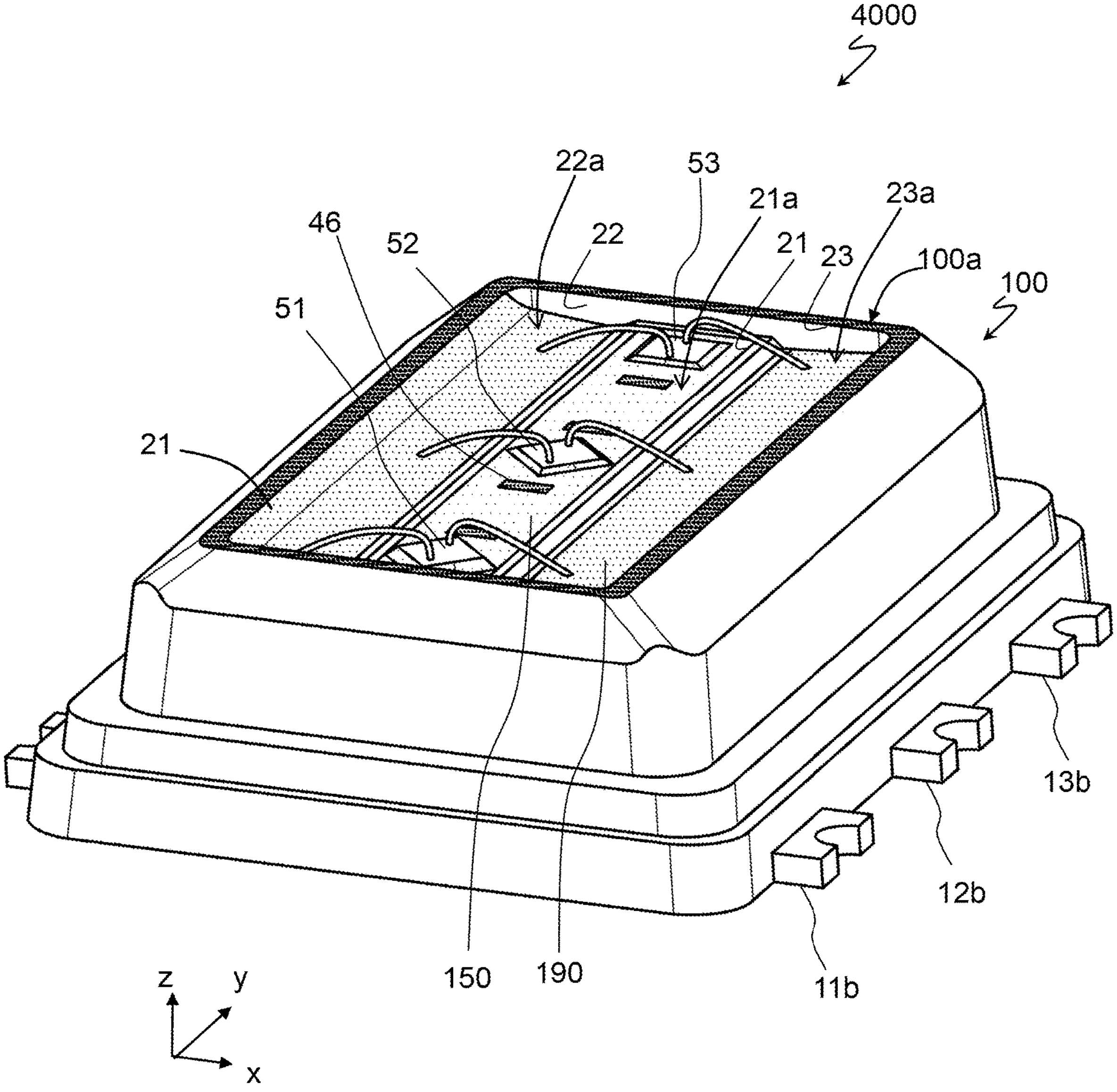
FIG. 21 is a schematic perspective view of a light-emitting device of a seventh modified example, with a mold resin portion removed.
Figure 22A:
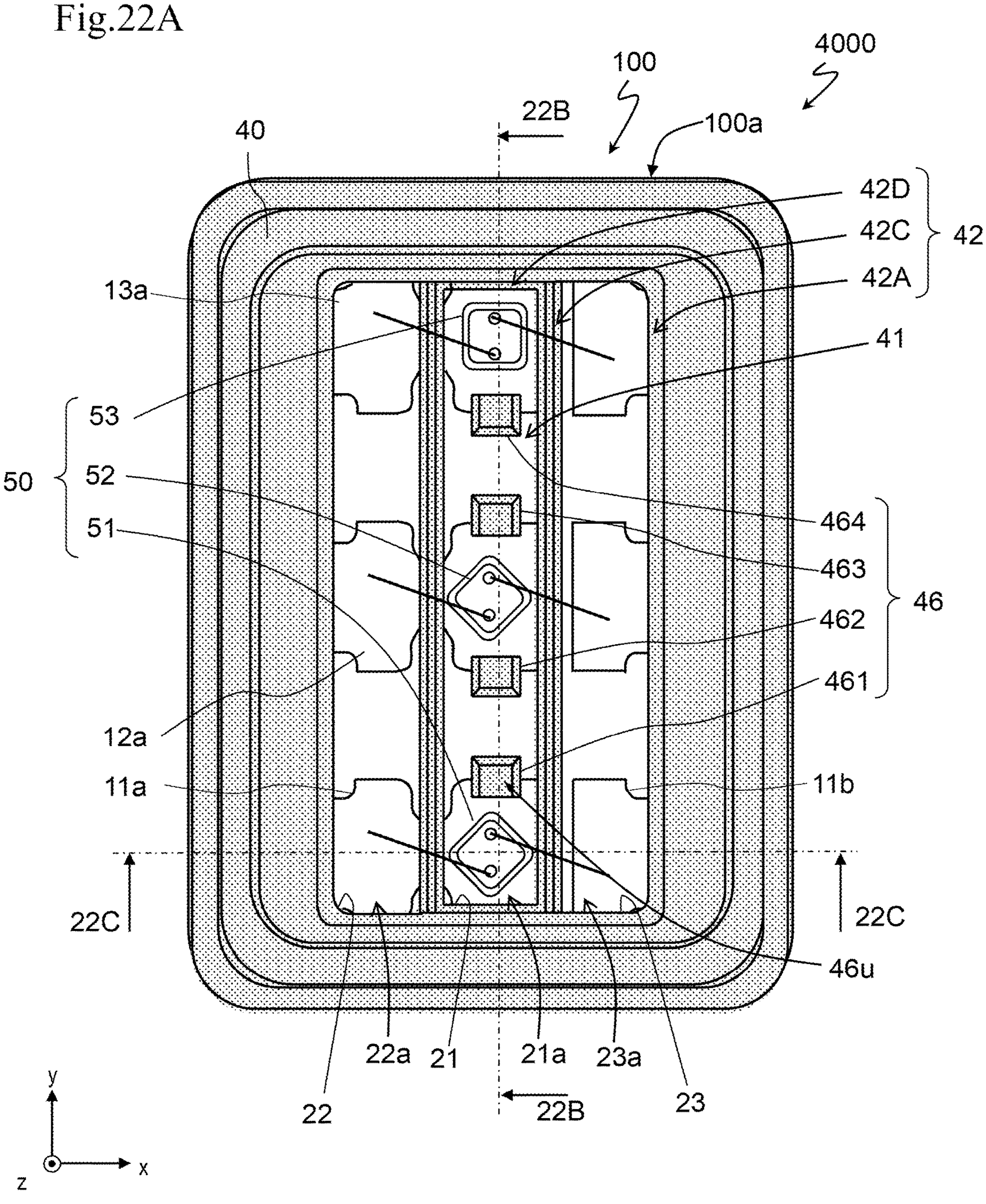
FIG. 22A is a schematic top view of the light-emitting device illustrated in FIG. 21.
Figure 22B:
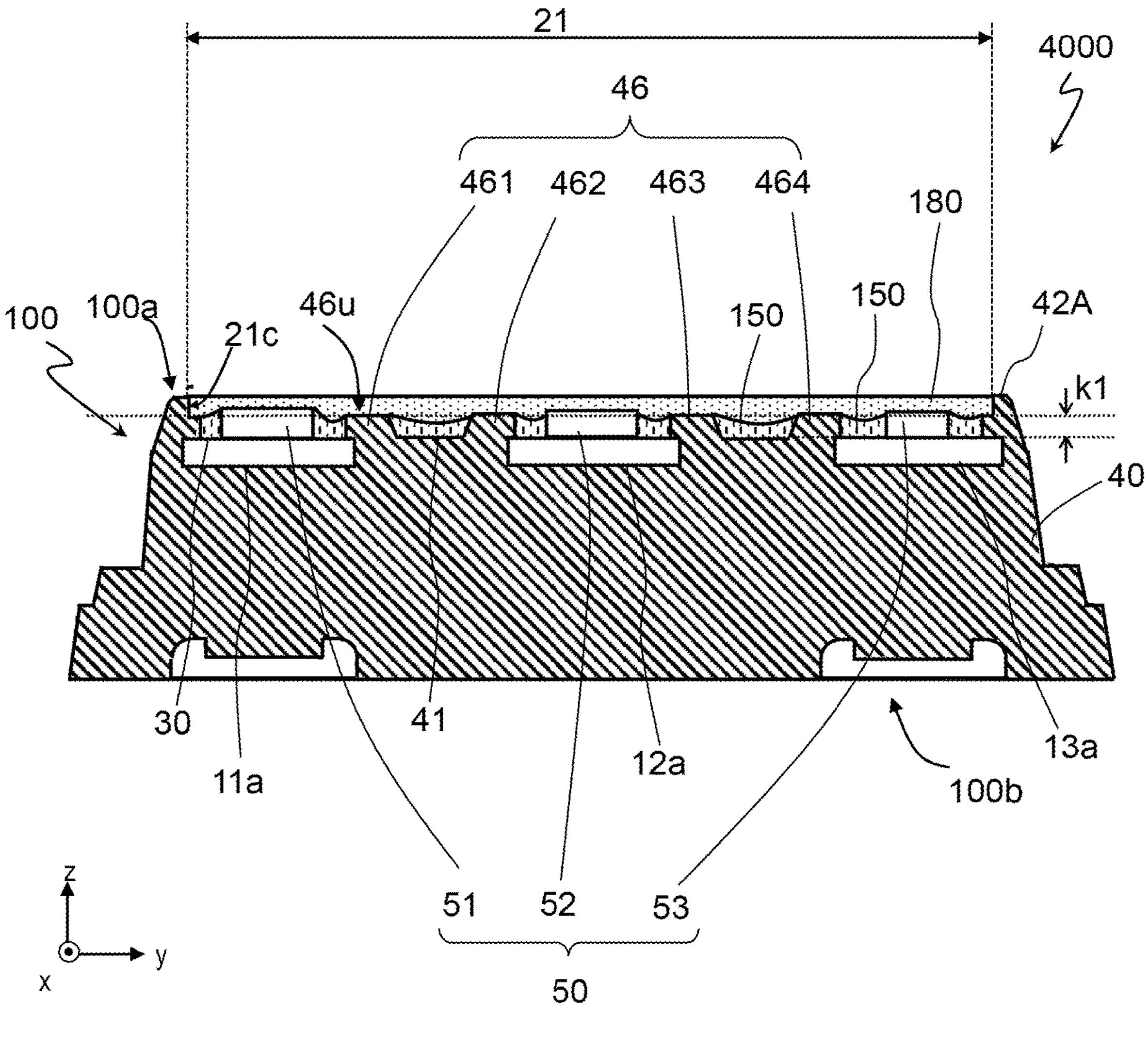
FIG. 22B is a schematic cross-sectional view taken along line 22B-22B illustrated in FIG. 22A.
Figure 22C:
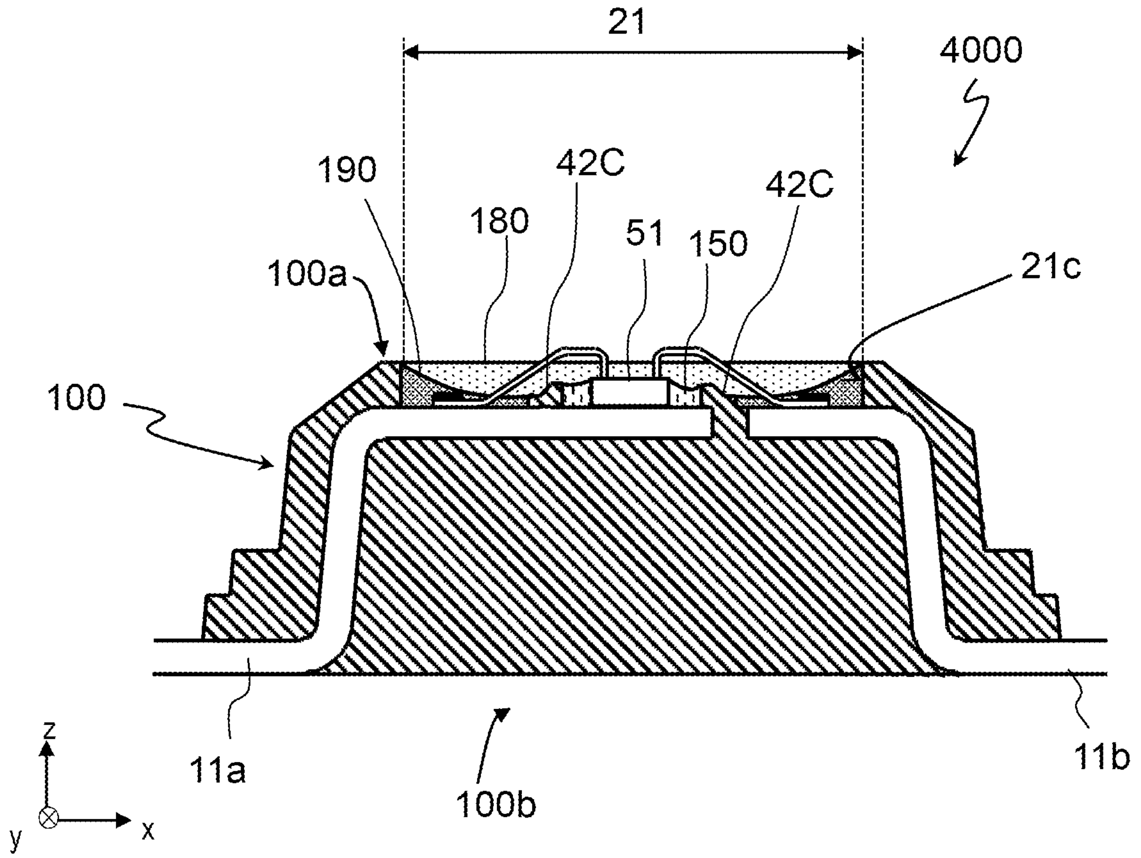
FIG. 22C is a schematic cross-sectional view taken along line 22C-22C illustrated in FIG. 22A.

FIG. 21 is a schematic perspective view of a light-emitting device 4000 of a seventh modified example, with the mold resin portion removed. FIG. 22A is a schematic top view of the light-emitting device 4000 of the seventh modified example, with the mold resin portion removed. FIGS. 22B and 22C are schematic cross-sectional views taken along line 22B-22B and line 22C-22C illustrated in FIG. 22A, respectively.

The light-emitting device 4000 of the seventh modified example differs from the light-emitting device 3000 illustrated in FIGS. 14A and 14B in that, on the primary surface 100*a* of the resin package 100, the first resin portion 41 positioned on the inner upper surface 21*a* of the first recessed portion 21 includes at least one protruding portion 46. In a plan view, the protruding portion 46 is positioned at least between the first light-emitting element 51 and the second light-emitting element 52 or between the second light-emitting element 52 and the third light-emitting element 53. In a plan view, the protruding portion 46 is spaced apart from the inner lateral surface 21*c* of the first recessed portion 21.

In the example illustrated in FIG. 22A, in the first recessed portion 21, the first resin portion 41 includes a plurality of (here, four) protruding portions 46 spaced apart from each other. A part or all of the plurality of protruding portions 46 are positioned between two adjacent light-emitting elements of the plurality of light-emitting elements 50. Each protruding portion 46 has a rectangular upper surface, for example. An upper surface 46*u* of each protruding portion 46 is positioned above the exposed regions 30 of the leads. A portion of the first resin portion 41 other than the protruding portion 46 is, for example, substantially flush with the exposed regions 30 of the leads. Substantially flush means that errors due to dimensional tolerances, manufacturing tolerances, and material tolerances are included within a permissible range.

At least apart of a lateral surface of each protruding portion 46 is in contact with the reflective member 150. The upper surface 46*u* of the protruding portion 46 may be exposed from the reflective member 150. With the upper surface 46*u* of each protruding portion 46 being exposed from the reflective member 150 disposed in the first recessed portion 21, the reflective member 150 includes a plurality of holes corresponding to the protruding portions 46 in a plan view. With this structure, deterioration in the display contrast due to external light reflection by the reflective member 150 can be reduced. Note that the upper surface 46*u* of each protruding portion 46 may be covered by the light-transmissive resin member 180. The reflective member 150 disposed in the first recessed portion 21 may include a plurality of holes corresponding to the protruding portions 46 in a plan view.

According to the present modified example, in a plan view, the reflective member 150 can be disposed in a region of the inner upper surface 21*a* of the first recessed portion 21 excluding regions in which the protruding portions 46 are formed. With this structure, the volume of the reflective member 150 can be reduced. Thus, it is possible to reduce a stress on the light-emitting elements 50 that occurs during the manufacturing step and reduce the lifting of the light-emitting elements 50 from the leads 11. Further, with the first resin portion including the protruding portions, holes or grooves corresponding to the protruding portions 46 can be formed in the reflective member 150, and the reflective member 150 can be arranged in two or more regions spaced apart from each other with the protruding portions 46 interposed therebetween. Therefore, during the manufacture or mounting of the light-emitting device 4000, defects caused by the stress that occurs between the reflective member 150 and the light-emitting elements 50 can be reduced.

In the example illustrated in FIG. 22C, the upper surfaces of the plurality of light-emitting elements 50 are positioned above (+z side) the upper surfaces 46*u* of the protruding portions 46. Note that heights of the upper surfaces of the first light-emitting element 51 to the third light-emitting element 53 may be different from each other. As described above, the reflective member 150 is formed in the first recessed portion 21 by applying and curing the first resin material, for example. At this time, when the upper surfaces 46*u* of the protruding portions 46 are positioned above (+z side) the upper surfaces of the light-emitting elements 50, a part of the first resin material disposed between two adjacent protruding portions 46 may rise to the light-emitting elements 50 due to surface tension. The reflective member 150 may be disposed on all or a part of the upper surfaces of the light-emitting elements 50, and the brightness of the light-emitting device 4000 may be reduced. In the present modified example, because the upper surfaces 46*u* of the protruding portions 46 are positioned below (−z side) the upper surfaces of the light-emitting elements 50, the rise of the first resin material that is to become the reflective member 150 to the upper surfaces of the light-emitting elements 50 can be reduced. Accordingly, a reduction in brightness of the light-emitting device 4000 due to the rise of the first resin material can be reduced.

A distance k1 between the upper surface 46*u* of the protruding portion 46 and the exposed region 30 in the z-axis direction is, for example, 0.1 mm. When the upper surface 46*u* of the protruding portion 46 is non-parallel to the xy plane, the distance k1 is a distance from the exposed region 30 to a portion of the upper surface 46*u* of the protruding portion 46 positioned on the +z-most side in the z-axis direction. A distance between the upper surface of the light-emitting element 50 and the exposed region 30 in the z-axis direction is greater than the distance k1 and is, for example, in a range from 0.12 mm to 0.2 mm.

In a plan view of the primary surface 100*a* of the resin package 100, at least one protruding portion 46 is positioned between two adjacent leads of the plurality of leads and includes a portion that overlaps at least one of the two adjacent leads. For example, the protruding portion 46 overlaps a part of the exposed region 30 in a plan view. This makes it possible to fix the lead frame by the protruding portion 46 so that the lead frame does not lift from the first dark-colored resin member 40 during the manufacture of the resin package 100.

Figure 23:
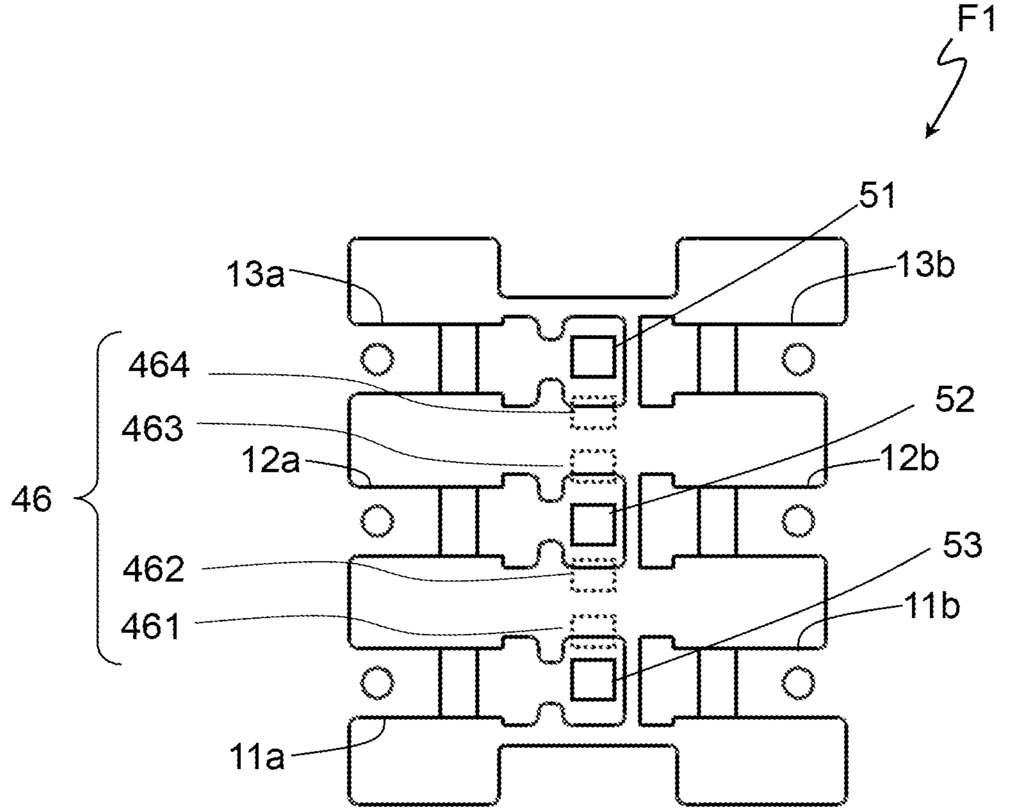
FIG. 23 is a schematic plan view illustrating an example of an arrangement relationship between a lead frame, light-emitting elements, and protruding portions.

In the example illustrated in FIG. 22A, four protruding portions 46 are disposed in the first recessed portion 21. The four protruding portions 46 include two protruding portions 461, 462 positioned between the first light-emitting element 51 and the second light-emitting element 52, and two protruding portions 463, 464 positioned between the second light-emitting element 52 and the third light-emitting element 53, in a plan view. The protruding portion 461 partially overlaps the lead 11*a* in a plan view. Similarly, each of the protruding portions 462, 463 partially overlaps the lead 12*a*, and the protruding portion 464 partially overlaps the lead 13*a*, in a plan view. FIG. 23 is a schematic plan view exemplifying an arrangement relationship between a lead frame F1 and each of the protruding portions 46. For example, in the lead frame F1, a width of a region where the light-emitting elements 51 to 53 are disposed and a width of a region on the −x side of the region where the light-emitting elements 51 to 53 are disposed in a plan view are different. A different width of the lead frame in the y-axis direction can increase a contact area between the resin package 100 and the lead frame. Thus, the adhesion between the resin package 100 and the lead frame can be increased. Note that the width of the region where the light-emitting elements 51 to 53 are disposed and the width of the region on the −x side of the region where the light-emitting elements 51 to 53 are disposed in a plan view may be the same.

Note that the number of protruding portions 46 is not limited to the illustrated example. The light-emitting device 4000 according to the present modified example includes at least one protruding portion 46 in the first recessed portion 21 and may include five or more protruding portions 46.

Hereinafter, other light-emitting devices 4001 to 4005 of the seventh modified example will be described. In the following, points different from those of the light-emitting device 4000 will be mainly described, and description of structures and effects similar to those of the light-emitting device 4000 will be omitted.

Figure 24:
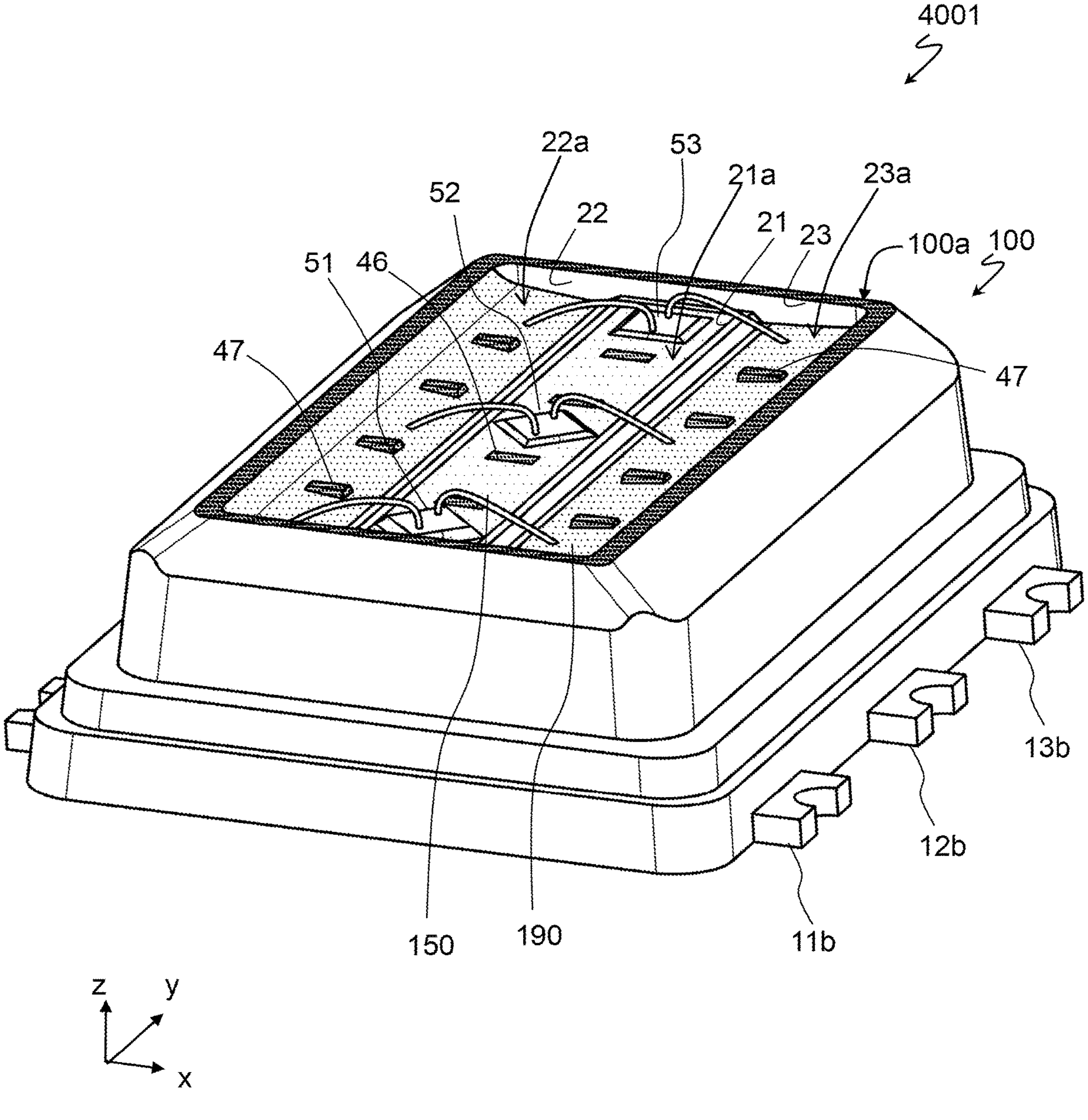
FIG. 24 is a schematic perspective view of another light-emitting device of the seventh modified example, with the mold resin portion removed.

FIG. 24 is a schematic perspective view of another light-emitting device 4001 of the seventh modified example, with the mold resin portion removed. The light-emitting device 4001 differs from the light-emitting device 4000 illustrated in FIGS. 21 and 22A to 22C in that the first resin portion 41 positioned on the inner upper surfaces 22*a* and 23*a* of the second recessed portions 22 and 23, respectively, in the primary surface 100*a* of the resin package 100 includes at least one protruding portion 47. In the example illustrated in FIG. 24, the protruding portion 47 is spaced apart from the inner lateral surfaces 21*c* of the corresponding second recessed portions 22 and 23, in a plan view.

In the example illustrated in FIG. 24, a plurality of (here, four) protruding portions 47 are spaced apart from each other in an interior of each of the second recessed portions 22 and 23. The upper surfaces of the light-emitting elements 50 are positioned above upper surfaces of the protruding portions 47. A height of the upper surface of the protruding portion 47 may be the same as the height of the upper surface of the protruding portion 46.

In the example illustrated in FIG. 24, at least a part of a lateral surface of each protruding portion 47 is in contact with the second dark-colored resin member 190. The upper surface of each protruding portion 47 is exposed from the second dark-colored resin member 190. Note that the upper surface of each protruding portion 47 may be covered by the second dark-colored resin member 190. For example, the second dark-colored resin member 190 disposed in each of the second recessed portions 22 and 23 may include a plurality of holes corresponding to the plurality of protruding portions 47 in a plan view.

According to the present modified example, in a plan view, the second dark-colored resin member 190 can be disposed in regions of the inner upper surfaces 22*a* and 23*a* of the second recessed portions 22 and 23, respectively, excluding regions in which the protruding portions 47 are formed. With this structure, the volume of the second dark-colored resin member 190 can be reduced. Further, holes or grooves can be formed in the second dark-colored resin member 190, and the second dark-colored resin member 190 can be arranged in two or more regions spaced apart from each other with the protruding portions 47 interposed therebetween. Therefore, effects caused by the stress that occurs during the manufacture or mounting of the light-emitting device 4001 can be reduced. For example, the stress on a bonding portion between a wire and a lead caused by a volume change in the second dark-colored resin member 190 can be reduced.

Preferably, each protruding portion 47 partially overlaps the corresponding lead in a plan view. This makes it possible to fix the lead frame by the protruding portion 47 so that the lead frame does not lift from the first dark-colored resin member 40 during manufacture of the resin package 100.

Figure 25:
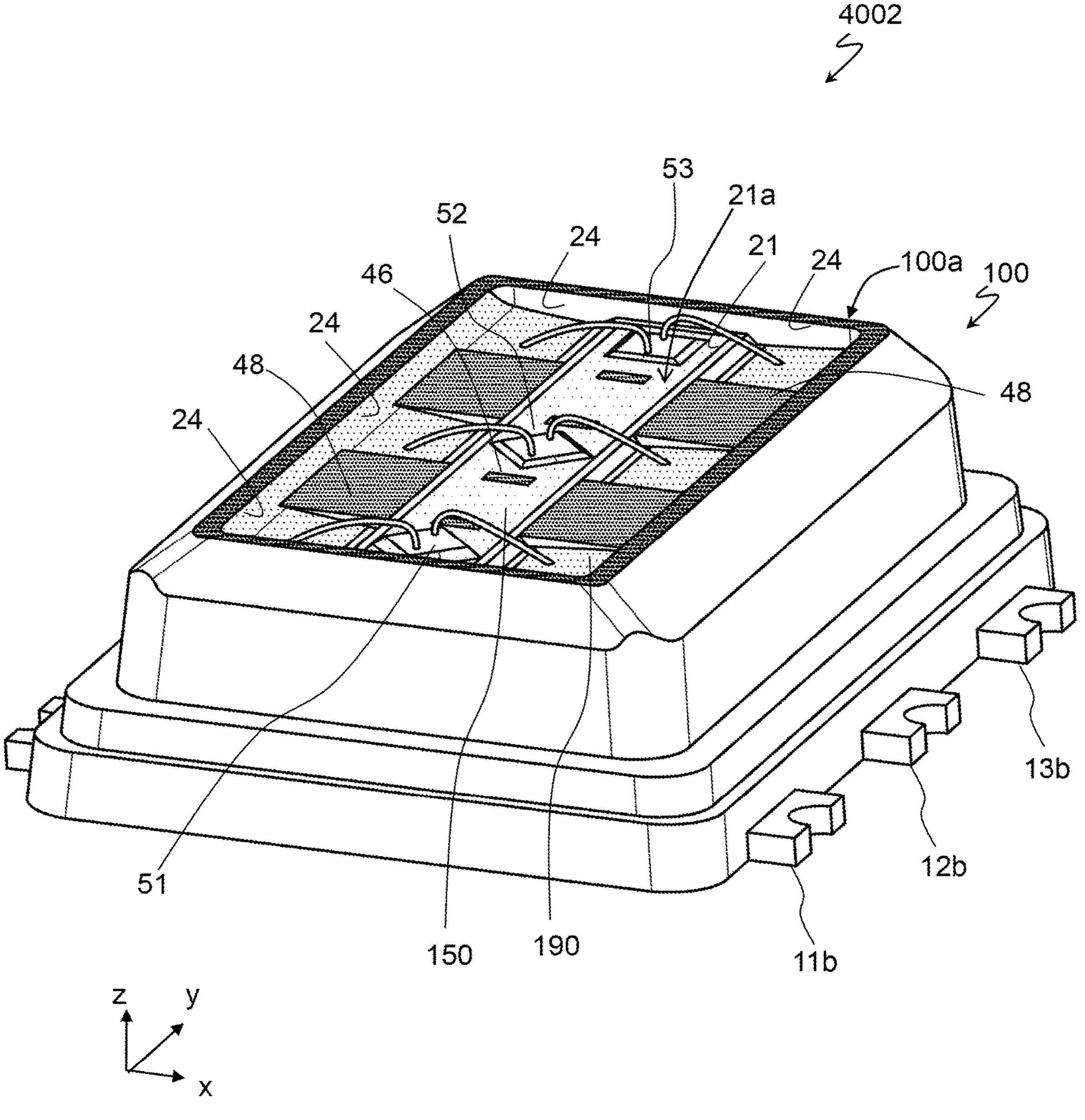
FIG. 25 is a schematic perspective view of yet another light-emitting device of the seventh modified example, with the mold resin portion removed.
Figure 26:
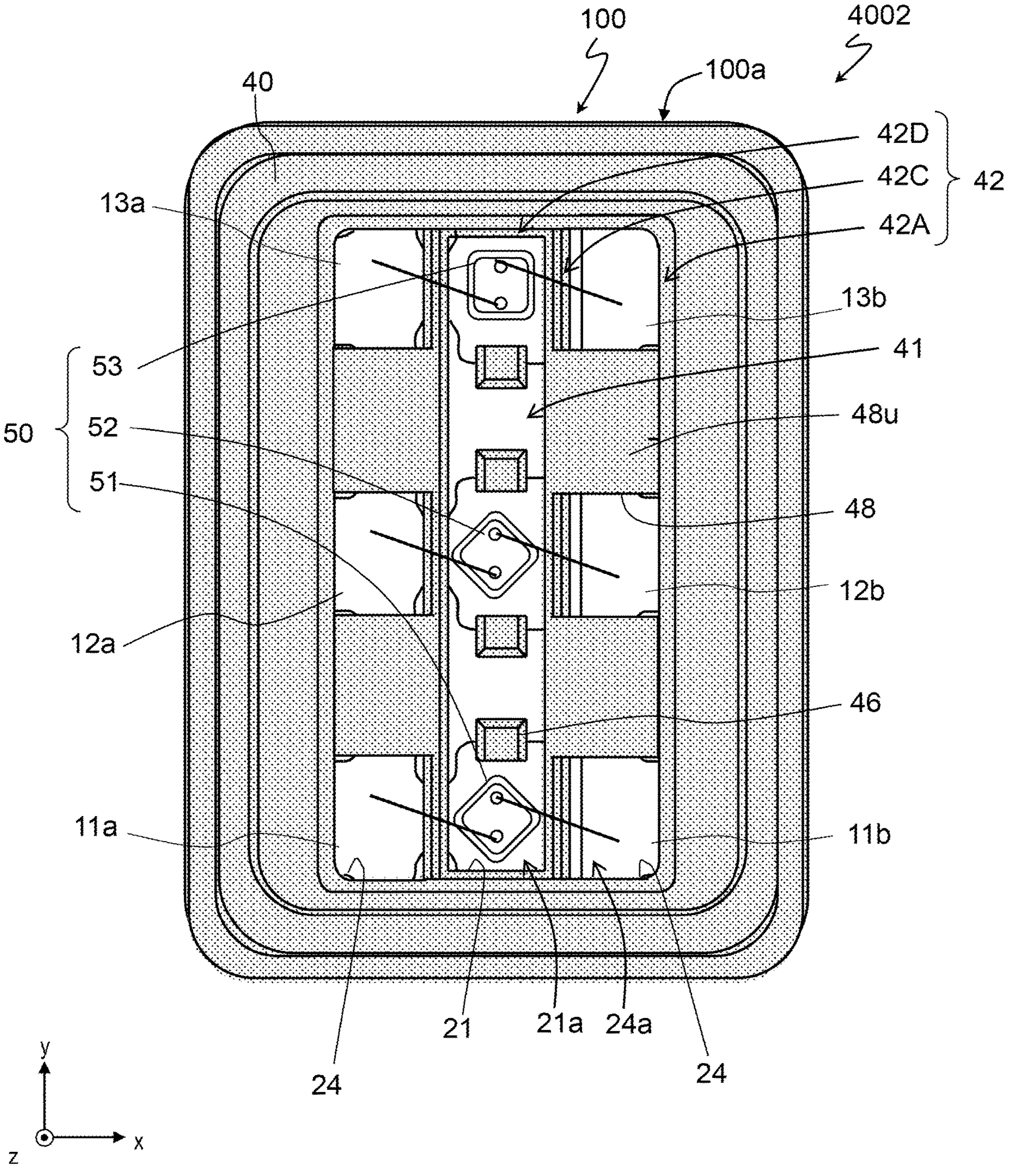
FIG. 26 is a schematic top view of the light-emitting device illustrated in FIG. 25.

FIG. 25 is a schematic perspective view of yet another light-emitting device 4002 of the seventh modified example, with the mold resin portion removed. FIG. 26 is a schematic top view of the light-emitting device 4002, with the mold resin portion removed. The light-emitting device 4002 differs from the light-emitting device 4001 illustrated in FIG. 24 in including the first recessed portion 21 and a plurality of (six in the illustrated example) third recessed portions 24 in the primary surface 100*a* of the resin package 100. Each third recessed portion 24 includes the connection region wr for wire bonding.

In the example illustrated in FIG. 25, the first dark-colored resin member 40 includes four protruding portions 48 on the primary surface 100*a* of the resin package 100. Each protruding portion 48 is disposed between two adjacent third recessed portions 24 and is in contact with the resin portions 42A, 42C. A height of an upper surface 48*u* of each protruding portion 48 is the same as the height of the upper surface 46*u* of the protruding portion 46. Note that the upper surface 48*u* of each protruding portion 48 may be higher than or may be lower than the upper surface 46*u* of the protruding portion 46. In the example illustrated in FIG. 25, each of the third recessed portions 24 is defined by the resin portions 42A and 42C and the protruding portions 48. The second dark-colored resin member 190 is disposed on an inner upper surface 24*a* of each third recessed portion 24. The second dark-colored resin member 190 preferably covers at least the plurality of leads 11*a* to 13*b*.

In the light-emitting device 4002, the protruding portions 48 are provided, making it possible to divide the second dark-colored resin member 190 into six third recessed portions 24 spaced apart from each other. Therefore, effects caused by the stress that occurs during the manufacture or mounting of the light-emitting device 4002 can be reduced. Further, the protruding portions 48 connect the resin portions 42A and 42C in a plan view, making it possible to reduce warping of the resin package 100 during the manufacture or mounting of the light-emitting device 4002.

Figure 27:
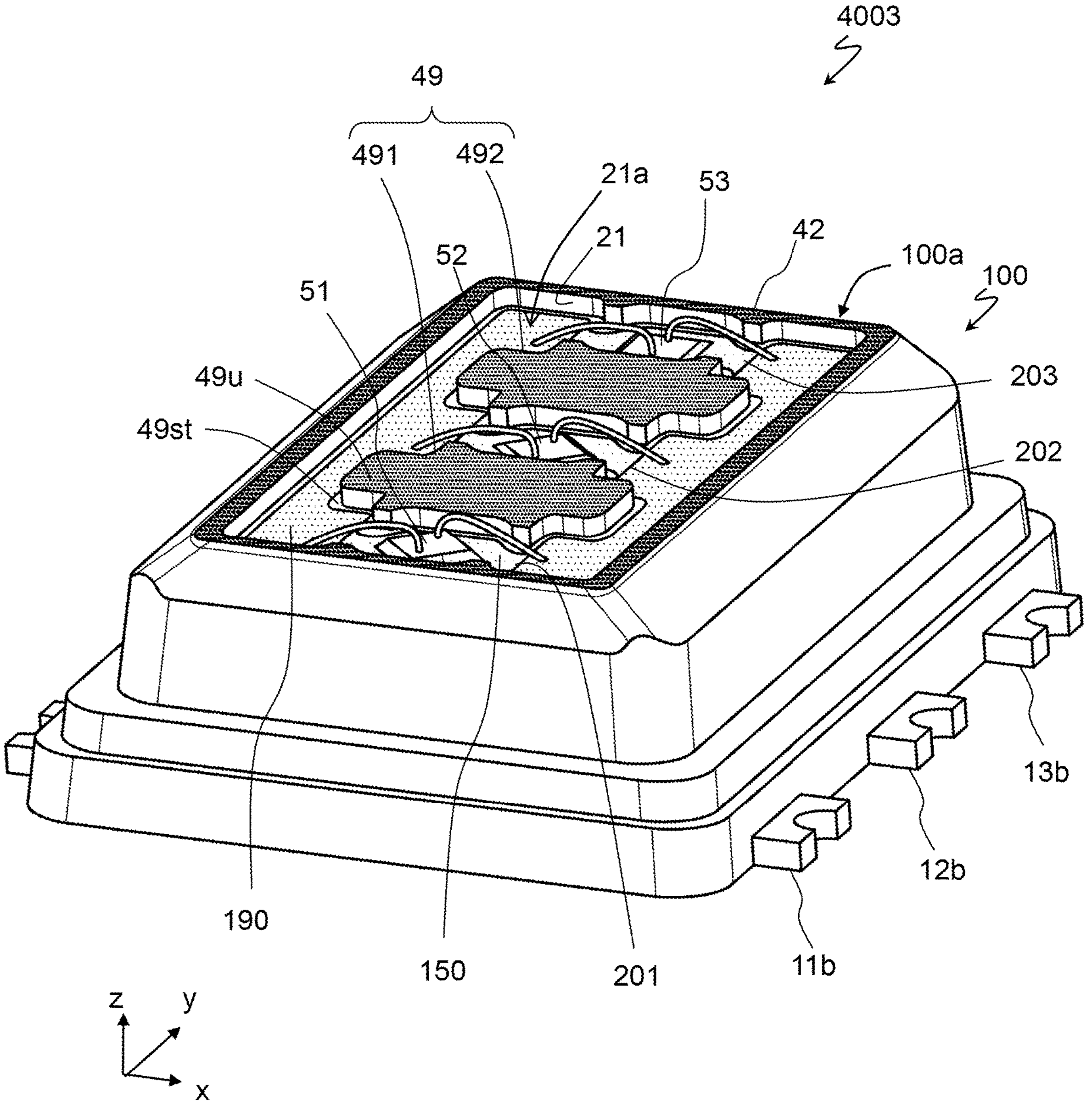
FIG. 27 is a schematic perspective view of yet another light-emitting device of the seventh modified example, with the mold resin portion removed.
Figure 28A:
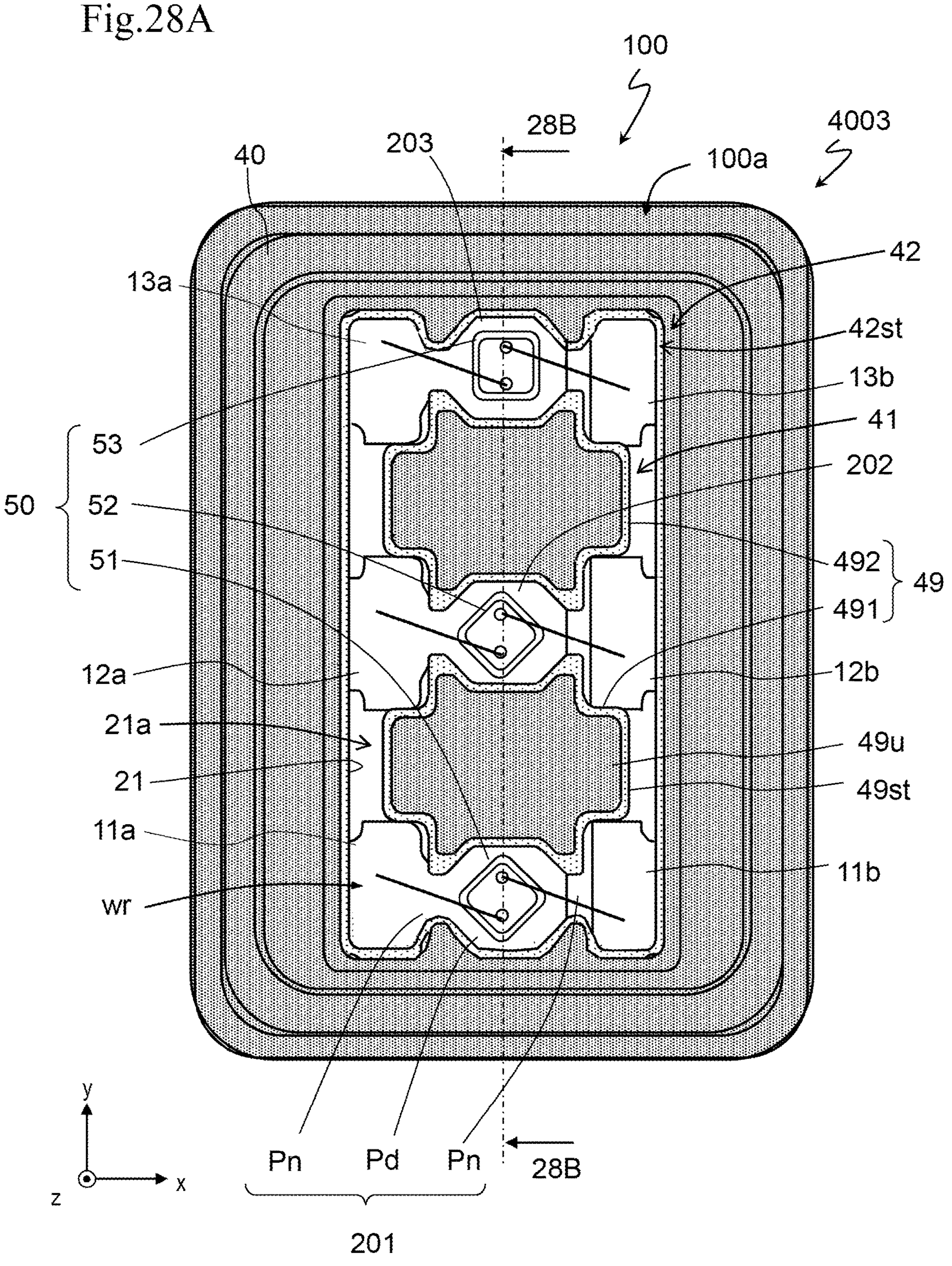
FIG. 28A is a schematic top view of the light-emitting device illustrated in FIG. 27.
Figure 28B:
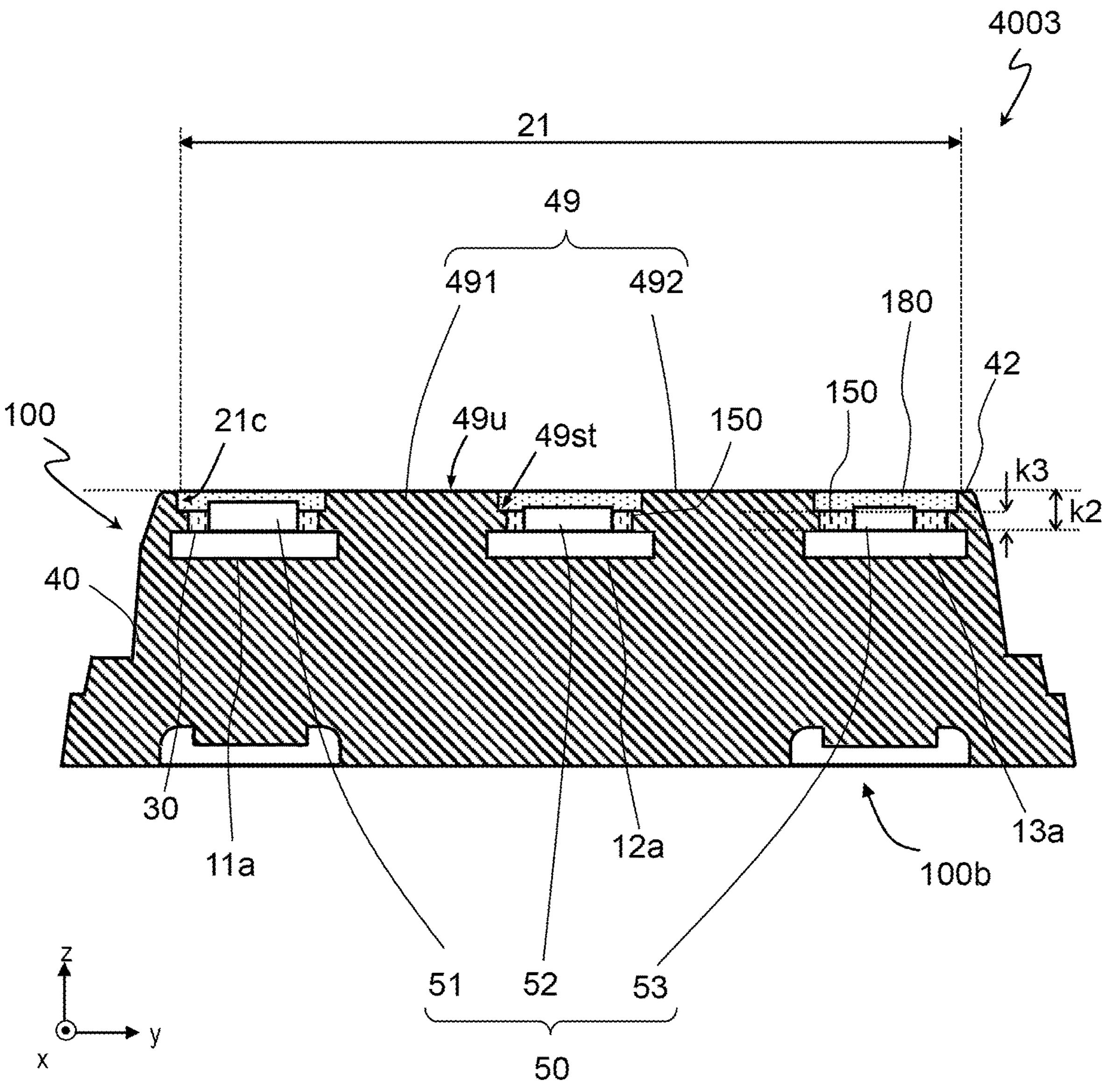
FIG. 28B is a schematic cross-sectional view taken along line 28B-28B illustrated in FIG. 28A.

FIG. 27 is a schematic perspective view of yet another light-emitting device 4003 of the seventh modified example, with the mold resin portion removed. FIG. 28A is a schematic top view of the light-emitting device 4003, with the mold resin portion removed. FIG. 28B is a schematic cross-sectional view taken along line 28B-28B illustrated in FIG. 28A. The light-emitting device 4003 differs from the light-emitting device 4000 illustrated in FIGS. 21 and 22A to 22C in that an upper surface 49*u* of at least one protruding portion 49 positioned inside the first recessed portion 21 is positioned above the upper surfaces of the light-emitting elements 50.

In the example illustrated in FIG. 27, a height of the upper surface 49*u* of the protruding portion 49 is the same as the height of the upper surface of the second resin portion 42 surrounding the inner upper surface 21*a* of the first recessed portion 21. The height of the upper surface 49*u* of the protruding portion 49 and the height of the upper surface of the second resin portion 42 can be defined by, for example, a distance from the back surface 100*b* of the resin package 100 to each of the upper surface 49*u* of the protruding portion 49 and the upper surface of the second resin portion 42 in the z-axis direction. With the upper surface 49*u* of the protruding portion 49 positioned above the upper surfaces of the light-emitting elements 50 (here, at the same height as the upper surface of the second resin portion 42), the region in which the reflective member 150 is disposed in the first recessed portion 21 is easily controlled.

A structure of the resin package 100 of the light-emitting device 4003 is a structure in which the protruding portion 49 is provided in the resin package 100 of the light-emitting device 1003*a* illustrated in FIG. 10C.

In the example illustrated in FIG. 28A, a plurality of (here, two) protruding portions 49 are disposed in the first recessed portion 21. The two protruding portions 49 include, in a plan view, a protruding portion 491 positioned between the element placement regions 201 and 202 and a protruding portion 492 positioned between the element placement regions 202 and 203. Each of the protruding portions 491 and 492 is spaced apart from the second resin portion 42, which is a sidewall of the first recessed portion 21.

The reflective member 150 is disposed in each of the element placement regions 201 to 203. The reflective member 150 disposed in each of the element placement regions 201 to 203 may be spaced apart from each other by the protruding portions 49. This makes it possible to reduce the effects of the stress that occurs during manufacture or during mounting. For example, the stress applied to the light-emitting elements 50 due to expansion and/or contraction of the reflective member 150 can be further reduced. Thus, peeling between the light-emitting elements 50 and the leads 11*a*, 12*a*, and 13*a* can be reduced. Note that the reflective member 150 disposed in each of the element placement regions 201 to 203 may be formed continuously in the first recessed portion 21.

In the example illustrated in FIG. 27, at least the upper surface 49*u* of the protruding portion 49 is exposed from the reflective member 150. Accordingly, in a plan view, an area of the reflective member 150 occupying the inner upper surface 21*a* of the first recessed portion 21 can be reduced, and thus the display contrast can be further improved. In a case in which the light-transmissive resin member 180 is disposed on the reflective member 150 in the first recessed portion 21, at least a part of the upper surface of the protruding portion 49 may be exposed from the light-transmissive resin member 180. The exposed portion of the protruding portion 49 may be in contact with the mold resin portion. Note that the upper surface of the protruding portion 49 may be covered by the light-transmissive resin member 180.

In the example illustrated in FIG. 28A, in a plan view of the primary surface 100*a* of the resin package 100, a part of each protruding portion 49 includes a portion overlapping the plurality of leads. In the example illustrated in FIG. 28A, the protruding portion 491 includes a portion overlapping each of the leads 11*a*, 11*b*, 12*a*, and 12*b*, and a portion positioned between these leads, in a plan view. The protruding portion 492 includes a portion overlapping each of the leads 12*a*, 12*b*, 13*a*, and 13*b*, and a portion positioned between these leads, in a plan view. This makes it possible to reduce the lifting of the lead frame from the first dark-colored resin member 40 by the protruding portions 491 and 492 during the manufacture of the resin package 100.

Figure 28C:
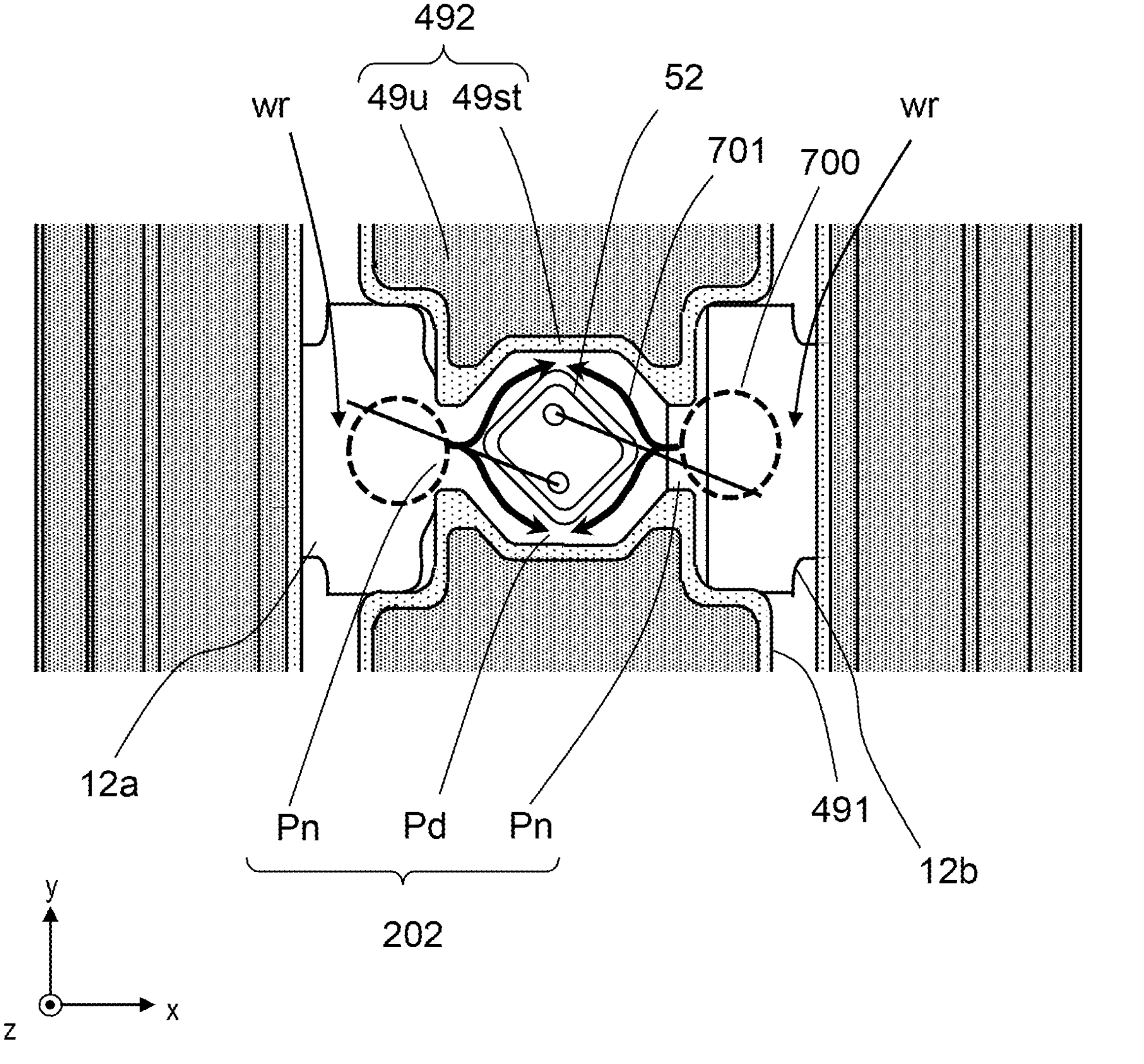
FIG. 28C is an enlarged schematic top view illustrating a part of the light-emitting device illustrated in FIG. 27.

In the example illustrated in FIG. 28C, a lateral surface of each protruding portion 49 includes a step surface 49*st* oriented in the same direction as the primary surface 100*a*. In a cross-sectional view, each protruding portion 49 includes a lateral surface having a stepped shape, and the step surface 49*st* is an upward facing surface corresponding to a tread of a step. The upper surface of the light-emitting element 50 is preferably positioned above the step surface 49*st*. By providing the step surface 49*st* that is lower than the upper surface of the light-emitting element 50, it is possible to reduce the rise of the reflective member 150 to the upper surface of the light-emitting element 50. As an example, a distance k2 between the upper surface 49*u* of the protruding portion 49 and the exposed region 30 in the z-axis direction is 0.2 mm, and a distance k3 between the step surface 49*st* of the protruding portion 49 and the exposed region 30 in the z-axis direction is 0.1 mm. In the example illustrated in FIG. 28A, the step surface 49*st* surrounds the upper surface 49*u* of the protruding portion 49, in a plan view. In a plan view, a shape of an outer edge of the step surface 49*st* of the protruding portion 49 may be similar to a shape of an outer edge of the upper surface 49*u* of the protruding portion 49. In a plan view, the step surface 49*st* may be disposed on, among the lateral surfaces of the protruding portion 49, the lateral surface facing the light-emitting element 50. Below, a planar shape of the protruding portion 49 will be described with reference to FIG. 28A. The protruding portion 49 includes a first width portion, second width portions, and third width portions, each having a different width in the y-axis direction. The first width portion faces the light-emitting element 50. The second width portions are positioned on the +x side and the −x side of the light-emitting element 50 and sandwich the light-emitting element 50 therebetween in a plan view. The third width portions are positioned at the very end in the x-axis direction in a plan view. The first width portion has a shorter width in the y-axis direction than the second width portion. The second width portions have longer widths in the y-axis direction than the third width portions. The first width portion has a longer width in the y-axis direction than the third width portions. Thus, in a plan view, the first width portion and the light-emitting element 50 can be disposed close to each other. This makes it possible to reduce the volume of the reflective member 150 disposed between the first width portion and the light-emitting element 50. Thus, it is possible to reduce the stress on the light-emitting elements 50 that occurs during the manufacturing step and reduce the lifting of the light-emitting elements 50 from the leads 11. Further, in a plan view, a distance from each third width portion to the second resin portion 42 in the y-axis direction can be increased. This makes it possible to increase the region of the connection region wr. Thus, the connection region and the wire can be easily bonded. Note that the first width portion and each third width portion may have the same width in the y-axis direction.

In the example illustrated in FIG. 28A, the second resin portion 42 includes a step surface 42*st* oriented in the same direction as the primary surface 100*a*. In a plan view, the step surface 42*st* is disposed between an inner lateral surface of the second resin portion 42 and the inner upper surface 21*a*. In the illustrated example, the step surface 42*st* surrounds the resin package 100. A height of the step surface 42*st* may be the same as the height of the step surface 49*st* of the protruding portion 49.

In the example illustrated in FIG. 28A, the element placement region 201 is defined by the inner lateral surface of the second resin portion 42 and a lateral surface of the protruding portion 491, the element placement region 202 is defined by lateral surfaces of the protruding portions 491 and 492, and the element placement region 203 is defined by the inner lateral surface of the second resin portion 42 and a lateral surface of the protruding portion 492. In the example illustrated in FIG. 28A, in a plan view, each of the element placement regions 201 to 203 includes a portion Pd positioned in the corresponding light-emitting element 50 and two constricted portions Pn positioned on the +x side and the −x side of the portion Pd. The constricted portions Pn and the portion Pd are defined by differences in width of the second resin portion in the y-axis direction in a plan view. In the example illustrated in FIG. 28A, in a plan view, a width of each constricted portion Pn in the y-axis direction is smaller than a width of the portion Pd in the y-axis direction. This makes it easy to utilize capillary action to dispose, via the constricted portions Pn, the first resin material that is to become the reflective member 150 in a region close to each of the light-emitting elements 50. Below, the second resin portion 42 will be described with reference to FIG. 28A. The second resin portion 42 extending in the x-axis direction includes a narrow portion facing the light-emitting element 50 and a wide portion having a width wider than the narrow portion in the y-axis direction. Here, an example is illustrated in which a portion extending in the +y direction is included as the wide portion of the second resin portion 42. However, the wide portion of the second resin portion 42 may include a portion extending in the −y direction. The wide portion of the second resin portion 42 faces the second width portion of the protruding portion 49. Thus, the constricted portions Pn and the portion Pd are defined. The wide portions of the two second resin portions 42 sandwich the light-emitting element 50 therebetween.

An example of a method of arranging the reflective member 150 will be described below using the element placement region 202 as an example with reference to FIG. 28C. In the light-emitting device 4003, for example, regions positioned on the +x side and the −x side of the element placement region 202 (regions that are to become the connection regions wr) can each be used as a nozzle placement region 700 in which a nozzle for arranging the first resin material is placed. When the nozzle is placed in each of the nozzle placement regions 700 and the first resin material is discharged, the first resin material flows through the constricted portion Pn and into the portion Pd of the element placement region 202 by capillary action, as indicated by an arrow 701. The first resin material flowing in from the constricted portions Pn enters around between the lateral surface of the second light-emitting element 52 and the lateral surface of the protruding portion 491 and around between the lateral surface of the second light-emitting element 52 and the lateral surface of the protruding portion 492. In this way, it is possible to arrange the reflective member 150 in a space between the lateral surface of the second light-emitting element 52 and the lateral surface of the protruding portion 491 and a space between the lateral surface of the second light-emitting element 52 and the lateral surface of the protruding portion 492. At least a part of the lateral surface of the protruding portion 49 may be in direct contact with the reflective member 150. The lateral surface of the protruding portion 49 may be exposed from the reflective member 150.

A surface area of the second resin portion 42 is increased by an amount equivalent to that of the constricted portions Pn, making it possible to increase a contact area with the mold resin portion. By the presence of the constricted portions Pn, an adhesive force between the mold resin portion and the resin package 100 can be increased, making it possible to fix the mold resin portion more stably to the resin package 100.

In the example illustrated in FIG. 27, in the first recessed portion 21, the second dark-colored resin member 190 is preferably disposed in a region defined by a portion of the lateral surface of each protruding portion 49 that extends in the y-axis direction and a lateral surface of the second resin portion 42. The plurality of leads 11*a* to 13*b* can be covered by the second dark-colored resin member 190. Thus, the contrast of the light-emitting device 4003 can be improved. Note that the second dark-colored resin member 190 may not be disposed.

Figure 29:
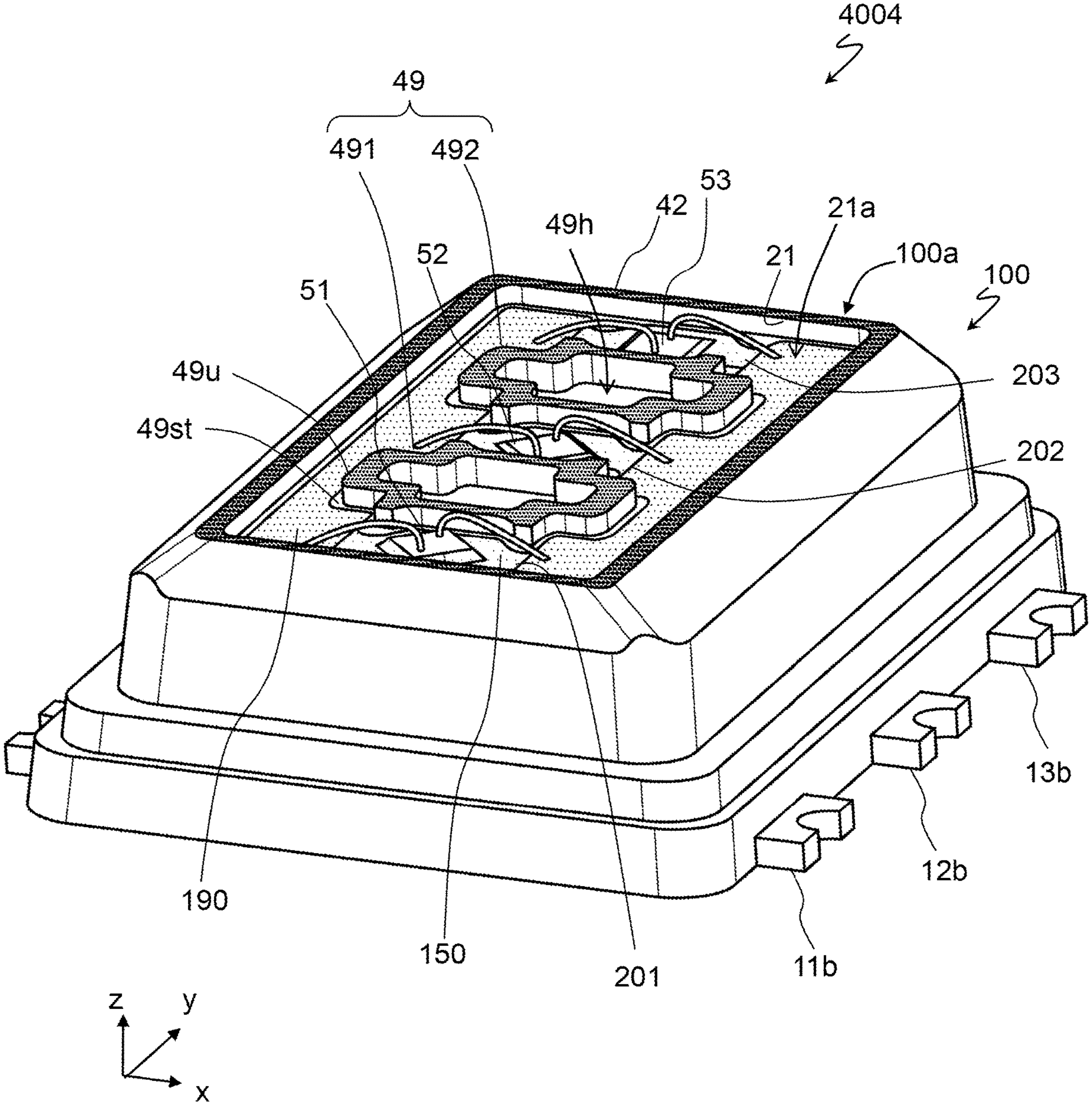
FIG. 29 is a schematic perspective view of yet another light-emitting device of the seventh modified example, with the mold resin portion removed.

FIG. 29 is a schematic perspective view of yet another light-emitting device 4004 of the seventh modified example, with the mold resin portion removed. The light-emitting device 4004 differs from the light-emitting device 4003 illustrated in FIGS. 27, 28A, and 28B in that, on the primary surface 100*a* of the resin package 100, the upper surface 49*u* of at least one protruding portion 49 includes a depression 49*h*.

The mold resin portion may include a portion positioned in an interior of the depression 49*h* of each protruding portion 49. The interior of the depression 49*h* may be in contact with the light-transmissive resin member 180. The light-transmissive resin member 180 may be disposed in a part of the interior of the depression 49*h*, and the mold resin portion may be disposed in another part of the interior of the depression 49*h*. An inner surface of the depression 49*h* may be in contact with the mold resin portion. For example, when the mold resin portion is formed, a resin material that is to become the mold resin portion may be applied so as to fill the depression 49*h* of each protruding portion 49, and then cured. This makes it possible to increase the adhesive force between the mold resin portion and the resin package 100 (anchor effect). Accordingly, the mold resin portion can be more stably fixed to the resin package 100. In the example illustrated in FIG. 29, an inner upper surface of the depression 49*h* has a cross shape in which, for example, a portion extending in the x-axis direction and a portion extending in the y-axis direction intersect in a plan view. In this way, the anchor effect can be further improved. In a top view, a shape of an opening of the first recessed portion 21 is, for example, substantially rectangular. A substantially rectangular shape includes a rectangle. In the example illustrated in FIG. 29, an outer edge of the first recessed portion 21 is rounded at corner portions of the rectangle (quadrangle with rounded corners). Further, in the example illustrated in FIG. 29, the second resin portion 42 extending in the x-axis direction is linear. In the example illustrated in FIG. 29, a width in the y-axis direction of the second resin portion 42, in a plan view, extending in the x-axis direction is constant. Note that a part of the second resin portion 42 in the shape of the opening of the first recessed portion 21 may have a deformed shape. For example, the second resin portion 42 may partially or fully include a curved line in a plan view or may have an elliptical shape in a plan view.

Figure 30:
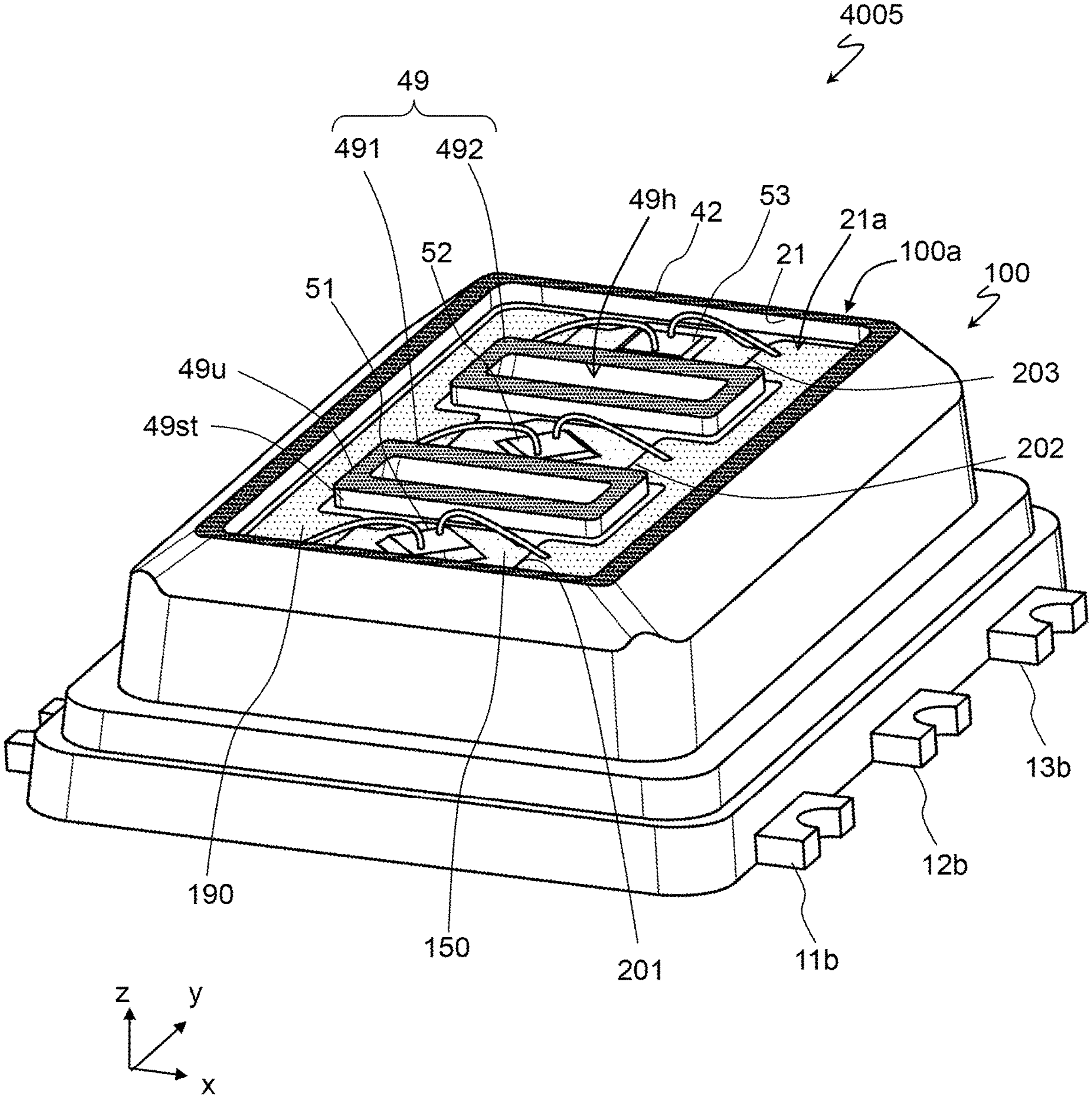
FIG. 30 is a schematic perspective view of yet another light-emitting device of the seventh modified example, with the mold resin portion removed.

FIG. 30 is a schematic perspective view of yet another light-emitting device 4005 of the seventh modified example, with the mold resin portion removed. The light-emitting device 4005 differs from the light-emitting device 4004 illustrated in FIG. 29 in that, in a plan view, the outer edge of each of the two protruding portions 49 disposed in the first recessed portion 21 of the resin package 100 has rectangular shape. In a plan view, in the example illustrated in FIG. 30, the outer edge of the depression 49*h* of each protruding portion 49 has rectangular shape.

According to the light-emitting device 4005, the width of each of the element placement regions 201 to 203 in the y-axis direction can be made larger than that of the light-emitting device 4004. Accordingly, for example, arranging the light-emitting elements 50, which are covered at lateral surfaces by the reflective member 150 in advance, in each of the element placement regions 201 to 203 is relatively easy.

In the example illustrated in FIG. 30, in a cross section parallel to the yz plane, a width of the opening of the depression 49*h* is greater than a width of a bottom portion (inner upper surface) of the depression 49*h*. This makes it easy to fill the interior of the depression 49*h* with the resin material that is to become the mold resin portion. Note that a width of an opening of the depression 49*h* may be the same as or may be smaller than a width of a bottom portion of the depression 49*h*. In the example illustrated in FIG. 30, an inner lateral surface of the depression 49*h* is a flat surface inclined relative to the xz plane. The depression 49*h* has a cross-sectional shape that is V-shaped, for example.

INDUSTRIAL APPLICABILITY

The light-emitting device according to the present disclosure can be suitably used as a light-emitting device in various applications. In particular, the light-emitting device according to the present disclosure is suitably used in a display device such as an LED display. The LED display is utilized for billboards, large televisions, advertisements, traffic signs, stereoscopic display devices, and lighting devices, for example.

What is claimed is:

1. A light-emitting device comprising:
a resin package comprising:
a plurality of leads, and
a resin member configured to fix at least a part of the plurality of leads, the resin package being provided with a primary surface, a back surface positioned opposite to the primary surface, and a lateral surface portion positioned between the primary surface and the back surface, each of the plurality of leads comprising an exposed region exposed at the primary surface from the resin member;
a plurality of light-emitting elements comprising:
a first light-emitting element,
a second light-emitting element, and
a third light-emitting element, each of the plurality of light-emitting elements being disposed in the exposed region of one of the plurality of leads; and
a mold resin portion comprising:
a base portion configured to seal the plurality of light-emitting elements, and
a plurality of lens portions positioned above the base portion and integrally formed with the base portion,
the plurality of lens portions comprising a first lens portion overlapping, in a plan view, the first light-emitting element, a second lens portion overlapping, in a plan view, the second light-emitting element, and a third lens portion overlapping, in a plan view, the third light-emitting element,
the base portion comprising
an upper surface positioned above the primary surface of the resin package, and
a lateral surface portion of the base portion lateral surface covering a part of the lateral surface portion of the resin package in a direction from the upper surface of the base portion toward the back surface of the resin package,
in a cross-sectional view,
a first point being positioned closer to the plurality of lens portions than a second point, the second point being positioned outward of a third point,
the first point being an outermost point of the upper surface of the base portion, the second point being an outermost point of the lateral surface portion of the base portion, the third point being an outermost point where the lateral surface portion of the resin package and the lateral surface portion of the base portion come into contact,
in a cross-sectional view, the first light-emitting element being positioned closer to the back surface of the resin package than the first point and being positioned above the second point.

2. The light-emitting device according to claim 1, wherein
in a cross-sectional view, a portion, from the second point to the third point, of the lateral surface portion of the base portion comprises an outer lateral surface curved into a recessed shape.

3. The light-emitting device according to claim 1, wherein
a part of the lateral surface portion of the resin package is exposed from the lateral surface portion of the base portion.

4. The light-emitting device according to claim 1, wherein
in the lateral surface portion of the resin package, the resin member comprises a first step surface, the first step surface is oriented in a direction identical to the primary surface, and the first step surface is positioned closer to the back surface of the resin package than the second point.

5. The light-emitting device according to claim 4, wherein
a ratio of a distance from the back surface of the resin package to the first step surface to a distance from the back surface of the resin package to the second point is in a range from 0.2 to 0.8.

6. The light-emitting device according to claim 4, wherein
in the lateral surface portion of the resin package, the resin member further comprises a second step surface positioned below the first step surface, and
a width of the first step surface is greater than a width of the second step surface.

7. The light-emitting device according to claim 4, wherein
in a cross-sectional view, an outermost point of the first step surface of the resin package is positioned inside the second point.

8. The light-emitting device according to claim 1, wherein
in a cross-sectional view, an outer lateral surface of the lateral surface portion of the base portion comprises, between the first point and the second point, a step surface oriented in a direction identical to the primary surface.

9. The light-emitting device according to claim 1, wherein
the resin package further comprises, between the primary surface of the resin package and the lateral surface portion of the resin package, a tapered surface inclined relative to the primary surface, and
the tapered surface is positioned above the second point.

10. The light-emitting device according to claim 1, wherein
the primary surface of the resin package comprises one recessed portion defined by the resin member and the plurality of leads, an inner upper surface of the one recessed portion comprises the exposed region of each of the plurality of leads, and each of the plurality of light-emitting elements are disposed in the one recessed portion of the resin package.

11. A light-emitting device comprising:

a resin package comprising: a plurality of leads, and a resin member configured to fix at least a part of the plurality of leads, the resin package being provided with one recessed portion defined by the resin member and the plurality of leads in a primary surface, each of the plurality of leads comprising an exposed region exposed at an inner upper surface of the one recessed portion;

a plurality of light-emitting elements comprising: a first light-emitting element, a second light-emitting element, and a third light-emitting element that are disposed in the one recessed portion of the resin package, each of the plurality of light-emitting elements being disposed in the exposed region of one of the plurality of leads; and a mold resin portion comprising: a base portion configured to seal the plurality of light-emitting elements, and a plurality of lens portions positioned above the base portion and integrally formed with the base portion, the plurality of lens portions comprising a first lens portion overlapping, in a plan view, the first light-emitting element, a second lens portion overlapping, in a plan view, the second light-emitting element, and a third lens portion overlapping, in a plan view, the third light-emitting element, the light-emitting device further comprising: a first reflective member surrounding the first light-emitting element; a second reflective member surrounding the second light-emitting element; and a third reflective member surrounding the third light-emitting element, the first reflective member, the second reflective member, and the third reflective member being positioned in the one recessed portion of the resin package and being connected to each other in the one recessed portion.

12. A light-emitting device comprising:

a resin package comprising:

a plurality of leads, and a resin member configured to fix at least a part of the plurality of leads, the resin package being provided with one recessed portion defined by the resin member and the plurality of leads in a primary surface, each of the plurality of leads comprising an exposed region exposed at an inner upper surface of the one recessed portion;

a plurality of light-emitting elements comprising:

a first light-emitting element, a second light-emitting element, and a third light-emitting element that are disposed in the one recessed portion of the resin package, each of the plurality of light-emitting elements being disposed in the exposed region of one of the plurality of leads; and a mold resin portion comprising:

a base portion configured to seal the plurality of light-emitting elements, and a plurality of lens portions positioned above the base portion and integrally formed with the base portion, the plurality of lens portions comprising a first lens portion overlapping, in a plan view, the first light-emitting element, a second lens portion overlapping, in a plan view, the second light-emitting element, and a third lens portion overlapping, in a plan view, the third light-emitting element, wherein the resin member comprises, on the primary surface of the resin package, a first resin portion positioned on the inner upper surface of the one recessed portion, and in a plan view, a second resin portion surrounding the inner upper surface of the one recessed portion.

13. The light-emitting device according to claim 12, wherein the second resin portion comprises, in a plan view of the primary surface of the resin package, a third resin portion, and a fourth resin portion positioned between the third resin portion and the first resin portion, an upper surface of the fourth resin portion is positioned above an upper surface of the third resin portion, and the upper surface of the third resin portion is positioned above an upper surface of the first resin portion.

14. The light-emitting device according to claim 1, wherein the first light-emitting element is configured to emit first light, the second light-emitting element is configured to emit second light having a shorter wavelength than the first light, the third light-emitting element is configured to emit third light having a shorter wavelength than the second light, the first lens portion is colored to a color similar to the first light, the second lens portion is colored to a color similar to the second light, and the third lens portion is colored to a color similar to the third light.

15. The light-emitting device according to claim 1, wherein each of the plurality of lens portions has a convex shape protruding upward from the upper surface of the base portion.

16. The light-emitting device according to claim 1, wherein each of the first light-emitting element, the second light-emitting element, and the third light-emitting element has a rectangular planar shape, and sides of the rectangular planar shape of at least one of the first light-emitting element, the second light-emitting element, and the third light-emitting element, in a plan view, is non-parallel to corresponding sides of the rectangular planar shape of an other one of the first light-emitting element, the second light-emitting element, and the third light-emitting element.

17. The light-emitting device according to claim 1, wherein a height of a vertex of at least one of the first lens portion, the second lens portion, and the third lens portion is greater than a height of a vertex of an other one of the first lens portion, the second lens portion, and the third lens portion.

18. The light-emitting device according to claim 1, wherein each of the first light-emitting element, the second light-emitting element, and the third light-emitting element comprises a first surface positioned proximate to the plurality of leads, a second surface positioned opposite to the first surface, and at least one electrode positioned on the second surface, and the at least one electrode of each of the first light-emitting element, the second light-emitting element, and the third light-emitting element is disposed on a line connecting a center point, in a plan view, of the first lens portion, a center point, in a plan view, of the second lens portion, and a center point, in a plan view, of the third lens portion.

19. The light-emitting device according to claim 12, wherein the first resin portion comprises at least one protruding portion, and an upper surface of each of the plurality of light-emitting elements is positioned above the at least one protruding portion.

20. The light-emitting device according to claim 12, wherein the first resin portion comprises at least one protruding portion, and a height of an upper surface of the at least one protruding portion is identical to a height of an upper surface of the second resin portion.

21. The light-emitting device according to claim 20, wherein the first resin portion comprises a step surface oriented in a direction identical to the primary surface on a lateral surface of the at least one protruding portion.

22. The light-emitting device according to claim 21, wherein an upper surface of each of the plurality of light-emitting elements is positioned above the step surface.

23. The light-emitting device according to claim 20, wherein the upper surface of the at least one protruding portion comprises a depression.

24. The light-emitting device according to claim 19, wherein in a plan view of the primary surface of the resin package, the at least one protruding portion is positioned between two adjacent leads of the plurality of leads and comprises a portion overlapping at least one of the two adjacent leads.

* * * * *